(12) United States Patent
Tanemura et al.

(10) Patent No.: US 11,257,722 B2
(45) Date of Patent: Feb. 22, 2022

(54) SEMICONDUCTOR DEVICE HAVING OXIDE CONTAINING GALLIUM INDIUM AND ZINC

(71) Applicant: SEMICONDUCTOR ENERGY LABORATORY CO., LTD., Atsugi (JP)

(72) Inventors: Kazuki Tanemura, Kanagawa (JP); Etsuko Kamata, Kanagawa (JP); Hiromi Sawai, Kanagawa (JP); Daisuke Matsubayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/629,602

(22) PCT Filed: Jul. 18, 2018

(86) PCT No.: PCT/IB2018/055312
§ 371 (c)(1),
(2) Date: Jan. 9, 2020

(87) PCT Pub. No.: WO2019/025893
PCT Pub. Date: Feb. 7, 2019

(65) Prior Publication Data
US 2021/0090961 A1 Mar. 25, 2021

(30) Foreign Application Priority Data
Jul. 31, 2017 (JP) .............................. JP2017-147470

(51) Int. Cl.
*H01L 21/84* (2006.01)
*H01L 21/822* (2006.01)
*H01L 27/12* (2006.01)

(52) U.S. Cl.
CPC ............ *H01L 21/84* (2013.01); *H01L 21/822* (2013.01); *H01L 27/1203* (2013.01)

(58) Field of Classification Search
CPC .... H01L 21/84; H01L 21/822; H01L 27/1203
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| JP | 2011-151383 A | 8/2011 |
| JP | 2012-257187 A | 12/2012 |

(Continued)

OTHER PUBLICATIONS

International Search Report (Application No. PCT/IB2018/055312) dated Oct. 16, 2018.

(Continued)

*Primary Examiner* — Nelson Garces
(74) *Attorney, Agent, or Firm* — Fish & Richardson P.C.

(57) ABSTRACT

A semiconductor device with a high threshold voltage is provided. A first conductor positioned over a substrate, a first insulator positioned over the first conductor, a first oxide positioned in contact with the top surface of the first insulator, a second insulator positioned in contact with the top surface of the first oxide, a second oxide positioned over the second insulator, a third insulator positioned over the second oxide, and a second conductor positioned over the third insulator are included. A mixed layer is formed between the first insulator and the first oxide. The mixed layer contains at least one of atoms contained in the first insulator and at least one of atoms contained in the first oxide. The mixed layer has fixed negative charge.

5 Claims, 29 Drawing Sheets

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,791,072 B2 | 9/2010 | Kumomi et al. |
| 7,803,640 B2 | 9/2010 | Izumi |
| 8,178,884 B2 | 5/2012 | Ha et al. |
| 8,193,535 B2 | 6/2012 | Ha et al. |
| 8,237,166 B2 | 8/2012 | Kumomi et al. |
| 8,384,080 B2 | 2/2013 | Taniguchi et al. |
| 8,426,851 B2 | 4/2013 | Morosawa et al. |
| 8,461,594 B2 | 6/2013 | Morosawa et al. |
| 8,486,774 B2 | 7/2013 | Terai et al. |
| 8,547,771 B2 | 10/2013 | Koyama |
| 8,674,979 B2 | 3/2014 | Hayakawa |
| 8,692,252 B2 | 4/2014 | Takata et al. |
| 8,728,862 B2 | 5/2014 | Ha et al. |
| 8,742,418 B2 | 6/2014 | Morosawa et al. |
| 8,766,269 B2 | 7/2014 | Yamazaki et al. |
| 8,847,230 B2 | 9/2014 | Terai et al. |
| 8,962,457 B2 | 2/2015 | Watanabe |
| 9,024,317 B2 | 5/2015 | Endo et al. |
| 9,153,703 B2 | 10/2015 | Kaji et al. |
| 9,178,072 B2 | 11/2015 | Morosawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0197092 A1 | 9/2006 | Hoffman et al. |
| 2006/0228974 A1 | 10/2006 | Theiss et al. |
| 2006/0231882 A1 | 10/2006 | Kim et al. |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0114910 A1 | 5/2009 | Chang |
| 2009/0152506 A1 | 6/2009 | Umeda et al. |
| 2009/0278122 A1 | 11/2009 | Hosono et al. |
| 2009/0280600 A1 | 11/2009 | Hosono et al. |
| 2010/0025675 A1 | 2/2010 | Yamazaki et al. |
| 2010/0032668 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163868 A1 | 7/2010 | Yamazaki et al. |
| 2010/0193782 A1 | 8/2010 | Sakata |
| 2010/0224878 A1 | 9/2010 | Kimura |
| 2010/0244020 A1 | 9/2010 | Sakata et al. |
| 2010/0295037 A1 | 11/2010 | Hironaka |
| 2010/0320458 A1 | 12/2010 | Umeda et al. |
| 2011/0017995 A1 | 1/2011 | Yamazaki et al. |
| 2011/0031491 A1 | 2/2011 | Yamazaki et al. |
| 2011/0095288 A1 | 4/2011 | Morosawa et al. |
| 2011/0127523 A1 | 6/2011 | Yamazaki |
| 2011/0127524 A1 | 6/2011 | Yamazaki et al. |
| 2011/0156027 A1 | 6/2011 | Yamazaki et al. |
| 2011/0233542 A1 | 9/2011 | Yamazaki et al. |
| 2011/0260171 A1 | 10/2011 | Yamazaki |
| 2011/0284844 A1 | 11/2011 | Endo et al. |
| 2011/0284845 A1 | 11/2011 | Endo et al. |
| 2011/0303914 A1 | 12/2011 | Yamazaki |
| 2012/0032730 A1 | 2/2012 | Koyama |
| 2012/0161132 A1 | 6/2012 | Yamazaki |
| 2012/0248433 A1 | 10/2012 | Nakano et al. |
| 2012/0292615 A1 | 11/2012 | Saito |
| 2013/0191673 A1 | 7/2013 | Koyama et al. |
| 2013/0299824 A1 | 11/2013 | Akimoto et al. |
| 2015/0008428 A1 | 1/2015 | Yamamoto et al. |
| 2015/0011046 A1 | 1/2015 | Tanaka et al. |
| 2015/0054571 A1 | 2/2015 | Watanabe et al. |
| 2015/0108477 A1 | 4/2015 | Tokunaga |
| 2015/0149795 A1 | 5/2015 | Watanabe |
| 2015/0228677 A1 | 8/2015 | Miyairi et al. |
| 2015/0263175 A1 | 9/2015 | Koyama |
| 2015/0325600 A1 | 11/2015 | Sakata et al. |
| 2016/0035758 A1 | 2/2016 | Kimura et al. |
| 2016/0043110 A1 | 2/2016 | Atsumi et al. |
| 2017/0025544 A1 | 1/2017 | Yamazaki et al. |
| 2017/0040424 A1* | 2/2017 | Tanaka ............... H01L 27/1225 |
| 2017/0170211 A1* | 6/2017 | Yamazaki ........... H01L 29/4908 |

FOREIGN PATENT DOCUMENTS

| | | |
|---|---|---|
| JP | 2017-028288 A | 2/2017 |
| JP | 2017-130647 A | 7/2017 |

(56) References Cited

FOREIGN PATENT DOCUMENTS

| | | |
|---|---|---|
| JP | 2017-143239 A | 8/2017 |
| TW | 201724513 | 7/2017 |

OTHER PUBLICATIONS

Written Opinion (Application No. PCT/IB2018/055312) dated Oct. 16, 2018.

* cited by examiner

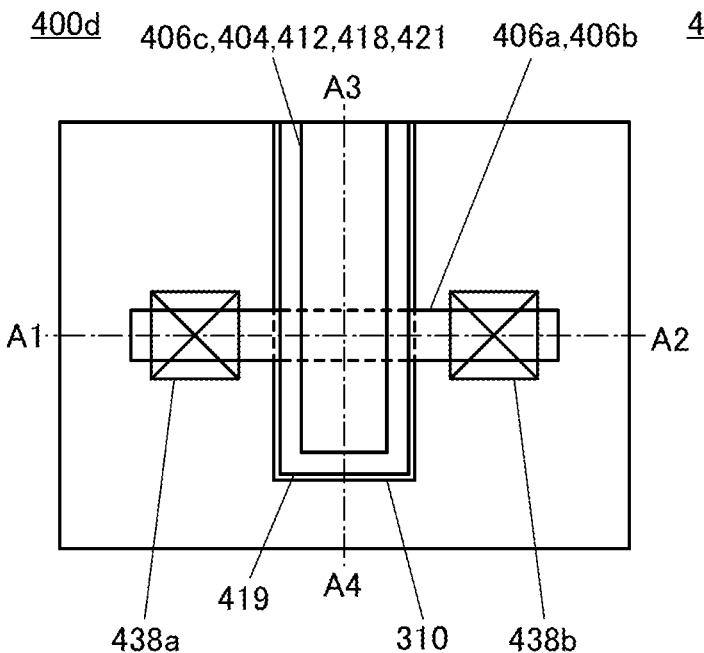
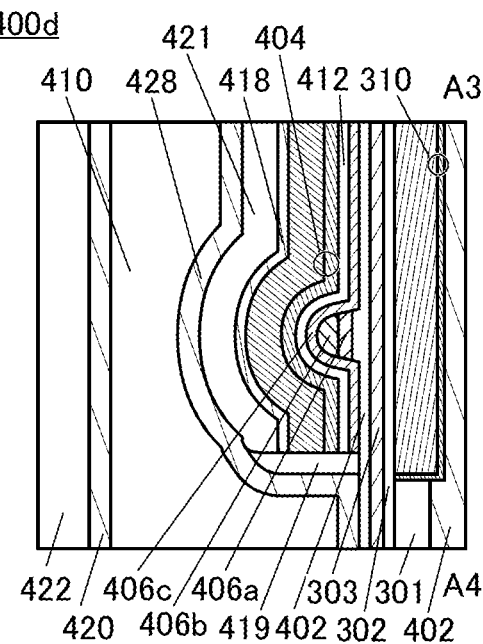
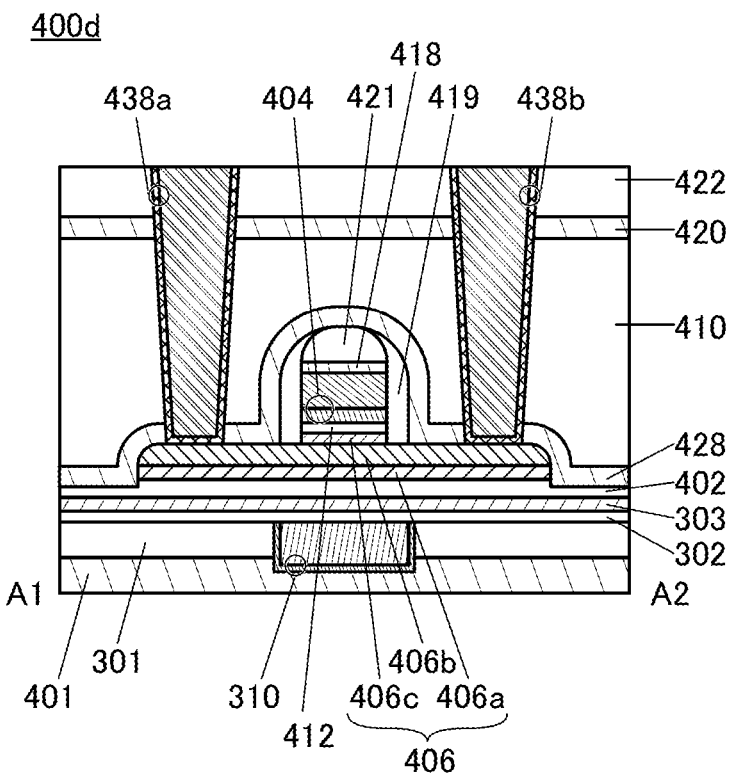

SEMICONDUCTOR DEVICE HAVING OXIDE CONTAINING GALLIUM INDIUM AND ZINC

CROSS REFERENCE TO RELATED APPLICATIONS

This application is a U.S. National Phase Application under 35 U.S.C. § 371 of International Application PCT/IB2018/055312, filed on Jul. 18, 2018, which is incorporated by reference, and which claims the benefit of a foreign priority application filed in Japan on Jul. 31, 2017, as Application No. 2017-147470.

TECHNICAL FIELD

Embodiments of the present invention relate to a semiconductor device and a manufacturing method of the semiconductor device. Other embodiments of the present invention relate to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like each include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has attracted attention as another material.

It is known that a transistor including an oxide semiconductor has an extremely low leakage current in a non-conduction state. For example, a low-power-consumption CPU or the like utilizing a characteristic of low leakage current of the transistor including an oxide semiconductor has been disclosed (see Patent Document 1).

Furthermore, a memory device that can retain stored contents for a long time by utilizing a characteristic of a low leakage current of a transistor using an oxide semiconductor has been disclosed, for example (see Patent Document 2).

PRIOR ART DOCUMENTS

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device with a high threshold voltage. Another object of one embodiment of the present invention is to provide a semiconductor device having normally-off electrical characteristics. Another object of one embodiment of the present invention is to provide a semiconductor device that operates at a low voltage. Another object of one embodiment of the present invention is to provide a semiconductor device having favorable electrical characteristics.

An object of one embodiment of the present invention is to provide a semiconductor device whose power consumption can be reduced. Another object of one embodiment of the present invention is to provide a novel semiconductor device.

Note that the descriptions of these objects do not disturb the existence of other objects. In one embodiment of the present invention, there is no need to achieve all of these objects. Objects other than these will be apparent from the descriptions of the specification, the drawings, the claims, and the like, and can be derived from the descriptions of the specification, the drawings, the claims, and the like.

Means for Solving the Problems

One embodiment of the present invention is a semiconductor device characterized by comprising a first conductor positioned over a substrate, a first insulator positioned over the first conductor, a first oxide positioned in contact with a top surface of the first insulator, a second insulator positioned in contact with a top surface of the first oxide, a second oxide positioned over the second insulator, a third insulator positioned over the second oxide, and a second conductor positioned over the third insulator; a mixed layer is formed between the first insulator and the first oxide; the mixed layer contains at least one of atoms contained in the first insulator and at least one of atoms contained in the first oxide; and the mixed layer has fixed negative charge.

In the above, it is preferable that the first oxide contain gallium and the atomic ratio of gallium in metal elements contained in the first oxide be higher than the atomic ratio of gallium in metal elements contained in the second oxide. Furthermore, in the above, the first oxide is preferably gallium oxide.

In the above, a structure may be employed in which the first oxide further contains indium and zinc, and the atomic ratio of indium in the metal elements contained in the first oxide is lower than the atomic ratio of indium in the metal elements contained in the second oxide.

In the above, the mixed layer preferably has fixed charge at $-2.0\times10^{12}$ e/cm$^2$ or less. In the above, the second insulator is preferably silicon oxide or silicon oxynitride. In the above, the amount of released oxygen converted into oxygen atoms per unit thickness is preferably greater than or equal to $1.0\times10^{18}$ atoms/cm$^3$ in thermal desorption spectroscopy at a film surface temperature of the second insulator of higher than or equal to 100° C. and lower than or equal to 700° C.

Another embodiment of the present invention is a method for manufacturing a semiconductor device, characterized by comprising a step of forming a first conductor over a substrate, a step of forming a first insulator over the first conductor, a step of forming a first oxide in contact with a top surface of the first insulator by a sputtering method, a step of forming a second insulator over the first oxide, a step of forming a second oxide over the second insulator by a sputtering method, a step of forming a third insulator over the second oxide, and a step of forming a second conductor over the third insulator; in the step of forming the first oxide, a mixed layer is formed between the first insulator and the first oxide; and the mixed layer contains at least one of atoms contained in the first insulator and at least one of atoms contained in the first oxide.

In the above, a first target containing gallium is preferably used in the step of forming the first oxide. In the above, it is preferable that a second target containing indium, gallium, and zinc be used in the step of forming the second oxide and the atomic ratio of gallium in metal elements contained in the second target be lower than the atomic ratio of gallium in metal elements contained in the first target.

In the above, in the step of forming the second oxide, deposition is preferably performed in an atmosphere containing oxygen by a sputtering method.

In the above, it is preferable that heat treatment be performed after the deposition by a sputtering method and the second oxide be formed to have an island shape after the heat treatment.

Effect of the Invention

One embodiment of the present invention can provide a semiconductor device with a high threshold voltage. Another embodiment of the present invention can provide a semiconductor device having normally-off electrical characteristics. Another embodiment of the present invention can provide a semiconductor device that operates at a low voltage. Another embodiment of the present invention can provide a semiconductor device having favorable electrical characteristics.

One embodiment of the present invention can provide a semiconductor device whose power consumption can be reduced. Another embodiment of the present invention is to provide a novel semiconductor device.

Note that the descriptions of these effects do not disturb the existence of other effects. One embodiment of the present invention does not have to have all of these effects. Other effects will be apparent from and can be derived from the descriptions of the specification, the drawings, the claims, and the like.

BRIEF DESCRIPTION OF THE DRAWINGS

FIGS. 9A to 9C Top and cross-sectional views of a semiconductor device of one embodiment of the present invention.

MODE FOR CARRYING OUT THE INVENTION

Figure 1A:
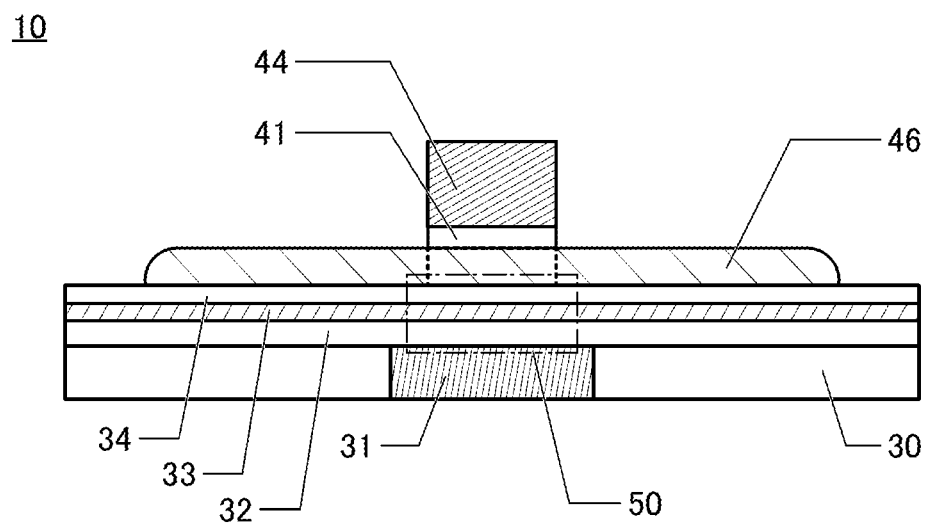
FIGS. 1A and 1B Schematic views of a semiconductor device of one embodiment of the present invention.

Embodiments will be described below with reference to drawings. Note that the embodiments can be implemented with many different modes, and it will be readily appreciated by those skilled in the art that modes and details can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the scale. Note that the drawings are schematic views showing ideal examples, and shapes or values are not limited to those shown in the drawings. For example, in the actual manufacturing process, a layer, a resist mask, or the like might be unintentionally reduced in size by treatment such as etching, which is not illustrated in some cases for easy understanding. Note that in drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. Furthermore, the description of some hidden lines and the like may be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relationship between components is changed as appropriate in accordance with a direction in which each component is described. Thus, the description not limited to terms described in this specification can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relation shown in drawings or texts, a connection relationship other than one shown in drawings or texts is described in the drawings or the texts.

Here, X and Y each denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

In an example of the case where X and Y are electrically connected, at least one element that allows electrical connection between X and Y (e.g., a switch, a transistor, a capacitor, an inductor, a resistor, a diode, a display element, a light-emitting element, or a load) can be connected between X and Y. Note that a switch has a function of being controlled to be turned on or off. That is, a switch has a function of being turned on or off to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y Note that even if another circuit is sandwiched between X and Y, for example, X and Y are regarded as being functionally connected when a signal output from X is transmitted to Y Note that the case where X and Y are functionally connected includes the case where X and Y are directly connected and the case where X and Y are electrically connected.

In this specification and the like, a transistor is an element having at least three terminals including agate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a main region through which current flows.

Furthermore, functions of a source and a drain might be switched when a transistor of opposite polarity is employed or the direction of current flow is changed in circuit operation, for example. Therefore, in this specification and the like, the terms "source" and "drain" can be interchanged with each other in some cases.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is in an on state) and a gate electrode overlap with each other, or a region where a channel is formed. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter, referred to as an "effective channel width") is different from a channel width shown in a top view of a transistor (hereinafter, referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, estimation of an effective channel width from a design value requires an assumption that the shape of a semiconductor is known. Accordingly, when the shape of a semiconductor is not known accurately, it is difficult to measure an effective channel width accurately.

Thus, in this specification, an apparent channel width is referred to as a "surrounded channel width (SCW)" in some cases. Furthermore, in this specification, the simple term "channel width" may refer to a surrounded channel width or an apparent channel width. Alternatively, in this specification, the simple term "channel width" may refer to an effective channel width. Note that the values of a channel length, a channel width, an effective channel width, an apparent channel width, a surrounded channel width, and the like can be determined, for example, by analyzing a cross-sectional TEM image or the like.

Note that an impurity in a semiconductor refers to, for example, elements other than the main components of the semiconductor. For example, an element with a concentration lower than 0.1 atomic % can be regarded as an impurity. When an impurity is contained, in some cases, DOS (Density of States) in a semiconductor is increased, or the crystallinity is decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In the case of an oxide semiconductor, oxygen vacancies may be formed by entry of impurities. Furthermore, in the case where the semiconductor is silicon, examples of an impurity that changes the characteristics of the semiconductor include oxygen, Group 1 elements except hydrogen, Group 2 elements, Group 13 elements, and Group 15 elements.

Note that a silicon oxynitride film in this specification and the like has a composition in which the oxygen content is higher than the nitrogen content. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Moreover, a silicon nitride oxide film has a composition in which the nitrogen content is higher than the oxygen content. A silicon nitride oxide film preferably contains, for example, nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "$V_{th}$") is higher than 0 V.

In this specification and the like, "parallel" indicates a state where two straight lines are placed such that the angle formed therebetween is greater than or equal to −10° and less than or equal to 10°. Thus, the case where the angle is greater than or equal to −5° and less than or equal to 5° is also included. In addition, "substantially parallel" indicates a state where two straight lines are placed such that the angle formed therebetween is greater than or equal to −30° and less than or equal to 30°. In addition, "perpendicular" indicates a state where two straight lines are placed such that the angle formed therebetween is greater than or equal to 80° and less than or equal to 100°. Thus, the case where the angle is greater than or equal to 85° and less than or equal to 95° is also included. In addition, "substantially perpendicular" indicates a state where two straight lines are placed such that the angle formed therebetween is greater than or equal to 60° and less than or equal to 120°.

In this specification, in the case where a crystal is a trigonal crystal or a rhombohedral crystal, the crystal is regarded as a hexagonal crystal system.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, in the case where an OS FET is stated, it can also be referred to as a transistor including an oxide or an oxide semiconductor.

Embodiment 1

The configuration and characteristics of a semiconductor device of one embodiment of the present invention will be described below.

Figure 1B:
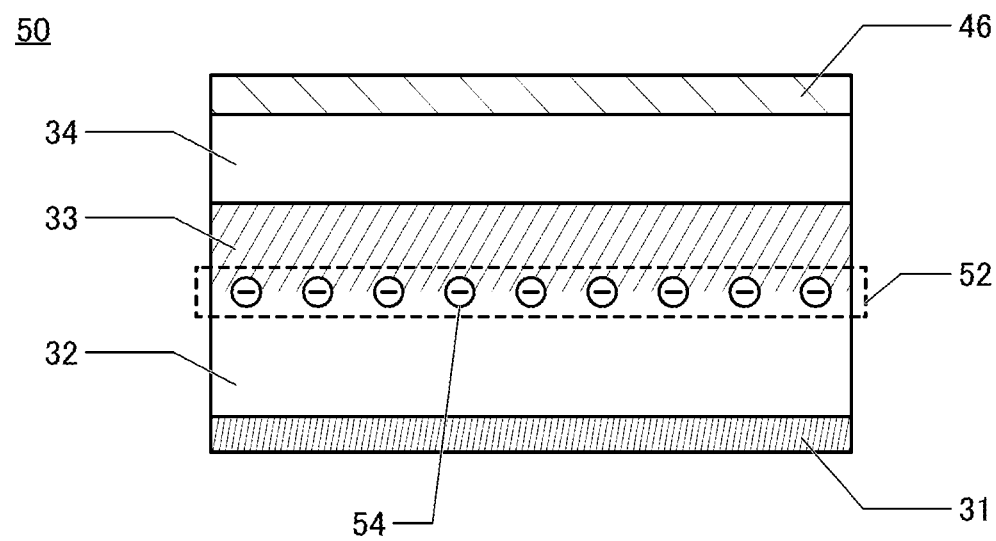

FIG. 1(A) is a cross-sectional view of part of a transistor 10, which is a semiconductor device of one embodiment of the present invention. FIG. 1(B) is an enlarged view of a region 50 of the transistor 10.

As illustrated in FIG. 1(A), the transistor 10 includes a conductor 31 positioned over a substrate, an insulator 32 positioned over the conductor 31, an oxide 33 positioned in contact with the top surface of the insulator 32, an insulator 34 positioned in contact with the top surface of the oxide 33, an oxide 46 positioned over the insulator 34, an insulator 41 positioned over the oxide 46, and a conductor 44 positioned over the insulator 41 so as to overlap with the conductor 31 and the oxide 46. Furthermore, the conductor 31 is preferably positioned so as to be embedded in the insulator 30.

Although the conductor 31, the insulator 30, the insulator 32, the oxide 33, the insulator 34, the oxide 46, the insulator 41, and the conductor 44 illustrated in FIG. 1(A) have a single-layer structure, the semiconductor device described in this embodiment is not limited thereto. The conductor 31, the insulator 30, the insulator 32, the oxide 33, the insulator 34, the oxide 46, the insulator 41, and the conductor 44 may each have either a single-layer structure or a stacked-layer structure of two or more layers.

The oxide 46 includes a channel formation region in a region overlapping with the conductor 44 and includes a source region and a drain region in a region not overlapping with the conductor 44 such that a channel formation region is sandwiched between the source region and the drain region. In FIG. 1(A), dashed lines in the oxide 46 indicate a boundary between the source region and the channel formation region and a boundary between the drain region and the channel formation region. FIG. 1 illustrates an example where the boundary between the source region and the channel formation region and the boundary between the drain region and the channel formation region are substantially aligned with side surfaces of the conductor 44. However, this is not necessarily employed, and a structure may be employed in which part of the source region on the channel formation region side and/or part of the drain region on the channel formation region side overlap with the conductor 44.

In the transistor 10, a metal oxide functioning as an oxide semiconductor (hereinafter also referred to as an oxide semiconductor) is preferably used as the oxide 46. For example, a metal oxide having an energy gap of 2 eV or more, preferably 2.5 eV or more is preferably used as a metal oxide to be the oxide 46. With the use of a metal oxide having such a wide energy gap, the off-state current of the transistor can be reduced.

For example, as the oxide 46, a metal oxide such as an In-M-Zn oxide (the element M is one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like) is preferably used. An In—Ga oxide or an In—Zn oxide may be used as the oxide 46.

The transistor 10 using an oxide semiconductor has an extremely low leakage current (off-state current) in an off state; thus, a semiconductor device with low power consumption can be provided. An oxide semiconductor can be deposited by a sputtering method or the like, and thus can be used for a transistor included in a highly integrated semiconductor device.

On the other hand, a transistor using an oxide semiconductor is likely to have its electrical characteristics changed by impurities and oxygen vacancies in the oxide semiconductor; accordingly, the reliability is decreased in some cases. Furthermore, hydrogen contained in an oxide semiconductor reacts with oxygen bonded to a metal atom to be water, and thus forms an oxygen vacancy in some cases. Entry of hydrogen into the oxygen vacancy generates an electron serving as a carrier in some cases. Accordingly, a transistor using an oxide semiconductor including oxygen vacancies is likely to have normally-on characteristics. Thus, it is preferable that the amount of oxygen vacancies in the oxide semiconductor be reduced as much as possible.

In particular, when oxygen vacancies exist at the interface between the channel formation region of the oxide 46 and the insulator 41 functioning as a gate insulating film, variations in the electrical characteristics are likely to occur and the reliability is reduced in some cases.

The oxide 46 may have a stacked-layer structure of two or more layers. For example, the oxide 46 may have a stacked-layer structure including a first oxide layer, a second oxide layer over the first oxide layer, and a third oxide layer over the second oxide layer. When the second oxide layer is provided over the first oxide layer, diffusion of impurities from a structure formed below the first oxide layer to the second oxide layer can be inhibited. Furthermore, when the second oxide layer is provided under the third oxide layer, diffusion of impurities from a structure formed above the third oxide layer to the second oxide layer can be inhibited.

The first to third oxide layers of the oxide 46 preferably have different atomic ratios of metal atoms. Specifically, the atomic ratio of the element M in metal elements of a metal oxide used as the first oxide layer is preferably higher than the atomic ratio of the element M in metal elements of a metal oxide used as the second oxide layer. Moreover, the atomic ratio of the element M to In in the metal oxide used as the first oxide layer is preferably higher than the atomic ratio of the element M to In in the metal oxide used as the second oxide layer. Moreover, the atomic ratio of Into the element M in the metal oxide used as the second oxide layer is preferably higher than the atomic ratio of Into the element M in the metal oxide used as the first oxide layer. As the third oxide layer, a metal oxide that can be used as the first oxide layer or the second oxide layer can be used.

The energy of the conduction band minimum of the first oxide layer and the third oxide layer is preferably higher than the energy of the conduction band minimum of the second oxide layer. In other words, the electron affinity of the first oxide layer and the third oxide layer is preferably lower than that of the second oxide layer.

Here, the energy level of the conduction band minimum gradually varies between the first oxide layer, the second oxide layer, and the third oxide layer. In other words, it can be said that the energy level of the conduction band minimum continuously changes or is continuously connected. To obtain this, the density of defect states in a mixed layer formed at the interface between the first oxide layer and the second oxide layer and the interface between the second oxide layer and the third oxide layer is preferably made low.

Specifically, when the first oxide layer and the second oxide layer or the second oxide layer and the third oxide layer contain the same element (as a main component) in addition to oxygen, a mixed layer with a low density of defect states can be formed. For example, when the second oxide layer is an In—Ga—Zn oxide, it is preferable to use an In—Ga—Zn oxide, a Ga—Zn oxide, gallium oxide, or the like as the first oxide layer and the third oxide layer.

In that case, a main carrier path is the second oxide layer or the vicinity thereof, for example, the interface between the second oxide layer and the third oxide layer. Since the density of defect states at the interface between the first oxide layer and the second oxide layer and the interface between the second oxide layer and the third oxide layer can be made low, the influence of interface scattering on carrier conduction is small, and a high on-state current can be obtained.

The conductor 44 functions as a first gate (also referred to as a top gate) electrode, and the conductor 31 functions as a second gate (also referred to as a bottom gate) electrode. By changing a potential applied to the conductor 31 not in synchronization with but independently of a potential applied to the conductor 44, the threshold voltage of the transistor 10 can be controlled. In particular, when a negative potential is applied to the conductor 31, the threshold voltage of the transistor 10 can be higher than 0 V and the drain current when a voltage applied to the conductor 44 is 0 V (hereinafter, such a drain current is referred to as Icut in some cases) can be low.

When a voltage higher than a voltage $V_{th}$ [V] is applied to the top gate while a voltage $V_{bg}$ [V] is applied to the bottom gate in the transistor 10, a channel starts to be formed in the oxide 46. The voltage $V_{th}$ at this time can be referred to as the threshold voltage of the transistor 10.

In the transistor 10 illustrated in FIG. 1(A), when the voltage $V_{bg}$ is applied to the conductor 31, the voltage $V_{th}$ can be increased and the Icut of the transistor 10 can be reduced. In other words, normally-off electrical characteristics can be given to the transistor 10.

As illustrated in FIG. 1(B), fixed charge 54 is held between the insulator 32 and the oxide 33. With the fixed charge 54, the voltage $V_{th}$ of the transistor 10 can be increased and the Icut of the transistor 10 can be reduced, and the details will be described later.

Furthermore, as illustrated in FIG. 1(B), a mixed layer 52 is preferably formed between the insulator 32 and the oxide 33, and the mixed layer 52 preferably has the fixed charge 54. Here, the fixed charge 54 is formed when the oxide 33 is deposited over the insulator 32 and an electron is trapped in the mixed layer 52 formed between the insulator 32 and the oxide 33. The mixed layer 52 includes at least one of atoms contained in the insulator 32 and at least one of atoms contained in the oxide 33.

The insulator 32 is preferably soft enough to cause mixing when the oxide 33 is deposited by a sputtering method or the like. As the insulator 32, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used, for example.

As the oxide 33, a metal oxide containing the above element M, in particular, a metal element having a strong strength of being bonded to oxygen, such as gallium, is preferably used. For example, gallium oxide can be used as the oxide 33. Here, the oxide 33 preferably contains a large amount of gallium atoms; for example, the atomic ratio of gallium in metal elements contained in the oxide 33 is set to higher than the atomic ratio of gallium in metal elements contained in the oxide 46.

As in the case of the oxide 46, an oxide containing indium and gallium, an oxide containing indium, gallium, and zinc, or the like can be used as the oxide 33. In that case, for example, the atomic ratio of indium in the metal elements contained in the oxide 33 is set to lower than the atomic ratio of indium in the metal elements contained in the oxide 46.

In some cases, oxygen vacancies in the oxide 33 are filled with hydrogen, so that donor impurities having positive charge are formed. However, the use of a metal oxide containing a metal element having a strong strength of being bonded to oxygen, such as gallium, as the oxide 33, facilitates bonding of oxygen to the oxide 33, and the amount of oxygen vacancies can be reduced. This allows a reduction in the amount of donor impurities with positive charge. Thus, the fixed charge 54 that is negative is clearly observed between the insulator 32 and the oxide 33.

As the insulator 34 provided over the oxide 33, an insulator containing oxygen is preferably used. Specifically, the insulator 34 preferably contains oxygen in excess of oxygen in the stoichiometric composition (hereinafter also referred to as excess oxygen). That is, oxygen diffusion from the insulator 34 to the oxide 33 can reduce the amount of oxygen vacancies in the oxide 33. As in the case of the insulator 34, an insulator containing oxygen is preferably used as the insulator 32.

For example, an oxide material that releases part of oxygen when heated is preferably used as an insulator containing excess oxygen that can be used for the insulator 34. An oxide that releases oxygen when heated is an oxide film in which the amount of released oxygen converted into oxygen molecules per unit thickness is greater than or equal to $1.0 \times 10^{18}$ atoms/cm$^3$, preferably greater than or equal to $1.0 \times 10^{19}$ atoms/cm$^3$, more preferably greater than or equal to $2.0 \times 10^{19}$ atoms/cm$^3$, still more preferably greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C.

As the insulator 34, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used, for example. In particular, silicon oxide and silicon oxynitride, which have thermal stability, are preferable.

Providing the insulator 34 also allows oxygen to be supplied to the oxide 46 over the insulator 34. The use of a similar insulator containing excess oxygen as the insulator 41 allows oxygen to be supplied to the channel formation region of the oxide 46, reducing the amount of oxygen vacancies.

Figure 2A:
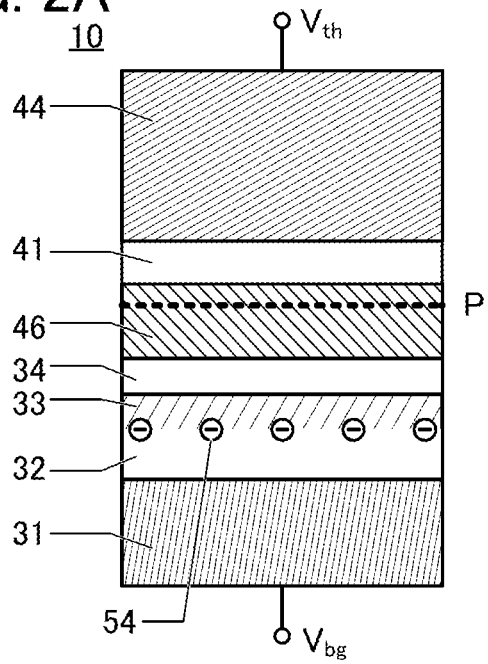
FIGS. 2A to 2D Schematic views of a semiconductor device of one embodiment of the present invention and an equivalent circuit diagram of the semiconductor device.
Figure 2B:
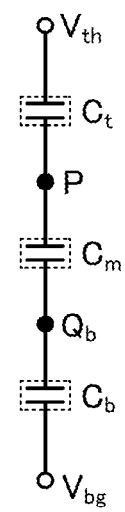
Figure 2C:
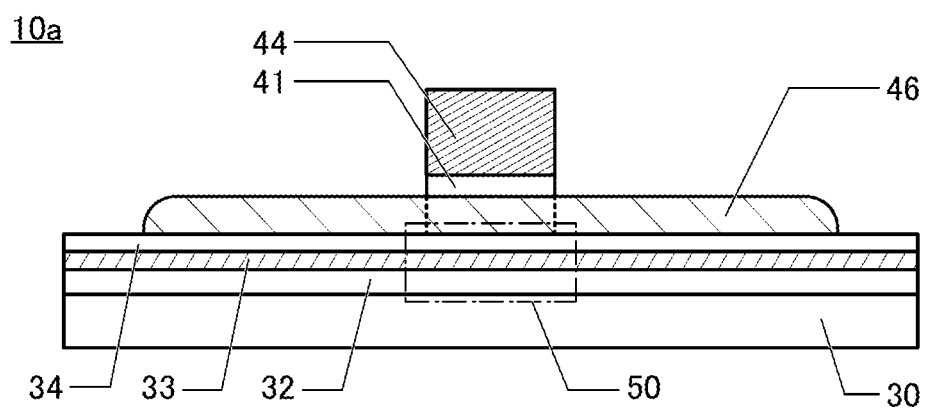

Next, the amount of change in the threshold voltage $\Delta V_{th}$ of the transistor 10 illustrated in FIG. 1 due to the fixed charge 54 will be described with reference to FIG. 2. FIG. 2(A) is a schematic diagram illustrating a model of a portion between a top gate and a bottom gate of the transistor 10, and FIG. 2(B) is an equivalent circuit diagram corresponding to the model illustrated in FIG. 2(A).

In the model of the transistor 10 illustrated in FIG. 2(A), the conductor 31 has a function of a bottom gate, the insulator 32, the oxide 33, and the insulator 34 have a function of a gate insulator of the bottom gate, the oxide 46 has a function of a channel formation region, the conductor 44 has a function of a top gate, and the insulator 41 has a function of a gate insulator of the top gate. The fixed charge 54 is held between the insulator 32 and the oxide 33, and the charge amount of the fixed charge 54 is represented by $Q_b$.

In the model of the transistor 10 illustrated in FIG. 2(A), when the voltage $V_{th}$ is applied to the conductor 44 while the voltage $V_{bg}$ is applied to the conductor 31, a channel starts to be formed in the oxide 46. Hereinafter, a region of the transistor 10 in which a channel is formed is referred to as a region P. For example, when the oxide 46 has a stacked-layer structure of the first to third oxide layers, the region P is formed in the vicinity of the interface between the second oxide layer and the third oxide layer in some cases.

Although a channel is formed in the oxide 46 in FIG. 2(A), it is not necessarily formed therein. For example, a channel is formed in the vicinity of the interface of the oxide 46 on the insulator 41 side, in some cases.

Here, the model of the transistor 10 is illustrated in the equivalent circuit diagram shown in FIG. 2(B), where the electrostatic capacitance of the insulator 32 is represented by $C_b$, the series combined capacitance of the oxide 33, the insulator 34, and a portion below the region P of the oxide 46 is represented by $C_m$, and the series combined capacitance of the insulator 41 and a portion above the region P of the oxide 46 is represented by $C_t$.

When the amount of change in the threshold voltage $\Delta V_{th}$ of the transistor 10 due to the fixed charge 54 in the model illustrated in FIG. 2(B) is obtained, $\Delta V_{th}$ of the transistor 10 can be expressed by the following formula.

$$\Delta V_{th} = -\frac{C_m Q_b}{C_t(C_m + C_b)} \quad \text{[Formula 1]}$$

According to the above formula, $\Delta V_{th}$ is proportional to the charge amount $Q_b$ of the fixed charge 54. That is, as the charge amount $Q_b$ ($Q_b$ is a negative value) of the fixed charge 54 that is negative and held between the insulator 32 and the oxide 33 is reduced, the voltage $V_{th}$ of the transistor 10 can be increased and Icut of the transistor 10 can be sufficiently decreased. For example, the mixed layer 52 preferably has the fixed charge 54 at $-2.0 \times 10^{12}$ e/cm$^2$ or less. Here, e represents an elementary charge.

In this manner, the threshold voltage $V_{th}$ of the transistor 10 can be shifted in the positive direction by the fixed charge 54 that is negative and held between the insulator 32 and the oxide 33. Accordingly, application of the negative voltage $V_{BG}$ with a small absolute value to the conductor 31 can shift the threshold voltage $V_{th}$ in the positive direction, sufficiently reducing the Icut of the transistor 10. Thus, the transistor 10 that operates at the negative voltage $V_{BG}$ with a small absolute value and has normally-off electrical characteristics can be provided.

As shown in the above formula, the lower the ratio of $C_b$ to $C_m$ is, that is, the smaller the value of $C_b/C_m$ is, the higher $\Delta V_{th}$ is. Thus, the electrostatic capacitance of the insulator 32 is set to lower than the series combined capacitance of the oxide 33, the insulator 34, and the portion below the region P of the oxide 46. Specifically, for example, a silicon-based insulating film having a low dielectric constant is used as the insulator 32, or the thickness of the insulator 32 is set to larger than that of the insulator 34.

Although the structure of the transistor 10 is illustrated in FIG. 1(A) and the like in which the conductor 31 functioning as a second gate electrode is provided, the semiconductor device described in this embodiment is not limited thereto. For example, when a sufficiently large amount of fixed charge 54 is held, the threshold voltage $V_{th}$ of the transistor 10 can be shifted in the positive direction and Icut of the transistor 10 can be sufficiently reduced in some cases even without providing the conductor 31 functioning as a second gate electrode and applying negative voltage $V_{BG}$ to the conductor 31. In that case, a structure where the conductor 31 is not provided as in a transistor 10a illustrated in FIG. 2(C) may be employed.

FIG. 1(A) and the like illustrate the structure of the transistor 10 in which switching of the transistor 10 is controlled with the conductor 44 provided over the oxide 46 and the threshold voltage of the transistor 10 is controlled with the conductor 31 provided under the oxide 46; however, the semiconductor device described in this embodiment is not limited thereto. For example, a structure may be employed in which as in a transistor 10b illustrated in FIG. 2(D), the conductor 44 for controlling switching of the transistor 10 is provided under the oxide 46 and the conductor 31 for controlling the threshold voltage of the transistor 10 is provided over the oxide 46. Here, the conductor 44 is provided over the insulator 40.

The insulator 41 is provided between the conductor 44 and the oxide 46, and the insulator 32, the oxide 33, and the insulator 34 are provided between the conductor 31 and the oxide 46. As in the transistor 10, fixed charge is held between the insulator 32 and the oxide 33. It is preferable that a mixed layer of the insulator 32 and the oxide 33 be formed therebetween and the mixed layer have fixed negative charge. Note that materials similar to those for the transistor 10 can be used for the conductor 44, the insulator 41, the oxide 46, the insulator 32, the oxide 33, the insulator 34, and the conductor 31.

Figure 2D:
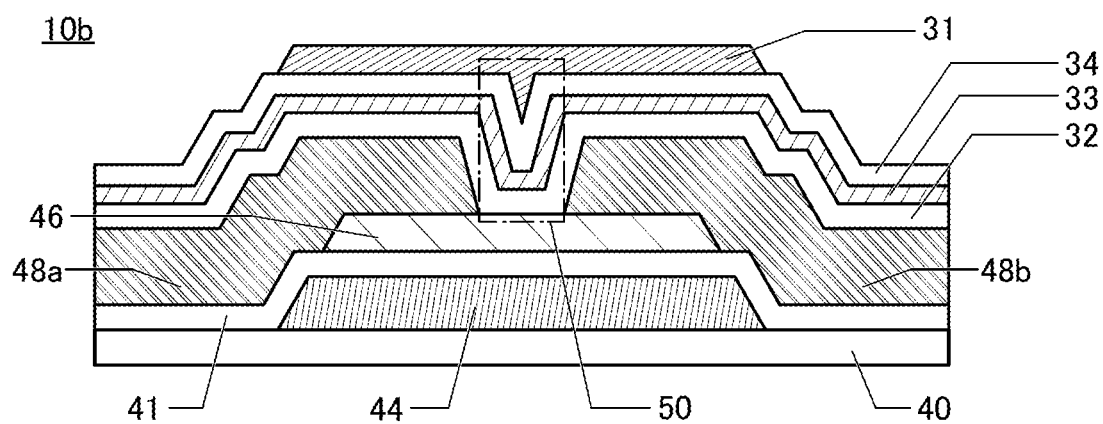

A structure may be employed in which as illustrated in FIG. 2(D), a conductor 48a and a conductor 48b functioning as a source electrode and a drain electrode of the transistor 10 are provided in contact with the oxide 46.

Next, an example of a model where the fixed charge 54 is formed between the insulator 32 and the oxide 33 will be described with reference to FIG. 3. Here, FIG. 3(A) to FIG. 3(D) correspond to FIG. 1(B).

First, the conductor 31 is formed over a substrate (not illustrated), and the insulator 32 is formed over the conductor 31. The insulator 32 is preferably a film that is soft enough to cause mixing when the oxide 33 described later is deposited by sputtering. Thus, the insulator 32 is preferably deposited by a chemical vapor deposition (CVD) method, for example.

Figure 3A:
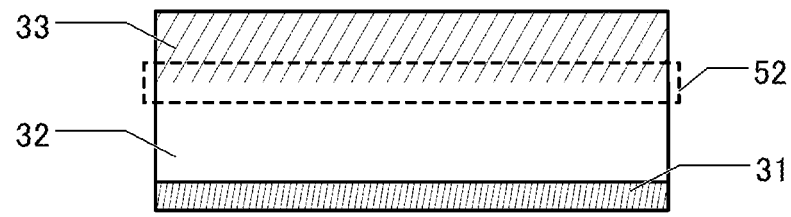
FIGS. 3A to 3D Schematic views illustrating a method for manufacturing a semiconductor device of one embodiment of the present invention.

Next, the oxide 33 is formed in contact with the top surface of the insulator 32 by a sputtering method (see FIG. 3(A)). When the oxide 33 is deposited by a sputtering method, mixing is caused on a surface of the insulator 32, and the mixed layer 52 is formed between the insulator 32 and the oxide 33.

In sputtering deposition of the oxide 33, a target containing gallium is used. A target containing indium and gallium or a target containing indium, gallium, and zinc may also be used.

Figure 3B:
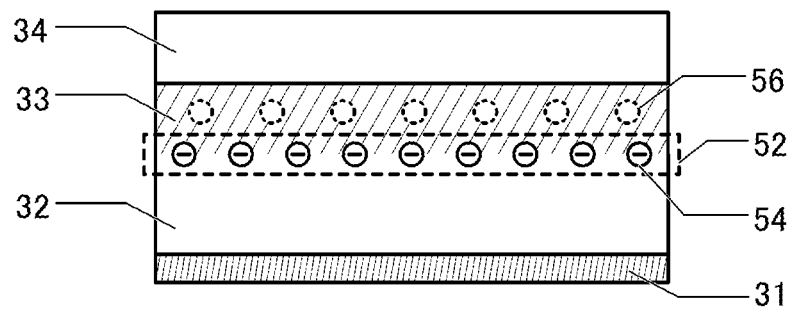

Then, an insulator 34 is formed over the oxide 33 (see FIG. 3(B)). The insulator 34 can be deposited by a CVD method, for example. Oxygen vacancies 56 are formed in the oxide 33 by damage due to the deposition by a CVD method or the like. Furthermore, hydrogen contained in a deposition atmosphere enters the oxide 33, whereby the oxygen vacancies 56 are filled with the hydrogen. Accordingly, the hydrogen serves as a donor impurity having positive charge and generates n-type carriers. Charge of the carriers or the like is trapped by the mixed layer 52 functioning as an electron trap layer, whereby the fixed charge 54 that is negative is formed.

Figure 3C:
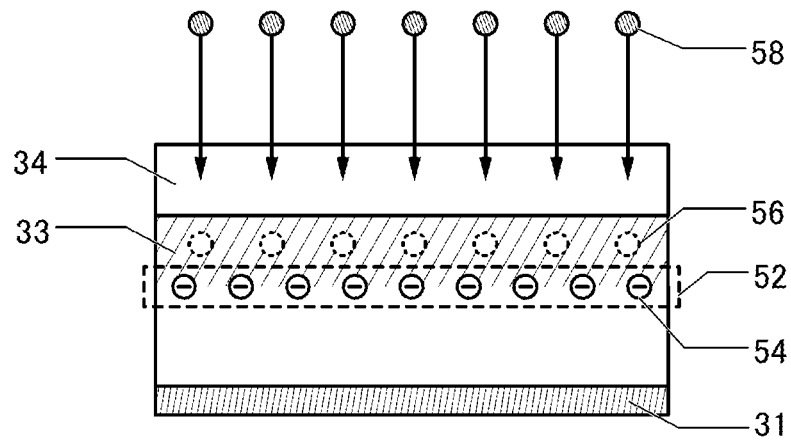

Next, oxygen 58 is added to the insulator 34 (see FIG. 3(C)). The oxygen 58 may be added by sputtering deposition on the insulator 34 in an atmosphere containing the oxygen 58, for example. An ion implantation method, an ion doping method, or a plasma immersion ion implantation method may also be employed, for example. The oxygen 58 can also be added to the insulator 34 by depositing the insulator 34 in an atmosphere containing oxygen, for example. Although the oxygen 58 is added as an oxygen radical to the insulator 34 here, for example, the state of the oxygen 58 at the time of being added is not limited thereto. The oxygen 58 may be added in the state of an oxygen atom, an oxygen ion, or the like to the insulator 34.

Figure 3D:
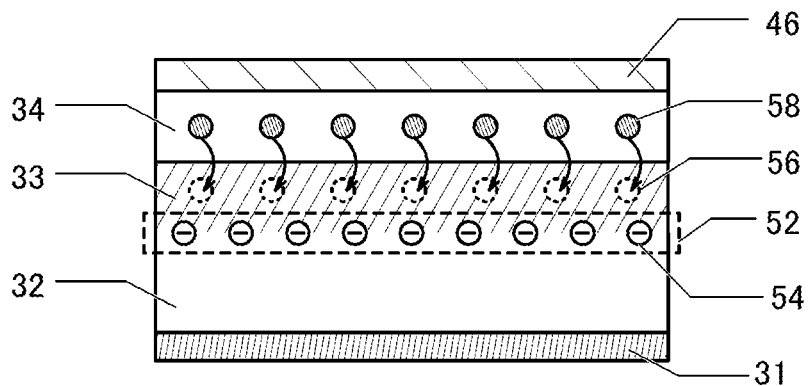

Then, the oxide 46 is formed over the insulator 34 by a sputtering method (see FIG. 3(D)). Here, when the oxide 46 is deposited by a sputtering method in an atmosphere containing oxygen, oxygen can be added to the insulator 34 even without adding the oxygen 58 illustrated in FIG. 3(C).

After the deposition of the oxide 46, heat treatment is preferably performed. The heat treatment is performed at higher than or equal to 250° C. and lower than or equal to 650° C., preferably higher than or equal to 300° C. and lower than or equal to 500° C., more preferably higher than or equal to 320° C. and lower than or equal to 450° C. Accordingly, the added oxygen 58 can be diffused to the oxide 33 so that the oxygen vacancies 56 in the oxide 33 are filled with the oxygen 58 (see FIG. 3(D)). This can reduce the amount of donor impurities having positive charge in the oxide 33. Thus, the fixed charge 54 is clearly observed between the insulator 32 and the oxide 33 in the transistor 10.

Then, the insulator 41 is formed over the oxide 46, and the conductor 44 is formed over the insulator 41. In this manner, the transistor 10 can be fabricated.

According to one embodiment of the present invention, a semiconductor device with a high threshold voltage can be provided in the aforementioned manner. According to another embodiment of the present invention, a semiconductor device having normally-off electrical characteristics can be provided. According to another embodiment of the present invention, a semiconductor device that operates at a voltage with a small absolute value can be provided. According to another embodiment of the present invention, a semiconductor device having favorable electrical characteristics can be provided.

The structure, composition, method, and the like described above in this embodiment can be used in combination with the structures, compositions, methods, and the like described in the other embodiments, as appropriate.

Embodiment 2

Specific structure examples of the transistor described in the above embodiment will be described below with reference to FIG. 4 to FIG. 9.

<Structure Examples of Semiconductor Device>

Figure 4A:
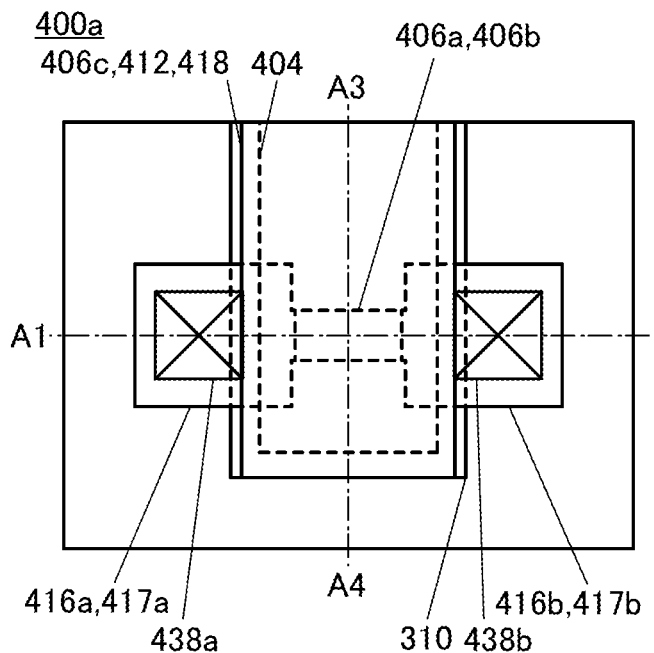
FIGS. 4A to 4C Top and cross-sectional views of a semiconductor device of one embodiment of the present invention.
Figure 4C:
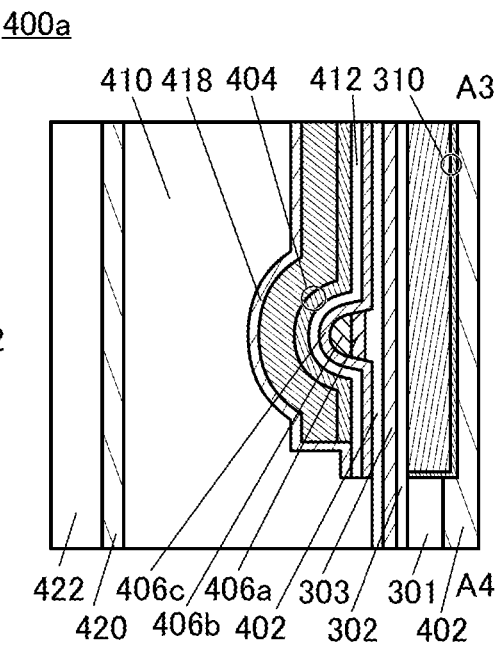
Figure 4B:
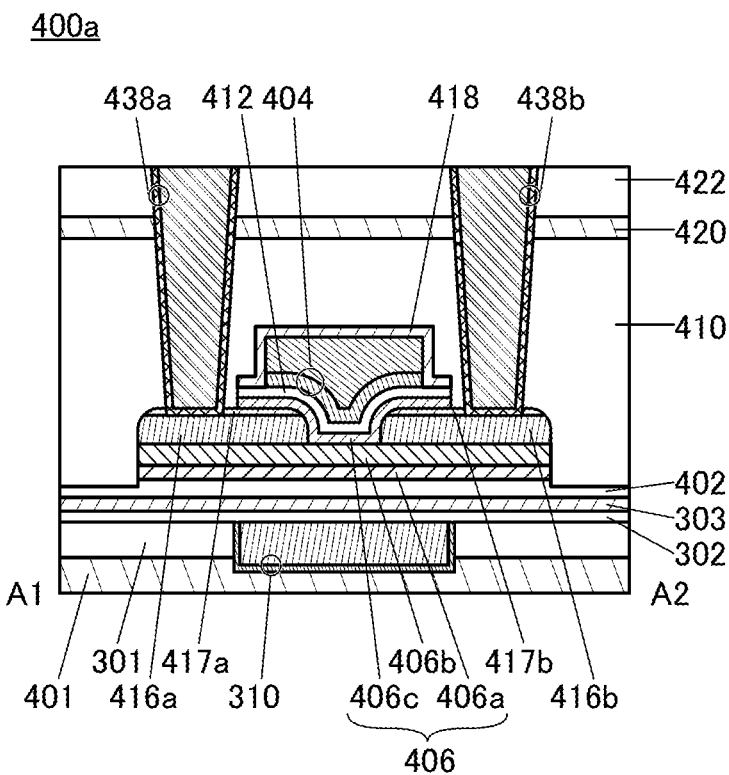

FIG. 4(A) is a top view of a transistor 400a of one embodiment of the present invention. FIG. 4(B) is a cross-sectional view of a portion indicated by the dashed-dotted line A1-A2 in FIG. 4(A). That is, FIG. 4(B) shows a cross-sectional view in the channel length direction of the transistor 400a. FIG. 4(C) is a cross-sectional view of a portion indicated by the dashed-dotted line A3-A4 in FIG. 4(A). That is FIG. 4(C) shows a cross-sectional view in the channel width direction of the transistor 400a. For simplification of the drawing, some components are omitted in the top view in FIG. 4(A). Note that the channel length direction of a transistor means the direction in which carriers move between a source (a source region or a source electrode) and a drain (a drain region or a drain electrode) in a plane parallel to a substrate, and the channel width direction means the direction perpendicular to the channel length direction in a plane parallel to a substrate.

As illustrated in FIGS. 4(A), 4(B), and 4(C), the transistor 400a includes a conductor 310; an insulator 302, an oxide 303, and an insulator 402 positioned over the conductor 310; an oxide 406a positioned over the insulator 302, the oxide 303, and the insulator 402; an oxide 406b positioned over the oxide 406a; a conductor 416a and a conductor 416b positioned over the oxide 406b so as to separate from each other; an oxide 406c positioned over the oxide 406b, the conductor 416a, and the conductor 416b; an insulator 412 positioned over the oxide 406c; and a conductor 404 positioned over the insulator 412 such that at least part of the conductor 404 overlaps with the oxide 406b.

Here, the conductor 310 corresponds to the conductor 31 of the transistor 10 described in the above embodiment. The insulator 302 corresponds to the insulator 32 of the transistor 10 described in the above embodiment. The oxide 303 corresponds to the oxide 33 of the transistor 10 described in the above embodiment. The insulator 402 corresponds to the insulator 34 of the transistor 10 described in the above embodiment. The oxide 406a, the oxide 406b, and the oxide 406c (hereinafter collectively referred to as an oxide 406 in some cases) correspond to the oxide 46 of the transistor 10 described in the above embodiment. The insulator 412 corresponds to the insulator 41 of the transistor 10 described in the above embodiment. The conductor 404 corresponds to the conductor 44 of the transistor 10 described in the above embodiment.

As in the above embodiment, fixed negative charge is held between the insulator 302 and the oxide 303 also in the transistor 400a. The threshold voltage $V_{th}$ of the transistor 400a can be shifted in the positive direction by fixed negative charge, so that the threshold voltage $V_{th}$ can be increased and Icut of the transistor 400a can be sufficiently reduced, with a negative voltage whose absolute value is small. Thus, the transistor 400a that operates at a voltage with a small absolute value and has normally-off electrical characteristics can be provided.

Furthermore, an insulator 410 is positioned over the insulator 402, the oxide 406a, the oxide 406b, the oxide 406c, the conductor 416a, the conductor 416b, the insulator 412, the conductor 404, and the like. Furthermore, a structure may be employed in which an insulator 420 is positioned over the insulator 410 and the insulator 422 is positioned over the insulator 420. A conductor 438a and a conductor 438b are formed in openings formed in the insulator 422, the insulator 420, the insulator 410, a barrier film 417a, and a barrier film 417b.

The conductor 310 is provided in an opening formed in an insulator 301. A first conductor layer is formed in contact with an inner wall of the opening in the insulator 301, and a second conductor layer is formed more inward than the first conductor layer. The top surfaces of the first conductor layer and the second conductor layer can be substantially level with the top surface of the insulator 301. The conductor 310 can function as one gate electrode.

Here, for the first conductor layer, a conductive material through which impurities such as water or hydrogen are less likely to pass is preferably used. Furthermore, for example, tantalum, tantalum nitride, ruthenium, or ruthenium oxide is preferably used, and a single layer or a stacked layer can be employed. This can inhibit diffusion of impurities such as hydrogen or water from a layer below the insulator 401 into an upper layer through the conductor 310. Note that it is preferable that the first conductor layer be less likely to allow the passage of at least one of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Furthermore, it is preferable that the first conductor layer be less likely to allow the passage of an oxygen atom or an oxygen molecule. Hereinafter, the same applies to the case of describing a conductive material that is less likely to allow the passage of impurities. When the first conductor layer has a function of inhibiting oxygen passage, the conductivity of the second conductor layer can be prevented from being lowered by oxidation.

The insulator 302, the oxide 303, and the insulator 402 can function as a gate insulating film. The description of the insulator 32, the description of the oxide 33, and the description of the insulator 34 can be referred for the insulator 302, the oxide 303, and the insulator 402, respectively.

Next, metal oxides that can be used as the oxide 406a, the oxide 406b, and the oxide 406c and that function as oxide semiconductors (hereinafter such metal oxides are also referred to as oxide semiconductors) will be described. Note that in this specification and the like, a metal oxide containing nitrogen is also called a metal oxide in some cases. Moreover, a metal oxide containing nitrogen may be called a metal oxynitride.

The metal oxides used as the oxide 406a, the oxide 406b, and the oxide 406c preferably contain at least indium. In particular, indium and zinc are preferably contained. In addition to them, the element M (the element M is one or more kinds selected from gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) is preferably contained.

The energy gap of the metal oxide is 2 eV or more, preferably 2.5 eV or more. In this manner, the off-state current of the transistor can be reduced with the use of a metal oxide having a wide energy gap.

In the case where an In-M-Zn oxide is used as the metal oxide, it is preferable to use a target containing a polycrystalline In-M-Zn oxide as a sputtering target. Note that the atomic ratio of the deposited metal oxide varies from the above atomic ratios of metal elements contained in the sputtering target in a range of ±40%. For example, when a sputtering target used for depositing the metal oxide has a composition in which the atomic ratio of In:Ga:Zn is 4:2:4.1, the deposited metal oxide may have a composition in which the atomic ratio of In:Ga:Zn is in the neighborhood of 4:2:3. When a sputtering target has a composition in which the atomic ratio of In:Ga:Zn is 5:1:7 is used for depositing the metal oxide, the deposited metal oxide may have a composition in which the atomic ratio of In:Ga:Zn is in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of a target is formed. Depending on the substrate temperature in deposition, [Zn] in the film might be smaller than [Zn] in the target. Thus, the illustrated regions each represent an atomic ratio with which a metal oxide tends to have specific characteristics, and boundaries of the regions A to C are not clear.

A metal oxide with low carrier density is preferably used for the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. The oxide 406b has, for example, a carrier density lower than $8\times10^{11}/cm^3$, preferably lower than $1\times10^{11}/cm^3$, more preferably lower than $1\times10^{10}/cm^3$, and higher than or equal to $1\times10^{-9}/cm^3$. A highly purified intrinsic or substantially highly purified intrinsic metal oxide has few carrier generation sources and thus can have a low carrier density.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, a transistor whose channel formation region is formed in a metal oxide having a high density of trap states has unstable electrical characteristics in some cases.

In order to stabilize the electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. Examples of impurities include hydrogen, an alkali metal, an alkaline earth metal, and silicon.

Here, the influence of impurities in the metal oxide will be described.

When silicon or carbon, which is one of Group 14 elements, is contained in the metal oxide, defect states are formed in the metal oxide. Thus, the concentration of silicon or carbon in the metal oxide and the concentration of silicon or carbon around an interface with the metal oxide measured by secondary ion mass spectrometry (SIMS) are set lower than or equal to $2\times10^{18}$ atoms/$cm^3$, preferably lower than or equal to $2\times10^{17}$ atoms/$cm^3$.

When the metal oxide contains an alkali metal or an alkaline earth metal, defect states are formed and carriers are generated, in some cases. Thus, a transistor using a metal oxide that contains an alkali metal or an alkaline earth metal is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide measured by SIMS is set lower than or equal to $1\times10^{18}$ atoms/$cm^3$, preferably lower than or equal to $2\times10^{16}$ atoms/$cm^3$.

Hydrogen contained in a metal oxide reacts with oxygen bonded to a metal atom to be water, and thus an oxygen vacancy ($V_o$) is formed, in some cases. Due to entry of hydrogen into the oxygen vacancy ($V_o$), an electron serving as a carrier is generated in some cases. Furthermore, in some cases, bonding of part of hydrogen to oxygen bonded to a metal atom causes generation of an electron serving as a carrier. Thus, a transistor using a metal oxide that contains hydrogen is likely to have normally-on characteristics. Accordingly, it is preferable that hydrogen in the metal oxide be reduced as much as possible. Specifically, the hydrogen concentration of the metal oxide measured by SIMS is set lower than $1\times10^{20}$ atoms/cm$^3$, preferably lower than $1\times10^{19}$ atoms/cm$^3$, more preferably lower than $5\times10^{18}$ atoms/cm$^3$, and still more preferably lower than $1\times10^{18}$ atoms/cm$^3$.

The amount of oxygen vacancies ($V_o$) in the metal oxide can be reduced by introduction of oxygen into the metal oxide. That is, the oxygen vacancies ($V_o$) in the metal oxide disappear when the oxygen vacancies ($V_o$) are filled with oxygen. Accordingly, diffusion of oxygen in the metal oxide can reduce the amount of oxygen vacancies ($V_o$) in a transistor and improve the reliability of the transistor.

As a method for introducing oxygen into the metal oxide, for example, an oxide in which the oxygen content is higher than that in the stoichiometric composition can be provided in contact with the metal oxide. That is, in the oxide, a region containing oxygen in excess of that in the stoichiometric composition (hereinafter also referred to as an excess oxygen region) is preferably formed. In particular, in the case of using a metal oxide in a transistor, an oxide including an excess oxygen region is provided in a base film, an interlayer film, or the like in the vicinity of the transistor, whereby the amount of oxygen vacancies in the transistor is reduced, and the reliability can be improved.

When a metal oxide with sufficiently reduced impurity concentration is used for a channel formation region or the like in a transistor, the transistor can have stable electrical characteristics.

The metal oxide used as the oxide 406b preferably has a CAC (Cloud-Aligned Composite) composition. Described below will be the composition of a CAC (Cloud-Aligned Composite)-OS that can be used for a transistor disclosed in one embodiment of the present invention.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above conducting function, and the insulating regions have the above insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

The above metal oxides are classified into single-crystal oxide semiconductors and non-single-crystal oxide semiconductors. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is anon-regular hexagon in some cases. Furthermore, a pentagonal or heptagonal lattice arrangement, for example, is included in the distortion in some cases. Note that it is impossible to observe a clear crystal grain boundary (also referred to as grain boundary) even in the vicinity of distortion in the CAAC-OS. That is, formation of a grain boundary is inhibited due to the distortion of lattice arrangement. This is presumably because the CAAC-OS can tolerate distortion owing to non-dense arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium of the In layer is replaced with the element M, the layer can also be referred to as an (In,M) layer.

The CAAC-OS is an oxide semiconductor with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might decrease the crystallinity of an oxide semiconductor, which means that the CAAC-OS is an oxide semiconductor having small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor having a structure between those of the nc-OS and the amorphous oxide semiconductor. The a-like OS contains avoid or a low-density region. That is, the a-like OS has low crystallinity as compared with the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

The metal oxides used as the oxide 406a and the oxide 406c are each an oxide containing the element M (the element M is any one or more of Al, Ga, Si, B, Y, Ti, Fe, Ni, Ge, Zr, Mo, La, Ce, Nd, Hf, Ta, W, Mg, V, Be, and Cu). As the oxide 406a and the oxide 406c, for example, an In—Ga—Zn oxide, gallium oxide, boron oxide, or the like can be used.

Here, the atomic ratio of the element M in the metal elements in the metal oxide used as the oxide 406a and the oxide 406c is preferably higher than that of the element M in the metal elements in the metal oxide used as the oxide 406b. Moreover, the atomic ratio of the element M to In in the metal oxide used as the oxide 406a and the oxide 406c is preferably higher than that of the element M to In in the metal oxide used as the oxide 406b.

Furthermore, the metal oxide used as the oxide 406a and the oxide 406c preferably has anon-single-crystal structure. The non-single-crystal structure includes, for example, a CAAC-OS, a polycrystalline structure, a microcrystalline structure, or an amorphous structure. The metal oxide used as the oxide 406a and the oxide 406c may have a CAAC structure. Thus, the metal oxide used as the oxide 406a and the oxide 406c may have a layered crystal structure in which a plurality of IGZO nanocrystals have c-axis alignment and are connected in the a-b plane direction without alignment.

Furthermore, the metal oxide used as the oxide 406a and the oxide 406c may have higher crystallinity than the metal oxide used as the oxide 406b. Here, the metal oxide used as the oxide 406a and the oxide 406c is an oxide deposited under an atmosphere containing oxygen, for example. With the oxide, the oxide 406a and the oxide 406c can have high crystallinity. In addition, the shapes of the oxide 406a and the oxide 406c can be more stable.

It is preferable that by using the above metal oxide as the oxide 406c, the energy of the conduction band minimum of the oxide 406c be higher than the energy of the conduction band minimum of the oxide 406b. In other words, the electron affinity of the oxide 406c is preferably smaller than the electron affinity of the oxide 406b. Here, the electron affinity means a difference between a vacuum level and an energy level of the conduction band minimum.

Similarly, it is preferable that by using the above metal oxide as the oxide 406a, the energy of the conduction band minimum of the oxide 406a be higher than the energy of the conduction band minimum of the oxide 406b. In other words, the electron affinity of the oxide 406a is preferably smaller than the electron affinity of the oxide 406b.

Here, the energy level of the conduction band minimum gradually varies in the oxide 406a, the oxide 406b, and the oxide 406c. In other words, the energy level of the conduction band minimum continuously varies or is continuously connected. To vary the energy level gradually, the density of defect states in a mixed layer formed at the interface between the oxide 406a and the oxide 406b or the interface between the oxide 406b and the oxide 406c is decreased.

Specifically, when the oxide 406a and the oxide 406b or the oxide 406b and the oxide 406c contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as each of the oxide 406a and the oxide 406c.

At this time, the oxide 406b and the vicinity thereof serve as a main carrier path. Since the density of defect states at the interface between the oxide 406a and the oxide 406b and the interface between the oxide 406b and the oxide 406c can be decreased, the influence of interface scattering on carrier conduction is small, and a high on-state current can be obtained.

When an electron is trapped in a trap state, the trapped electron behaves like fixed charge; thus, the threshold voltage of the transistor is shifted in the positive direction. Providing the oxide 406a and the oxide 406c can make the trap state apart from the oxide 406b. This structure can prevent the positive shift of the threshold voltage of the transistor.

Note that the metal oxide used for the transistor has the above-described three-layer structure in this embodiment; however, one embodiment of the present invention is not limited thereto. For example, a two-layer structure without the oxide 406a or the oxide 406c may be employed. Alternatively, a four-layer structure in which any one of the above-described semiconductors is provided under or over the oxide 406a or under or over the oxide 406c may be employed. Alternatively, an n-layer structure (n is an integer of 5 or more) may be employed in which any one of the semiconductors described as examples of the oxide 406a, the oxide 406b, and the oxide 406c is provided in two or more of the following positions: over the oxide 406a, under the oxide 406a, over the oxide 406c, and under the oxide 406c.

The transistor described in this embodiment preferably includes the oxide 406a, the oxide 406b, and the oxide 406c described above.

The oxide 406a is preferably positioned in contact with the top surface of the insulator 402. The oxide 406b is preferably positioned in contact with the top surface of the oxide 406a.

The oxide 406b includes a first region, a second region, and a third region. In the top view, the third region is positioned between the first region and the second region. The transistor described in this embodiment includes the conductor 416a over and in contact with the first region of the oxide 406b. The transistor described in this embodiment includes the conductor 416b over and in contact with the second region of the oxide 406b. One of the first region and the second region of the oxide 406b can function as a source region, and the other can function as a drain region. The third region of the oxide 406b can function as a channel formation region.

Here, the first region and the second region preferably have a lower oxygen concentration or a lower carrier density than the third region. For example, the first region and the second region preferably have a higher concentration of at least one of a metal element, a rare gas, and impurity elements such as hydrogen and nitrogen than the third region. For example, the first region and the second region preferably contain one or more metal elements selected from metal elements such as aluminum, ruthenium, titanium, tantalum, tungsten, and chromium, in addition to the oxide 406. Addition of the metal element to the oxide 406 can reduce the resistance of the first region and the second region. The first region and the second region may include a region where the metal element in the oxide 406 is alloyed with the added metal element.

The oxide 406c is preferably positioned over the oxide 406a and the oxide 406b, the conductors 416a and 416b, and the barrier films 417a and 417b to be in contact with the third region of the oxide 406b. The oxide 406c may cover side surfaces of the oxide 406a and the oxide 406b. As illustrated in FIG. 4(C), the side surfaces of the oxide 406a and the oxide 406b in the channel width direction are preferably in contact with the oxide 406c. In addition, the conductor 404 having a function of a first gate electrode is positioned so as to cover the third region of the oxide 406b entirely with the insulator 412 having a function of a first gate insulator interposed therebetween.

The oxide 406c may be positioned so as to cover the oxide 406a and the oxide 406b entirely. For example, a structure may be employed in which side surfaces of the oxide 406a and the oxide 406b in the channel length direction are in contact with the oxide 406c.

The conductor 416a and the conductor 416b are preferably positioned so as to be separate from each other and in contact with the top surface of the oxide 406b. Here, the conductor 416a can function as one of a source electrode and a drain electrode, and the conductor 416b can function as the other of the source electrode and the drain electrode.

As illustrated in FIGS. 4(A) and 4(B), one side end portion of the conductor 416a is preferably substantially aligned with one side end portion of the oxide 406a and one side end portion of the oxide 406b. Similarly, one side end portion of the conductor 416b is preferably substantially aligned with the other side end portion of the oxide 406a and the other side end portion of the oxide 406b. With such a structure, the side surfaces of the oxide 406a and the oxide 406b are not in contact with the conductor 416a and the conductor 416b; thus, extraction of oxygen, which causes oxygen vacancies to be formed in the side surfaces of the oxide 406a and the oxide 406b, can be prevented. Furthermore, since the side surfaces of the oxide 406a and the oxide 406b are not in contact with the conductor 416a and the conductor 416b, entry of impurities derived from the conductor 416a and the conductor 416b through the side surfaces of the oxide 406a and the oxide 406b can be prevented.

Here, the distance between the side end portion of the conductor 416a and the side end portion of the conductor 416b that face each other, that is, the channel length of the transistor is greater than or equal to 10 nm and less than or equal to 300 nm, typically, greater than or equal to 20 nm and less than or equal to 180 nm.

A structure may be employed in which the angle formed between the side surface and the bottom surface of the conductor 416a and the angle formed between the side surface and the bottom surface of the conductor 416b are each preferably less than 90°, which is a taper angle. The angles are each preferably greater than or equal to 45° and less than or equal to 75°. When the conductor 416a and the conductor 416b are formed in such a manner, the oxide 406c can be formed with good coverage also in step portions formed by the conductor 416a and the conductor 416b. Accordingly, for example, a break of the oxide 406c, which causes the oxide 406b to be in contact with the insulator 412 or the like, can be prevented.

The barrier film 417a is preferably positioned in contact with the top surface of the conductor 416a, and the barrier film 417b is preferably provided in contact with the top surface of the conductor 416b. The barrier film 417a and the barrier film 417b have a function of inhibiting the passage of oxygen and impurities such as hydrogen and water. Aluminum oxide or the like can be used for the barrier film 417a and the barrier film 417b, for example. This can prevent surrounding excess oxygen from being used for oxidation of the conductor 416a and the conductor 416b. Furthermore, an increase in the electric resistance values of the conductor 416a and the conductor 416b due to the oxidation can be prevented. Note that the electric resistance values of the conductors can be measured by a two-terminal method or the like. Note that a structure without the barrier films 417a and 417b may be employed.

Moreover, since the barrier film 417a as well as the insulator 412 and the oxide 406c is positioned between the conductor 404 and the conductor 416a, the parasitic capacitance between the conductor 404 and the conductor 416a can be small. Similarly, since the barrier film 417b as well as the insulator 412 and the oxide 406c is positioned between the conductor 404 and the conductor 416b, the parasitic capacitance between the conductor 404 and the conductor 416b can be small. Thus, the transistor described in this embodiment has excellent frequency characteristics.

The insulator 412 can function as a gate insulating film and is preferably positioned in contact with the top surface of the oxide 406c. Like the insulator 402, the insulator 412 is preferably formed using an insulator from which oxygen is released by heating. When the insulator 412 formed using such an insulator is formed in contact with the top surface of the oxide 406c, oxygen can be supplied to the oxide 406b effectively. Furthermore, the concentration of impurities such as water and hydrogen in the insulator 412 is preferably lowered as in the insulator 402.

The conductor 404 includes a first conductive layer and a second conductive layer over the first conductive layer. The insulator 412 and the conductor 404 each include a region that overlaps with the oxide 406b. Side edge portions of the first conductive layer and the second conductive layer are substantially aligned with each other.

As in the first conductive layer of the conductor 310, a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, or $NO_2$), or a copper atom is preferably used in the first conductive layer. Alternatively, a conductive material having a function of inhibiting diffusion of oxygen (e.g., at least one of oxygen atoms, oxygen molecules, and the like) is preferably used.

When the first conductive layer has a function of inhibiting oxygen diffusion, the conductivity of the conductor 404b can be prevented from being lowered because of oxidization due to excess oxygen contained in the insulator 412. As a conductive material having a function of inhibiting oxygen diffusion, for example, tantalum, tantalum nitride, ruthenium, or ruthenium oxide is preferably used.

A conductive material containing tungsten, copper, or aluminum as its main component is preferably used for the second conductive layer. The second conductive layer functions as a wiring and thus is preferably a conductor having high conductivity. For example, a conductive material containing tungsten, copper, or aluminum as its main component can be used. The second conductive layer may have a stacked-layer structure, and may be, for example, a stack of the above conductive material and titanium or titanium nitride.

For example, a conductive oxide can be used for the first conductive layer. For example, the metal oxide that can be used as the oxide 230 is preferably used. Specifically, an In—Ga—Zn-based oxide with an atomic ratio of [In]:[Ga]:[Zn]=4:2:3 to 4:2:4.1 or the vicinity thereof, which has high conductivity, is preferably used. When such a first conductive layer is provided, the passage of oxygen through the second conductive layer can be inhibited, and an increase in electric resistance value of the second conductive layer due to oxidation can be prevented.

In addition, by depositing such a conductive oxide by a sputtering method to add oxygen to the insulator 412, oxygen can be supplied to a channel formation region of the oxide 406.

In the case where the above conductive oxide is used for the first conductive layer, a conductor that can add an impurity such as nitrogen to the first conductive layer to increase the conductance of the first conductive layer is preferably used for the second conductive layer. For example, titanium nitride or the like is preferably used for the second conductive layer. The second conductive layer may have a structure in which a metal such as tungsten is stacked over a metal nitride such as titanium nitride.

Here, the conductor 404 having a function of a gate electrode is provided so as to cover the top surface of the vicinity of the third region and the side surface, which is in the channel width direction, of the oxide 406*b* with the insulator 412 and the oxide 406*c* interposed therebetween. Thus, the electric field of the conductor 404 having a function of a gate electrode can electrically surround the top surface of the vicinity of the third region and the side surface, which is in the channel width direction, of the oxide 406*b*. The structure of the transistor in which the channel formation region is electrically surrounded by the electric field of the conductor 404 is referred to as a surrounded channel (s-channel) structure. Thus, a channel can be formed in the top surface of the vicinity of the third region and the side surface, which is in the channel width direction, of the oxide 406*b*; therefore, a large amount of current can flow between the source and the drain, and a current in an on state (on-state current) can be high. Moreover, since the top surface of the vicinity of the third region and the side surface, which is in the channel width direction, of the oxide 406*b* are surrounded by the electric field of the conductor 404, a current in an off state (off-state current) can be low.

An insulator 418 is preferably provided over the conductor 404. Here, for the insulator 418, a material through which oxygen is less likely to pass is preferably used, and aluminum oxide or the like can be used, for example. This can prevent surrounding excess oxygen from being used for oxidation of the conductor 404. Thus, the insulator 418 has a function of a gate cap for protecting a gate. Note that a structure without the insulator 418 may be employed.

The insulator 420 can function as a barrier insulating film that prevents entry of impurities such as water or hydrogen into the transistor 400*a* or the like from an upper layer. For the insulator 420, an insulating material having a function of inhibiting the passage of impurities such as water and hydrogen is preferably used; for example, aluminum oxide is preferably used. In that case, diffusion of impurities such as hydrogen and water into a layer below the insulator 420 can be inhibited. Note that it is preferable that the insulator 420 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. For example, the insulator 420 preferably has higher capability of inhibiting the passage of water or hydrogen than any of the insulator 422, the insulator 410, the insulator 402, and the insulator 302.

Here, for the insulator 420, an oxide insulator formed by a sputtering method is preferably used, and for example, aluminum oxide is preferably used. With the insulator 420 described above, oxygen can be supplied to the insulator 410 through a surface of the insulator 410 that is in contact with the insulator 420, so that the insulator 410 can be in an oxygen excess state. Accordingly, oxygen can be supplied to the insulator 412, the insulator 402, and the oxide 406 through the insulator 410.

Furthermore, for the insulator 420, an insulating material that has a function of inhibiting the passage of oxygen (e.g., an oxygen atom or an oxygen molecule), such as aluminum oxide, is preferably used. Thus, oxygen contained in the insulator 412, the insulator 402, the oxide 406, and the like can be prevented from diffusing upward. Thus, oxygen can be supplied to the oxide 406 and the oxide 303 effectively.

When the insulator 420 is thus provided so that oxygen vacancies and impurities such as hydrogen and water are reduced in the channel formation region of the oxide 406 in the transistor 400*a*, the transistor 400*a* can have favorable electrical characteristics and improved reliability. Furthermore, when oxygen is supplied to the oxide 303, fixed charge formed between the oxide 303 and the insulator 302 can be held.

Note that an insulator containing an atom similar to that of the insulator 420 may be deposited on the insulator 420 by an ALD method. The insulator 420 on which such an insulator is deposited by an ALD method can cover the transistor 400*a* without formation of a break, a crack, a pinhole, or the like. Thus, the barrier property of the insulator 420 against impurities such as hydrogen or water can be improved noticeably.

The insulator 422 is preferably positioned over the insulator 420. The insulator 422 is formed using silicon oxynitride, for example.

The conductor 438*a* is formed in contact with the top surface of the conductor 416*a*, and the conductor 438*b* is formed in contact with the top surface of the conductor 416*b*. The conductor 438*a* and the conductor 438*b* are formed to fill openings formed in the insulator 410, the insulator 420, and the insulator 422. Accordingly, part of the top surface of the conductor 438*a* or the conductor 438*b* is substantially level with the top surface of the insulator 422 in some cases.

As illustrated in FIG. 4(B), the conductor 438*a* and the conductor 438*b* preferably have a stacked-layer structure of a first conductive layer and a second conductive layer on the inside of the first conductive layer. For the second conductive layer, a conductive material with relatively high electric conductivity that contains tungsten, copper, or aluminum as a main component may be used. For the first conductive layer, a conductive material having a function of inhibiting the passage of impurities such as water or hydrogen is preferably used. For example, it is preferable to use tantalum, tantalum nitride, titanium, titanium nitride, ruthenium, ruthenium oxide, or the like. A single layer or a stack of the conductive material having a function of inhibiting the passage of impurities such as water or hydrogen may also be used. The use of the conductive material can inhibit entry of impurities such as hydrogen or water from the insulator 410 or the like into the oxide 406 through the conductor 438a and the conductor 438b. The first conductive layer can have favorable coverage by being formed by an ALD method, a CVD method, or the like.

An insulator similar to that for the barrier film 417a and the barrier film 417b may be positioned so as to cover inner walls of the openings where the conductor 438a and the conductor 438b are provided. Thus, impurities such as water or hydrogen can be inhibited from entering the oxide 406 through the conductor 438a and the conductor 438b from the insulator 410 and the like.

<Constituent Materials for Semiconductor Device>

Constituent materials that can be used for a semiconductor device will be described below.

<<Substrate>>

As a substrate over which the transistor 400a is formed, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, or a compound semiconductor substrate of silicon carbide, silicon germanium, gallium arsenide, indium phosphide, zinc oxide, or gallium oxide. Another example is a semiconductor substrate in which an insulator region is provided in the above semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates over which an element is provided may be used. Examples of the element provided over the substrate include a capacitor, a resistor, a switching element, a light-emitting element, and a memory element.

Alternatively, a flexible substrate may be used as the substrate. As a method for providing the transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 m and less than or equal to 700 m, preferably greater than or equal to 10 m and less than or equal to 500 m, more preferably greater than or equal to 15 m and less than or equal to 300 m. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a robust semiconductor device can be provided.

For the substrate that is a flexible substrate, metal, an alloy, resin, glass, or fiber thereof can be used, for example. As the substrate, a sheet, a film, or a foil containing a fiber may be used. The flexible substrate preferably has a lower coefficient of linear expansion because deformation due to an environment is suppressed. For the flexible substrate, for example, a material whose coefficient of linear expansion is lower than or equal to $1 \times 10^{-3}$/K, lower than or equal to $5 \times 10^{-5}$/K, or lower than or equal to $1 \times 10^{-5}$/K is used. Examples of the resin include polyester, polyolefin, polyamide (e.g., nylon or aramid), polyimide, polycarbonate, and acrylic. In particular, aramid is preferred for the flexible substrate because of its low coefficient of linear expansion.

<<Insulator>>

When a transistor is surrounded by an insulator having a function of inhibiting the passage of oxygen and impurities such as hydrogen, the electrical characteristics of the transistor can be stable. For example, the insulator having a function of inhibiting the passage of oxygen and impurities such as hydrogen is used for the insulator 401 and the insulator 420. The insulator 401 and the insulator 420 are preferably formed using an insulating material that is less likely to allow the passage of impurities such as water or hydrogen than the insulator 402 and the like.

As the insulator having a function of inhibiting the passage of oxygen and impurities such as hydrogen, a single layer or a stack of, for example, a metal oxide such as aluminum oxide, aluminum oxynitride, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, aluminum nitride, or the like is used.

When the insulator 401 and the insulator 420 contain aluminum oxide, entry of impurities such as hydrogen into the oxide 406a, the oxide 406b, and the oxide 406c can be inhibited. Furthermore, for example, when the insulator 401 and the insulator 420 contain aluminum oxide, outward diffusion of the above-described excess oxygen added to the oxide 406a, the oxide 406b, and the oxide 406c can be inhibited.

For the insulator 301, the insulator 302, the insulator 402, and the insulator 412, a single layer or a stack of an insulator containing, for example, boron, carbon, nitrogen, oxygen, fluorine, magnesium, aluminum, silicon, phosphorus, argon, gallium, germanium, yttrium, zirconium, lanthanum, neodymium, hafnium, or tantalum can be used. For example, the insulator 301, the insulator 302, the insulator 402, and the insulator 412 preferably contain silicon oxide or silicon oxynitride.

Since the insulator 412 functions as a gate insulating film, the insulator 412 preferably contains an insulator with a high dielectric constant. For example, the insulator 412 preferably contains gallium oxide, hafnium oxide, an oxide containing aluminum and hafnium, an oxynitride containing aluminum and hafnium, an oxide containing silicon and hafnium, an oxynitride containing silicon and hafnium, or the like. The insulator 412 preferably has a stacked-layer structure of silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant.

The insulator 410 preferably contains an insulator with a low dielectric constant. An insulator with a low dielectric constant may also be used for the insulator 402. For example, the insulator 402 and the insulator 410 preferably contain silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

An insulator having a function of inhibiting the passage of oxygen and impurities such as hydrogen may be used for the barrier films 417a and 417b and the insulator 418. For the barrier films 417a and 417b and the insulator 418, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used, for example.

<<Conductor>>

For the conductor 404, the conductor 310, the conductor 416a, the conductor 416b, the conductor 438a, and the conductor 438b, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor with a high electric conductivity typified by polycrystalline silicon containing an impurity element such as phosphorus, or a silicide such as nickel silicide may be used.

A conductive material containing the above-described metal element and oxygen may be used. A conductive material containing the above-described metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

For the conductor 404, the conductor 310, the conductor 416a, the conductor 416b, the conductor 438a, and the conductor 438b, especially, for the conductor 416a and the conductor 416b, a conductive material having oxidation resistance is preferably used. As the conductive material having oxidation resistance, iridium, ruthenium oxide, strontium ruthenium oxide, lanthanum nickel oxide, titanium aluminum nitride, and tantalum aluminum nitride can be used, for example.

A plurality of conductive layers formed with the above-described materials may be stacked and used. For example, a stacked-layer structure of a combination of a material containing the above-described metal element and a conductive material containing oxygen may be used. A stacked-layer structure of a combination of a material containing the above-described metal element and a conductive material containing nitrogen may be used. A stacked-layer structure of a combination of a material containing the above-described metal element, a conductive material containing oxygen, and a conductive material containing nitrogen may be used.

When an oxide is used for the channel formation region of the transistor, a stacked-layer structure of a combination of a material containing the above-described metal element and a conductive material containing oxygen is preferably used for the gate electrode. In this case, the conductive material containing oxygen is preferably provided on the channel formation region side. When the conductive material containing oxygen is provided on the channel formation region side, oxygen released from the conductive material is likely to be supplied to the channel formation region.

For example, for the second conductive layer of the conductor 310, a conductive material such as tungsten or polysilicon is used. For the first conductive layer of the conductor 310 in contact with the insulator 401, a single layer or a stack of, for example, a barrier layer (a diffusion prevention layer) of titanium, titanium nitride, tantalum nitride, or the like can be used.

When an insulating material through which impurities are less likely to pass is used for the insulator 401, and a conductive material through which impurities are less likely to pass is used for the first conductive layer of the conductor 310 that is in contact with the insulator 401, diffusion of impurities to the transistor can be further inhibited. Thus, the reliability of the transistor can be further increased.

For the barrier films 417a and 417b, the above-described conductive material through which impurities are less likely to pass may be used. When a conductive material is used for the barrier films 417a and 417b, a conductive material from which oxygen is less likely to be released and/or by which oxygen is less likely to be absorbed is preferably used.

<Method for Manufacturing Semiconductor Device>

A method for manufacturing the transistor of one embodiment of the present invention illustrated in FIG. 4 will be described below with reference to FIG. 5 and FIG. 6. In FIG. 5 and FIG. 6, cross-sectional views corresponding to a cross section along dashed-dotted line A1-A2 illustrated in FIG. 4(B) and cross-sectional views corresponding to a cross section along dashed-dotted line A3-A4 illustrated in FIG. 4(C) are shown.

Note that in the following, an insulating material for forming an insulator, a conductive material for forming a conductor, an oxide functioning as an oxide semiconductor, and the like can be deposited by a sputtering method, a chemical vapor deposition method, a molecular beam epitaxy (MBE) method, a pulsed laser deposition (PLD) method, an ALD (Atomic Layer Deposition) method, or the like.

Note that CVD methods can be classified into a plasma CVD method using plasma (PECVD: Plasma Enhanced CVD), a thermal CVD (TCVD) method using heat, a photo CVD method using light, and the like. Moreover, the CVD methods can be classified into a metal CVD (MCVD) method and a metal organic CVD (MOCVD) method according to a source gas.

A plasma CVD method allows a high-quality film to be obtained at a relatively low temperature. A thermal CVD method is a deposition method that does not use plasma and thus causes less plasma damage to an object. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, in the case of a thermal CVD method not using plasma, such plasma damage is not caused and the yield of semiconductor devices can be increased. A thermal CVD method does not cause plasma damage during deposition, so that a film with few defects can be obtained.

An ALD method is also a deposition method that causes less plasma damage to an object. Since an ALD method does not cause plasma damage during deposition, a film with few defects can be obtained.

Unlike a deposition method in which particles ejected from a target or the like are deposited, a CVD method and an ALD method are deposition methods in which a film is formed by reaction at a surface of an object. Thus, a CVD method and an ALD method are deposition methods that are less likely to be influenced by the shape of an object and thus have favorable step coverage. In particular, an ALD method can provide excellent step coverage and excellent thickness uniformity and thus is suitable for the case of covering a surface of an opening with a high aspect ratio, for example. On the other hand, an ALD method has a relatively low deposition rate; thus, it is sometimes preferable to combine an ALD method with another deposition method with a high deposition rate, such as a CVD method.

A CVD method and an ALD method enable control of the composition of a film to be obtained with a flow rate ratio of source gases. For example, by a CVD method or an ALD method, a film with a certain composition can be formed depending on the flow rate ratio of source gases. Moreover, by changing the flow rate ratio of source gases during deposition by a CVD method or an ALD method, a film whose composition is continuously changed can be formed. In the case where a film is formed while changing the flow rate ratio of source gases, compared with the case where a film is formed using a plurality of deposition chambers, the amount of time taken for the deposition can be reduced by the amount of time taken for transfer and pressure adjustment. Thus, semiconductor devices can be manufactured with improved productivity in some cases.

First, over a substrate (not illustrated), the insulator 401 and the insulator 301 are formed in this order. In this embodiment, a single crystal silicon substrate (including a p-type semiconductor substrate or an n-type semiconductor substrate) is used as the substrate. Furthermore, in this embodiment, an aluminum oxide film is formed as the insulator 401 by a sputtering method, and a silicon oxynitride film is formed as the insulator 301 by a CVD method.

For example, an aluminum oxide film may be formed over or under the insulator 401 by an ALD method.

Next, an opening (including a groove, a trench, a hole, or the like) reaching the insulator 401 is formed in the insulator 301. The opening may be formed by wet etching; however, dry etching is preferable for microfabrication. As the insulator 401, an insulator that serves as an etching stopper film when forming the opening by etching the insulator 301 is preferably selected. For example, in the case where silicon oxide or silicon oxynitride is used as the insulator 301 in which the opening is to be formed, silicon nitride, aluminum oxide, hafnium oxide, or the like is preferably used as the insulator 401. In this case, because of the etching, a depression might be formed in part of the insulator 401 that overlaps with the opening in the insulator 301.

Next, a conductive film to be the first conductive layer of the conductor 310 and a conductive film to be the second conductive layer of the conductor 310 are formed. In this embodiment, a stacked-layer film of tantalum nitride deposited by a sputtering method and titanium nitride deposited by an ALD method is used for the first conductive layer of the conductor 310. Furthermore, a tungsten film formed by a CVD method is used for the second conductive layer of the conductor 310.

Figure 5A:
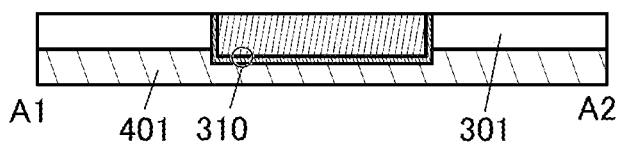
FIGS. 5A to 5H Cross-sectional views illustrating a method for manufacturing a semiconductor device of one embodiment of the present invention.
Figure 5B:
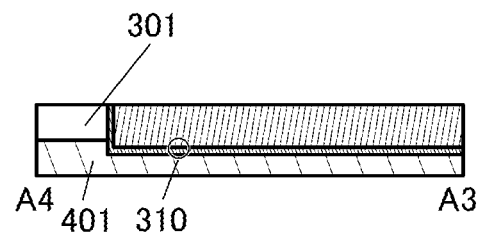

Next, CMP treatment is performed to remove the first conductive layer of the conductor 310 and the second conductive layer of the conductor 310 that are above the insulator 301 (see FIGS. 5(A) and 5(B)). Accordingly, the first conductive layer of the conductor 310 and the second conductive layer of the conductor 310 remain only in the opening, whereby the conductor 310 with a flat top surface can be formed.

Next, the insulator 302 is deposited on the insulator 301 and on the conductor 310. The insulator 302 is preferably a film that is soft enough to cause mixing when the oxide 303 described later is deposited by sputtering. Thus, the insulator 302 is preferably deposited by a CVD method, for example. In this embodiment, as the insulator 302, a silicon oxynitride film is formed by a CVD method.

Then, the oxide 303 is formed in contact with the top surface of the insulator 302 by a sputtering method. When the oxide 303 is deposited by a sputtering method, mixing is caused on a surface of the insulator 302, and a mixed layer is formed between the insulator 302 and the oxide 303. Oxygen vacancies are formed in the oxide 303, and when they are filled with hydrogen or the like, n-type carriers are generated. Charge of the carriers or the like is trapped by the mixed layer functioning as an electron trap layer, whereby fixed charge is formed.

Note that in sputtering deposition of the oxide 303, a target containing gallium is used. Furthermore, a target containing indium and gallium or a target containing indium, gallium, and zinc may be used.

Next, the insulator 402 is deposited over the oxide 303. In this embodiment, as the insulator 402, a silicon oxynitride film is formed by a CVD method.

Then, first heat treatment may be performed. The first heat treatment can be performed at higher than or equal to 250° C. and lower than or equal to 650° C., preferably higher than or equal to 300° C. and lower than or equal to 500° C. In the case where a wiring or the like formed to contain copper is provided under the transistor described in this embodiment, the temperature of the first heat treatment is preferably set to 410° C. or lower. The first heat treatment is performed in an inert gas atmosphere. The first heat treatment may be performed under a reduced pressure. Through the first heat treatment, impurities such as hydrogen or water contained in the insulator 402 can be removed, for example. In this embodiment, heat treatment is performed at a temperature of 400° C. in a nitrogen gas atmosphere, as the first heat treatment.

Here, oxygen is preferably added to the insulator 304. The addition of oxygen may be performed by sputtering deposition on the insulator 304 in an atmosphere containing oxygen, for example. Furthermore, an ion implantation method, an ion doping method, a plasma immersion ion implantation method, or the like may be employed, for example. Furthermore, to add oxygen to the insulator 304, the insulator 304 may be deposited in an atmosphere containing oxygen, for example. Although oxygen is added as an oxygen radical to the insulator 304 here, for example, the state of oxygen at the time of being added is not limited thereto. Oxygen in the state of an oxygen atom, an oxygen ion, or the like may be added to the insulator 304.

Figure 5C:
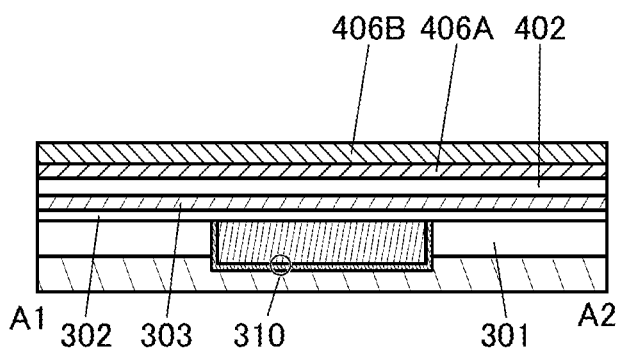
Figure 5D:
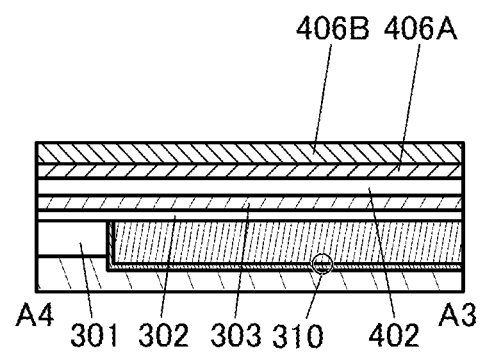
Figure 5E:
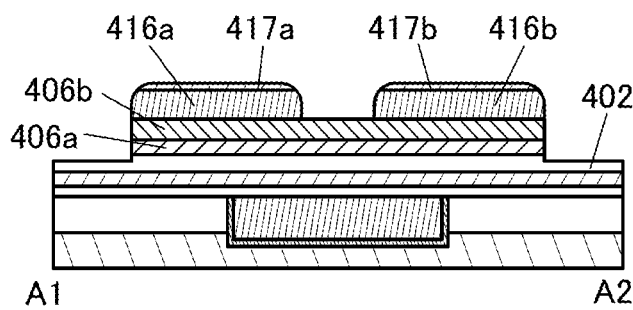
Figure 5F:
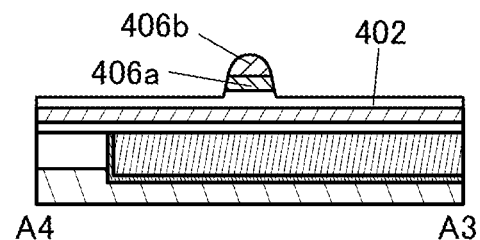

Next, an oxide film 406A to be the oxide 406a is formed over the insulator 402, and an oxide film 406B to be the oxide 406b is formed over the oxide film 406A (see FIGS. 5(C) and 5(D)).

The oxide film 406A and the oxide film 406B are preferably formed by a sputtering method. A rare gas (typically, argon), oxygen, or a mixed gas of a rare gas and oxygen is used as a sputtering gas, as appropriate. Here, when the oxide film 406A is formed by a sputtering method in an atmosphere containing oxygen, oxygen can be added to the insulator 304 even without the addition of oxygen described above. The sputtering gas may contain nitrogen. Furthermore, the film formation may be performed while the substrate is heated. The film formation by a sputtering method is suitable because the density of the oxide film 406A and the oxide film 406B can be increased.

Increasing the purity of a sputtering gas is preferred. For example, as an oxygen gas or an argon gas used as a sputtering gas, a gas that is highly purified to have a dew point of −40° C. or lower, preferably −80° C. or lower, more preferably −100° C. or lower, still more preferably −120° C. or lower is used, whereby entry of moisture or the like into the oxide film 406A and the oxide film 406B can be minimized.

A chamber of a sputtering apparatus is preferably evacuated to a high vacuum (to the degree of approximately $5 \times 10^{-7}$ Pa to $1 \times 10^{-4}$ Pa) with an adsorption vacuum pump such as a cryopump so that water and the like acting as impurities for the oxide film 406A and the oxide film 406B are removed as much as possible. Alternatively, a turbo molecular pump and a cold trap are preferably combined so as to prevent a backflow of a gas, especially a gas containing carbon or hydrogen from an exhaust system to the inside of the chamber.

As a power source of the sputtering apparatus, a DC power source, an AC power source, or an RF power source can be used.

In the sputtering apparatus, a target or a magnet may be rotated or moved. For example, the oxide films can be formed while a magnet unit is oscillated vertically and/or horizontally. For example, the target may be rotated or oscillated with a beat (also referred to as rhythm, pulse, frequency, period, cycle, or the like) of greater than or equal to 0.1 Hz and less than or equal to 1 kHz. Alternatively, the magnet unit may be oscillated with a beat of greater than or equal to 0.1 Hz and less than or equal to 1 kHz.

The substrate temperature in forming the oxide film 406A is preferably higher than or equal to room temperature and lower than or equal to 400° C. For example, the substrate temperature is selected as appropriate within the range to a temperature that is higher than or equal to the evaporation temperature of water (for example, 100° C.) and enables the maintainability and throughput of an apparatus.

In formation of the oxide film 406A, a rare gas (typically, argon), oxygen, or a mixed gas of a rare gas and oxygen is used as a sputtering gas as appropriate. In the case of a mixed gas, the proportion of an oxygen gas in the whole deposition gas is preferably 70% or higher, more preferably 80% or higher, still more preferably 100%. When an oxide containing excess oxygen is used for the oxide film 406A, oxygen can be supplied to the oxide film 406B by later heat treatment.

As the target for forming the oxide film 406A, the above-described In-M-Zn oxide target can be used. The atomic ratio of In to the element M in the In-M-Zn oxide target of the oxide film 406A is preferably lower than that in an In-M-Zn oxide target of the oxide film 406B. For example, a metal oxide target having an atomic ratio of [In]:[M]:[Zn]=1:3:4 or in the neighborhood thereof is preferably used.

In this embodiment, the oxide film 406A is formed in an atmosphere containing an oxygen gas at approximately 100% at a substrate temperature of 200° C. with an In—Ga—Zn oxide target having an atomic ratio of [In]:[Ga]:[Zn]=1:3:4.

The substrate temperature in forming the oxide film 406B is set to higher than or equal to room temperature and lower than or equal to 400° C., preferably higher than or equal to 100° C. and lower than 140° C. For example, the substrate temperature is selected as appropriate within the range to a temperature that is higher than or equal to the evaporation temperature of water (for example, 100° C.) and enables the maintainability and throughput of an apparatus.

In formation of the oxide film 406B, a rare gas (typically, argon), oxygen, or a mixed gas of a rare gas and oxygen is used as a sputtering gas as appropriate. In the case of a mixed gas, the proportion of an oxygen gas in the whole deposition gas is higher than or equal to 0% and lower than or equal to 30%, preferably higher than or equal to 5% and lower than or equal to 20%.

As the target for forming the oxide film 406B, the above In-M-Zn oxide target can be used. The atomic ratio of In to the element M in the In-M-Zn oxide target of the oxide film 406B is preferably higher than that in an In-M-Zn oxide target of the oxide film 406A. For example, a metal oxide target having anatomic ratio of [In]:[M]:[Zn]=4:2:4.1 or 5:1:7, or in the neighborhood thereof is preferably used.

Note that the atomic ratio of gallium in the metal elements contained in the deposition target of the oxide film 406B is preferably lower than that in the metal elements contained in the deposition target of the oxide 303.

In this embodiment, the oxide film 406B is formed using a mixed gas of a rare gas and oxygen, in which the proportion of the oxygen gas is approximately 10%, at a substrate temperature of 130° C. with an In—Ga—Zn oxide target having an atomic ratio of [In]:[Ga]:[Zn]=4:2:4.1.

Next, second heat treatment may be performed. The second heat treatment can be performed at higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for released oxygen. By the second heat treatment, the crystallinity of the oxide film 406B can be increased and impurities such as hydrogen or water can be removed, for example. In this embodiment, treatment is performed at a temperature of 400° C. in a nitrogen atmosphere for one hour, and successively another treatment is performed at a temperature of 400° C. in an oxygen atmosphere for one hour.

The second heat treatment can diffuse the added oxygen to the oxide 303, so that oxygen vacancies in the oxide 303 can be filled with the oxygen. This reduces the amount of oxygen vacancies in the oxide 303, and the amount of donor impurities having positive charge can be reduced. Thus, the fixed charge 54 is clearly observed between the oxide 303 and the insulator 302. In this manner, fixed charge can be stably held between the insulator 302 and the oxide 303 in the transistor 400a.

Next, a conductive film to be the conductors 416a and 416b is formed over the oxide film 406B. In this embodiment, a tantalum nitride film is formed by a sputtering method as the conductive film to be the conductors 416a and 416b. Tantalum nitride has high oxidation resistance and thus is preferable in the case of performing heat treatment in a later step.

Next, a film to be the barrier films 417a and 417b is formed over the conductive film to be the conductors 416a and 416b. In this embodiment, an aluminum oxide film is formed by an ALD method as the film to be the barrier films 417a and 417b. A dense film including reduced defects such as cracks or pinholes and having a small and uniform thickness can be formed by an ALD method.

Then, part of the conductive film to be the conductors 416a and 416b and part of the film to be the barrier films 417a and 417b are selectively removed by a photolithography method, so that these films are processed into island shapes. In this manner, island-like conductive films are formed from the conductive film to be the conductors 416a and 416b, and the barrier films 417a and 417b are formed from the film to be the barrier films 417a and 417b.

Then, part of the oxide film 406A and part of the oxide film 406B are selectively removed using the island-like conductive films as masks. At this time, part of the insulator 402 might be also removed. After that, the resist mask is removed, whereby the oxide 406a having an island shape and the oxide 406b having an island shape can be formed.

Note that the removal of the parts of the oxide film 406A and the oxide film 406B can be performed by a dry etching method, a wet etching method, or the like. Both the dry etching method and the wet etching method may be used.

Then, part of the island-like conductive film is selectively removed by a dry etching method using the barrier films 417a and 417b as masks. By the etching step, the island-like conductive film is divided into the conductor 416a and the conductor 416b (see FIGS. 5(E) and 5(F)).

As a gas used for the dry etching, for example, one of a $C_4F_6$ gas, a $C_2F_6$ gas, a $C_4F_5$ gas, a $CF_4$ gas, a $SF_6$ gas, a $CHF_3$ gas, and the like can be used alone or two or more of the gases can be mixed and used. Alternatively, an oxygen gas, a helium gas, an argon gas, a hydrogen gas, or the like can be added to any of the above gases as appropriate. In particular, a gas with which an organic substance can be generated by plasma is preferably used. For example, it is preferable to use a $C_4F_6$ gas, a $C_4F_5$ gas, or a $CHF_3$ gas to which a helium gas, an argon gas, a hydrogen gas, or the like is added as appropriate.

When the conductor 416a and the conductor 416b are formed by a dry etching method, impurity elements such as remaining components of an etching gas might be attached to an exposed part of the oxide 406b. For example, when a chlorine-based gas is used as an etching gas, chlorine and the like are attached in some cases. Furthermore, when a hydrocarbon-based gas is used as an etching gas, carbon, hydrogen, and the like are attached in some cases. The amount of the impurity elements attached to the exposed surface of the oxide 406b is preferably reduced. The amount of the impurity elements can be reduced by cleaning treatment using a solution in which hydrofluoric acid is diluted with pure water (diluted hydrofluoric acid), cleaning treatment using ozone or the like, cleaning treatment using ultra violet rays, or the like. Note that a plurality of types of cleaning treatment may be combined.

Plasma treatment using an oxidizing gas may be performed. For example, plasma treatment using a nitrous oxide gas is performed. By performing the plasma treatment, the concentration of fluorine in the oxide 406b can be lowered. Furthermore, an effect of removing an organic substance on the sample surface can be obtained.

Oxygen doping treatment may be performed on the exposed the oxide 406b. Furthermore, heat treatment that is described later may be performed.

Next, third heat treatment may be performed. The third heat treatment can be performed under conditions similar to those of the second heat treatment. By the third heat treatment, the crystallinity of the oxide 406b can be increased and impurities such as hydrogen or water can be removed, for example. In this embodiment, treatment is performed at 400° C. in a nitrogen atmosphere for 30 minutes, and successively another treatment is performed at 400° C. in an oxygen atmosphere for 30 minutes.

Next, an oxide film 406C to be the oxide 406c is formed over the insulator 402, the oxide 406a, the oxide 406b, the conductors 416a and 416b, and the barrier films 417a and 417b.

Like the oxide film 406A, the oxide film 406C is preferably formed by a sputtering method.

The substrate temperature in forming the oxide film 406C is preferably higher than or equal to room temperature and lower than 200° C. For example, the substrate temperature is room temperature during the deposition. The deposition is preferably performed while a substrate holder is cooled so that the substrate temperature does not exceed room temperature.

In formation of the oxide film 406C, a rare gas (typically, argon), oxygen, or a mixed gas of a rare gas and oxygen is used as a sputtering gas as appropriate. In the case of a mixed gas, the proportion of an oxygen gas in the whole deposition gas is preferably 70% or higher, more preferably 80% or higher, still more preferably 100%. When an oxide containing excess oxygen is used for the oxide film 406C, oxygen can be supplied to the oxide 406b by later heat treatment.

As the target for forming the oxide film 406C, the In-M-Zn oxide target can be used. Here, as the In-M-Zn oxide target for the oxide film 406C, the same target as the In-M-Zn oxide target for the oxide film 406B may be used. For example, a metal oxide target having an atomic ratio of [In]:[M]:[Zn]=4:2:4.1 or 5:1:7, or in the neighborhood thereof may be used. As the In-M-Zn oxide target for the oxide film 406C, a target having an atomic ratio of In to the element M lower than that in the In-M-Zn oxide target for the oxide film 406B may be used. For example, a metal oxide target having an atomic ratio of [In]:[M]:[Zn]=1:1:1 or in the neighborhood thereof may be used.

In this embodiment, the oxide film 406C is formed in an atmosphere containing an oxygen gas at approximately 100% at a substrate temperature of room temperature with the use of an In—Ga—Zn oxide target having an atomic ratio of [In]:[Ga]:[Zn]=4:2:4.1.

Next, an insulating film 412A is formed over the oxide film 406C. In this embodiment, a silicon oxynitride film is formed as the insulating film 412A by a CVD method.

Then, fourth heat treatment may be performed. The fourth heat treatment can be performed under conditions similar to those of the first heat treatment. By the fourth heat treatment, impurities such as hydrogen or water contained in the insulating film 412A can be removed, for example. In this embodiment, heat treatment is performed at 400° C. in a nitrogen gas atmosphere, as the fourth heat treatment.

Then, the first conductive layer of the conductor 404 and the second conductive layer of the conductor 404 are sequentially formed. In this embodiment, titanium nitride and tungsten are used for the first conductive layer of the conductor 404 and the second conductive layer of the conductor 404, respectively.

Next, fifth heat treatment may be performed. The fifth heat treatment can be performed under conditions similar to those of the first heat treatment.

Figure 5G:
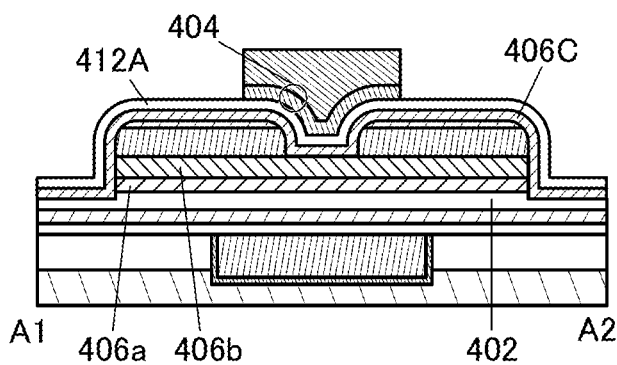
Figure 5H:
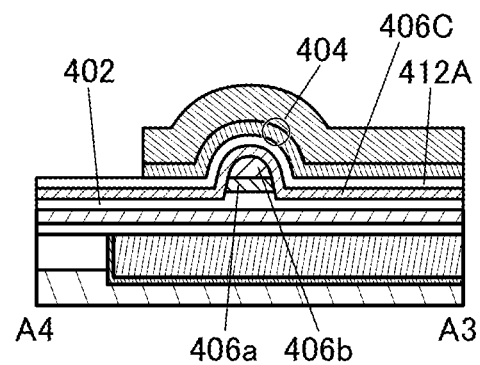

Next, part of the first conductive layer of the conductor 404 and part of the second conductive layer of the conductor 404 are selectively removed by a photolithography method, so that the conductor 404 including the first conductive layer of the conductor 404 and the second conductive layer of the conductor 404 and functioning as a gate is formed (see FIGS. 5(G) and 5(H).

Next, a film to be the insulator 418 in a later step is formed over the insulating film 412A and the conductor 404. The film to be the insulator 418 functions as a gate cap, and in this embodiment, aluminum oxide deposited by an ALD method is used.

Figure 6A:
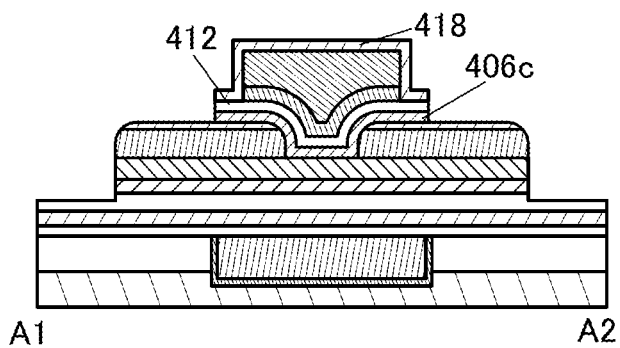
FIGS. 6A to 6F Cross-sectional views illustrating a method for manufacturing a semiconductor device of one embodiment of the present invention.
Figure 6B:
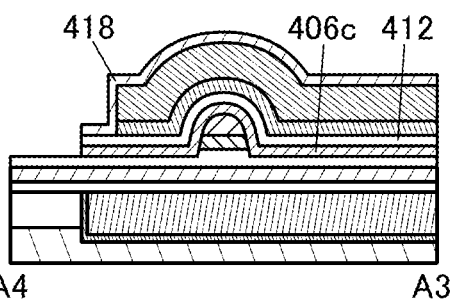

Then, part of the film to be the insulator 418, part of the insulating film 412A, and part of the oxide film 406C are selectively removed by a photolithography method, so that the insulator 418, the insulator 412, and the oxide 406c are formed (see FIGS. 6(A) and 6(B)). By forming the insulator 418 to cover the conductor 404 here, surrounding excess oxygen can be prevented from being used for oxidation of the conductor 404. Although the insulator 418, the insulator 412, and the oxide 406c are formed so as to overlap with each other in the transistor illustrated in FIGS. 6(A) and 6(B) in a top view, this is not necessarily employed. For example, the oxide 406c may be formed in contact with the surroundings of the oxide 406a and the oxide 406b and the top surface of the insulator 402.

Then, the insulator 410 is deposited over the insulator 418 and the like. The insulator 410 can be deposited by a sputtering method, a CVD method, an MBE method, a PLD method, an ALD method, or the like. Alternatively, the insulator 410 can be deposited by a spin coating method, a dipping method, a droplet discharging method (such as an ink-jet method), a printing method (such as screen printing or offset printing), a doctor knife method, a roll coater method, a curtain coater method, or the like.

It is preferable that a CVD method be employed for the deposition of the insulator 410. It is further preferable that the insulator 410 be deposited by a PECVD method.

The insulator 410 may be formed to have a flat top surface. For example, the top surface of the insulator 410 may have flatness immediately after the deposition. Alternatively, for example, the insulator 410 may have flatness by removing the insulator and the like from the top surface after the deposition such that the top surface becomes parallel to a reference surface such as a rear surface of the substrate. Such treatment is referred to as planarization treatment. Examples of the planarization treatment include CMP treatment and dry etching treatment. However, the top surface of the insulator 410 is not necessarily flat.

Next, the insulator 420 is deposited over the insulator 410 by a sputtering method.

The insulator 420 is preferably deposited in an atmosphere containing oxygen by a sputtering method. In this embodiment, as the insulator 420, an aluminum oxide film is deposited in an atmosphere containing oxygen by a sputtering method. Accordingly, oxygen can be added to the insulator 410 that is in contact with the insulator 420. Although oxygen is added as an oxygen radical here, for example, the state of the oxygen at the time of being added is not limited thereto. Oxygen in the state of an oxygen atom, an oxygen ion, or the like may be added. Heat treatment in a later step or the like can diffuse oxygen so that oxygen can be supplied to the oxide 406b effectively.

The insulator 420 is preferably deposited while the substrate is heated. The substrate is preferably heated to higher than 100° C. and lower than or equal to 300° C. By making the substrate temperature higher than 100° C., water in the oxide 406b can be removed. Furthermore, water can be prevented from adsorbing on the surface of the formed film. Moreover, by depositing the insulator 420 while the substrate is heated in this manner, oxygen can be diffused to the oxide 406b during the deposition.

The insulator 420 may be a stacked-layer film, and aluminum oxide is further deposited by an ALD method, for example.

Next, sixth heat treatment may be performed. The sixth heat treatment can be performed under conditions similar to those of the second heat treatment. By the sixth heat treatment, oxygen added in depositing the insulator 420 by sputtering can be diffused. Thus, the oxygen vacancies in the oxide 406a, the oxide 406b, and the oxide 406c can be reduced. Here, the insulators 420 and 401 can prevent oxygen from being diffused over and under the transistor, and thus oxygen can be supplied to the oxide 406b effectively. By the sixth heat treatment, impurities such as hydrogen or water contained in the insulator 410 can be removed, for example. In this embodiment, treatment is performed at 400° C. in a nitrogen atmosphere for one hour, and successively another treatment is performed at 400° C. in an oxygen atmosphere for one hour.

Figure 6C:
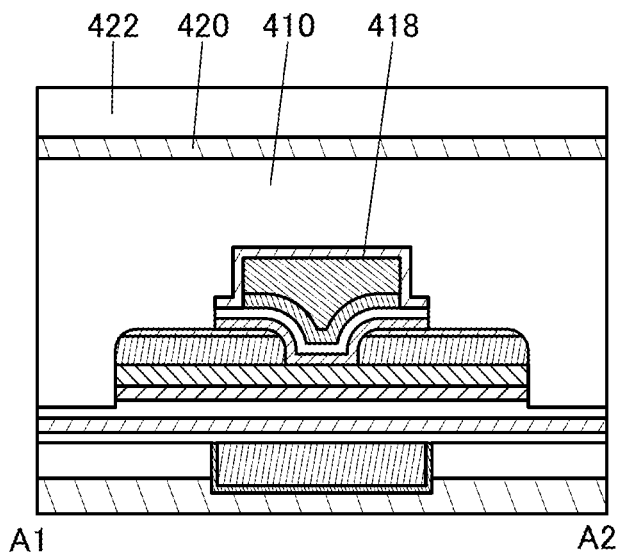
Figure 6D:
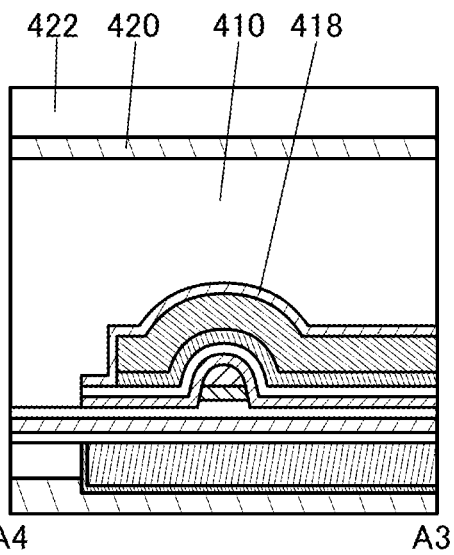

Next, the insulator 422 is deposited over the insulator 420 (see FIGS. 6(C) and 6(D)). As the insulator 422, an insulator similar to the insulator 410 can be provided.

Then, openings reaching the conductor 416a and the conductor 416b are formed in the insulator 422, the insulator 420, the insulator 410, the barrier film 417a, and the barrier film 417b. The openings are preferably formed by dry etching.

Next, a conductive film to be the conductor 438a and the conductor 438b is formed to fill the above openings. In this embodiment, as the conductive film to be the conductor 438a and the conductor 438b, a stacked-layer film of titanium nitride deposited by an ALD method and tungsten deposited by a CVD method is used.

Figure 6E:
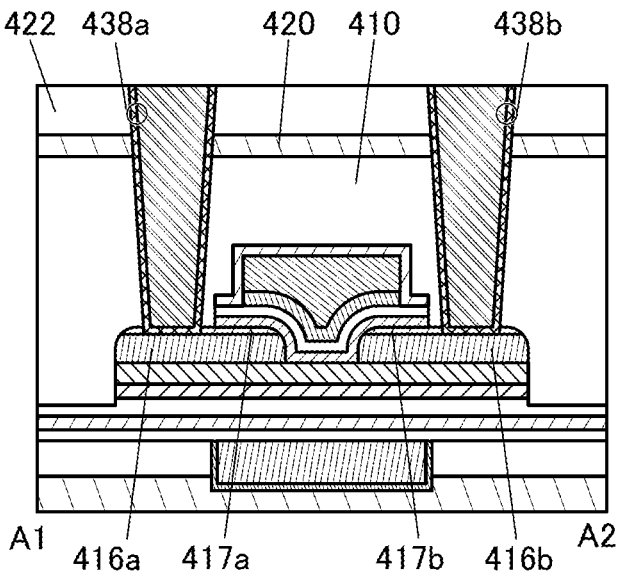
Figure 6F:
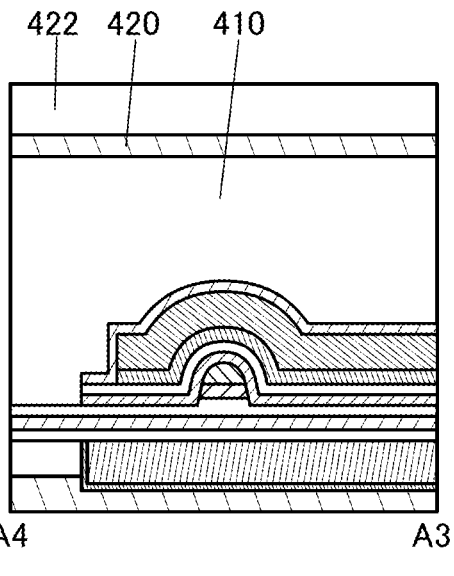

Next, CMP treatment is performed to remove the conductive film to be the conductor 438a and the conductor 438b that is above the insulator 422 (see FIGS. 6(E) and 6(F)). Consequently, the conductors 438a and 438b remain only in the openings, whereby the conductor 438a and the conductor 438b with flat top surfaces can be formed.

Through the above process, the transistor 400a illustrated in FIG. 4 can be manufactured (see FIGS. 6(E) and 6(F)).

<Modification Example of Semiconductor Device>

The transistor described in this embodiment is not limited to that illustrated in FIG. 4. A modification example of the transistor described in this embodiment will be described below with reference to FIG. 7 to FIG. 9. In FIG. 7 to FIG. 9, (A) is a top view of the transistor of one embodiment of the present invention as in FIG. 4. In addition, (B) is a cross-sectional view of a portion indicated by the dashed-dotted line A1-A2 in (A). In addition, (C) is a cross-sectional view of a portion indicated by the dashed-dotted line A3-A4 in (A). For clarity of the drawing, some components are not illustrated in the top view of (A). For the components denoted by the same reference numerals as those of the transistor 400a in the following, the corresponding description of the transistor 400a can be referred to.

Figure 7A:
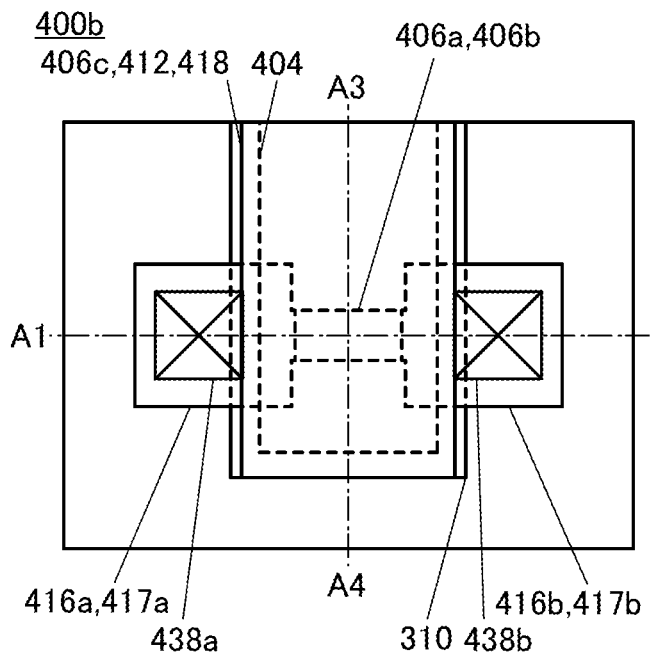
FIGS. 7A to 7C Top and cross-sectional views of a semiconductor device of one embodiment of the present invention.
Figure 7C:
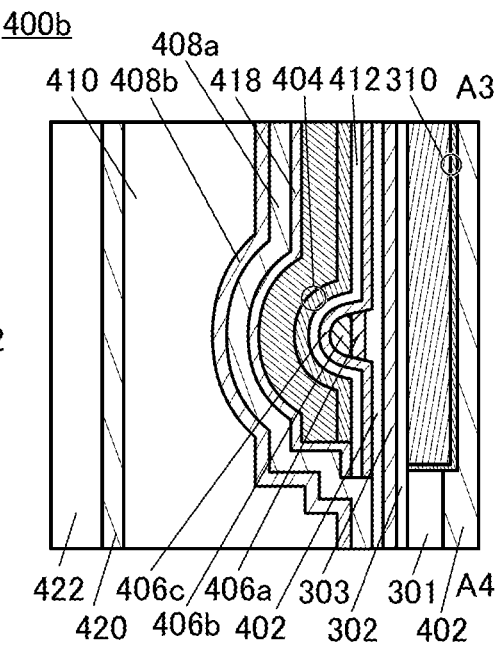
Figure 7B:
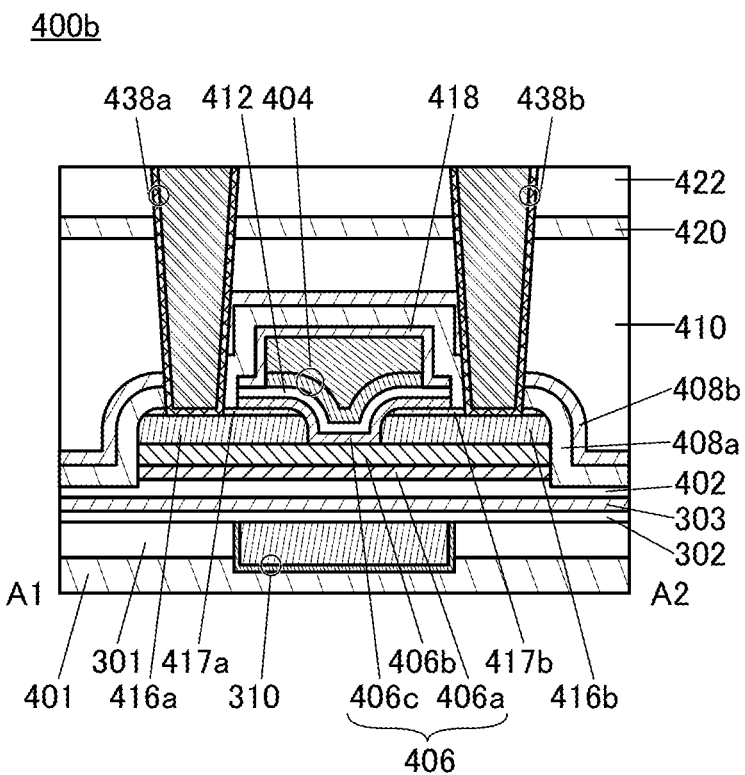

A transistor 400b illustrated in FIGS. 7(A), 7(B), and 7(C) is different from the transistor 400a in that an insulator 408a and an insulator 408b are positioned over the insulator 402, the barrier film 417a, the barrier film 417b, the conductor 404, and the like.

The insulator 408a is provided so as to cover the oxide 406a, the oxide 406b, and the oxide 406c, the conductors 416a and 416b, the barrier films 417a and 417b, the insulator 412, the conductor 404, and the insulator 418. Part of the insulator 408a is preferably in contact with the top surface of the insulator 402. For example, part of the insulator 408a is preferably in contact with the top surface of the insulator 402 in a region outside a region of the insulator 402 overlapping with the oxide 406a. In addition, the insulator 408b is provided over the insulator 408a. Like the insulator 420 and the like, each of the insulator 408a and the insulator 408b can function as a barrier insulating film for preventing impurities such as water or hydrogen from entering the transistor and the like from an upper layer.

Here, as the insulator 408a, an oxide insulator formed by a sputtering method is preferably used, and for example, aluminum oxide is preferably used. With the insulator 408a, oxygen can be added to the insulator 408a through a surface of the insulator 402 that is in contact with the insulator 408a, so that the insulator 408a can be in an oxygen excess state. Accordingly, oxygen can be effectively supplied to the oxide 406a, the oxide 406b, and the oxide 406c. Furthermore, when oxygen is supplied to the oxide 303 through the insulator 402, the amount of oxygen vacancies in the oxide 303 can be reduced, and fixed charge formed between the oxide 303 and the insulator 302 can be held.

Furthermore, when an insulating material through which oxygen is less likely to pass, such as aluminum oxide, is used for the insulator 408a, oxygen added to the insulator 402 can be inhibited from being diffused upward during the deposition. Accordingly, oxygen can be added to the insulator 402 efficiently.

Moreover, for the insulator 408b, an oxide insulator deposited by an ALD method is preferably used, and for example, aluminum oxide is preferably used. The insulator 408b deposited by an ALD method has good coverage, and is a film in which formation of cracks, pinholes, or the like are suppressed. Although the insulator 408a and the insulator 408b are provided over a shape having unevenness, the use of the insulator 408b deposited by an ALD method enables the transistor to be covered with the insulator 408b without formation of breaks, cracks, pinholes, or the like. Thus, even when a break or the like occurs in the insulator 408a, it can be covered with the insulator 408b; therefore, the barrier property against impurities such as hydrogen and water of a stacked-layer film of the insulator 408a and the insulator 408b can be improved noticeably.

As described above, the transistor is positioned between the insulator 401 and the insulator 408a and the insulator 408b; thus, outward diffusion of oxygen can be prevented, and a large amount of oxygen can be contained in the insulator 402 and the oxide 406a, the oxide 406b, and the oxide 406c. Furthermore, impurities such as hydrogen or water can be prevented from entering from above the insulator 408b and below the insulator 401, and thus the concentration of impurities in the insulator 402 and the oxide 406a, the oxide 406b, and the oxide 406c can be lowered.

Note that in the case where the insulator 408a and the insulator 408b are provided, a structure without the insulator 420 and the insulator 422 may be employed.

Figure 8A:
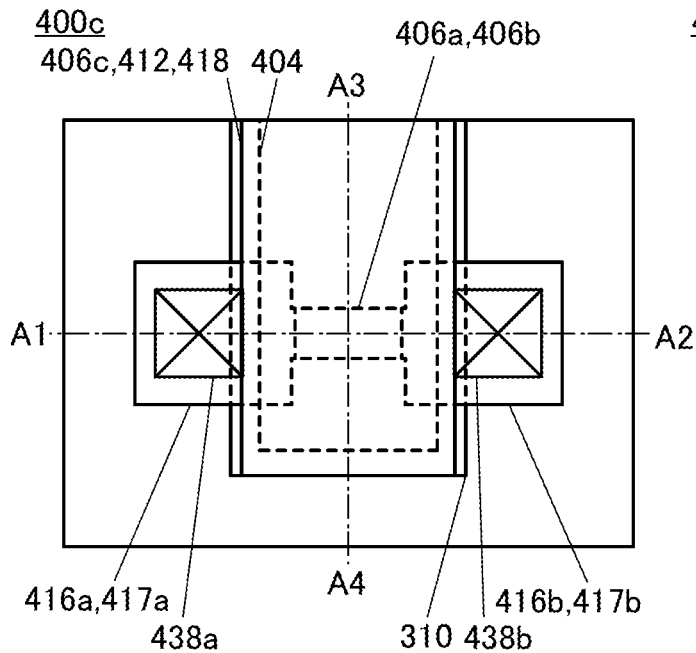
FIGS. 8A to 8C Top and cross-sectional views of a semiconductor device of one embodiment of the present invention.
Figure 8C:
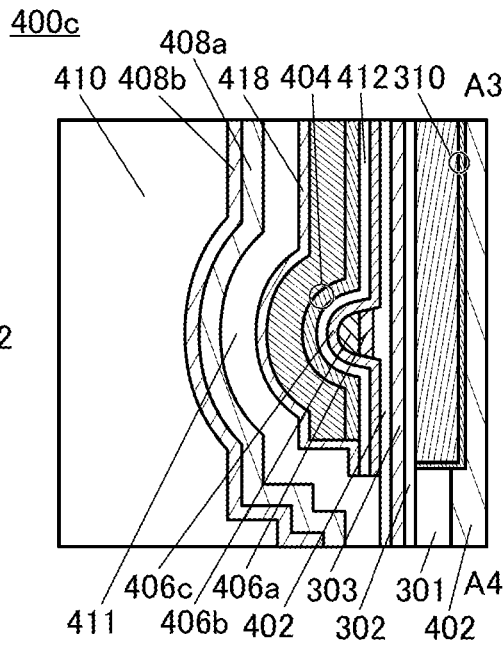
Figure 8B:
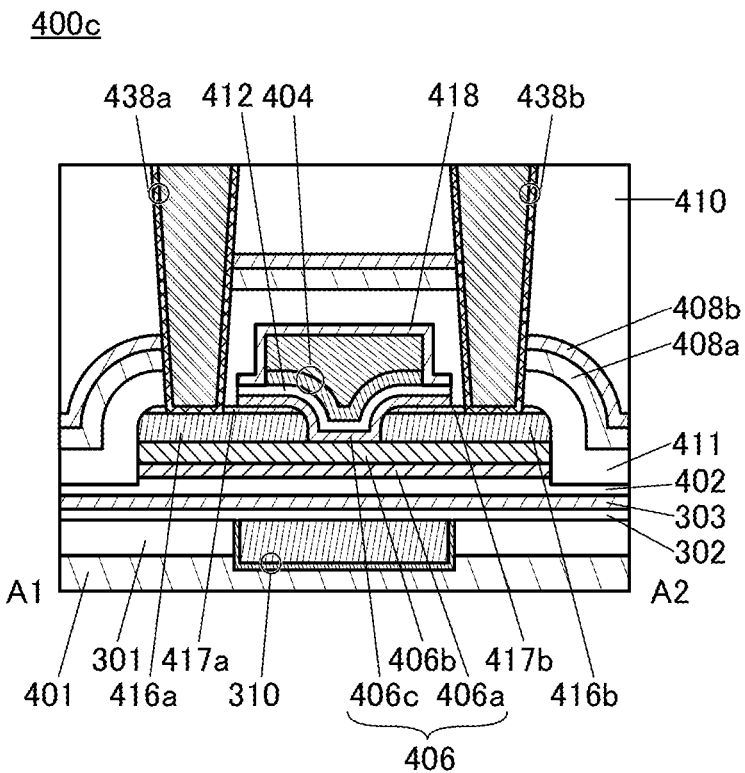

A transistor 400c illustrated in FIGS. 8(A), 8(B), and 8(C) is different from the transistor 400b in that an insulator 411 is provided between the insulator 408a and the insulator 402, the oxide 406, the conductors 416a and 416b, the barrier films 417a and 417b, the insulator 412, and the conductor 404.

In the insulator 411, a region overlapping with the insulator 402, a region overlapping with the barrier films 417a and 417b, and a region overlapping with the insulator 418 preferably have substantially the same thickness. Such thicknesses enable a reduction in the amount of oxygen in the insulator 411 that is extracted by the conductor 438a and the conductor 438b. Thus, oxygen added to the insulator 411 by the deposition of the insulator 408a can be supplied to the oxide 406 and the insulator 402.

Although the transistor 400c has a structure without the insulator 420 and the insulator 422 unlike the transistor 400b, the insulator 420 and the insulator 422 may be provided as in the transistor 400b.

Next, a transistor 400d illustrated in FIGS. 9(A), 9(B), and 9(C) will be described. The transistor 400d includes the insulator 401 and the insulator 301 positioned over a substrate (not illustrated); the conductor 310 positioned so as to be embedded in the insulator 401 and the insulator 301; the insulator 302 positioned over the insulator 301 and the conductor 310; the oxide 303 positioned over the insulator 302; the insulator 402 positioned over the oxide 303; the oxide 406a positioned over the insulator 402; the oxide 406b positioned in contact with at least part of the top surface of the oxide 406a; the oxide 406c positioned over the oxide 406b; the insulator 412 positioned over the oxide 406c; the conductor 404 positioned over the insulator 412; the insulator 418 positioned over the conductor 404; an insulator 421 positioned over the insulator 418; an insulator 419 positioned in contact with side surfaces of the insulator 412, the conductor 404, and the insulator 418; and an insulator 428 provided so as to cover the insulator 402, the oxide 406, the insulator 419, and the insulator 421. Furthermore, the insulator 410 is provided over the insulator 428, the insulator 420 is provided over the insulator 410, and the insulator 422 is provided over the insulator 420.

The transistor 400d is different from the transistor 400a in that, for example, the conductor 416a and the conductor 416b are not included, the conductor 438a and the conductor 438b are in contact with the oxide 406b, the insulator 419 and the insulator 421 are included, and the insulator 428 is included.

As in the transistor 400a, the oxide 406b includes first to third regions. The third region is sandwiched between the first region and the second region. The first region and the second region are formed in at least regions of the oxide 406b that overlap with the insulator 428. The first region of the oxide 406b can function as one of a source region and a drain region, and the second region of the oxide 406*b* can function as the other of the source region and the drain region. The third region of the oxide 406*b* can function as a channel formation region. Here, as the insulator 428, an insulator similar to that of the insulator 408*a* can be used.

The first region and the second region have a low oxygen concentration and reduced resistance. The third region functioning as a channel formation region is a high-resistance region having a higher oxygen concentration and a lower carrier density than the first region or the second region functioning as a source region or a drain region.

The concentration of at least one of a metal element and impurity elements such as hydrogen and nitrogen in the first region and the second region is preferably higher than that in the third region.

The first region and the second region preferably contains, for example, one or more of metal elements selected from aluminum, ruthenium, titanium, tantalum, tungsten, chromium, and the like, in addition to the oxide 406.

In order to form the first region and the second region, a film containing a metal element is provided in contact with the first region and the second region of the oxide 406, for example. The film containing a metal element is removed by etching treatment or the like after the formation of the first region and the second region. Note that as the film containing a metal element, a metal film, an oxide film containing a metal element, or a nitride film containing a metal element can be used. In that case, a compound layer is preferably formed between the film containing a metal element and the oxide 406. For example, the compound layer is formed on the top surface and the side surface of the oxide 406 in some cases. The compound layer is a layer containing a metal compound that contains a component of the film containing a metal element and a component of the oxide 406. For example, as the compound layer, a layer where the metal element of the oxide 406 and the metal element that is added are alloyed may be formed.

In addition, it is preferable that the positions of side surfaces of the insulator 418 be substantially aligned with the positions of side surfaces of the conductor 404, the insulator 412, the oxide 406*c* when the substrate is perpendicularly seen from above. The insulator 421 is formed in contact with the top surface of the insulator 418. The insulator 419 is provided in contact with side surfaces of the insulator 421, the insulator 418, the conductor 404, the insulator 412, and the oxide 406*c*. For the insulator 419 and the insulator 421, an insulating material that can be used for the insulator 410 can be used.

The insulator 419 is preferably formed by forming an insulating film and then performing anisotropic etching such that a portion of the insulating film that is in contact with the side surfaces of the insulator 421, the insulator 418, the conductor 404, the insulator 412, and the oxide 406*c* is left.

According to one embodiment of the present invention, a semiconductor device with a high threshold voltage can be provided in the aforementioned manner. According to another embodiment of the present invention, a semiconductor device having normally-off electrical characteristics can be provided. According to another embodiment of the present invention, a semiconductor device that operates at a voltage with a small absolute value can be provided. According to another embodiment of the present invention, a semiconductor device having favorable electrical characteristics can be provided.

The structure, method, and the like described above in this embodiment can be used in combination with the structures, methods, and the like described in the other embodiments, as appropriate.

Embodiment 3

In this embodiment, with reference to FIG. 10 to FIG. 12, a NOSRAM will be described as an example of a memory device, which is one embodiment of the present invention, using a transistor in which an oxide is used for a semiconductor (hereinafter referred to as an OS transistor) and a capacitor. A NOSRAM (registered trademark) is an abbreviation of "Nonvolatile Oxide Semiconductor RAM", which indicates a RAM including a gain cell (2T or 3T) memory cell. Note that hereinafter, a memory device using an OS transistor, such as a NOSRAM, is referred to as an OS memory in some cases.

A memory device in which OS transistors are used in memory cells (hereinafter referred to as an "OS memory") is used in a NOSRAM. The OS memory is a memory including at least a capacitor and an OS transistor that controls charge and discharge of the capacitor. Since the OS transistor is a transistor with an extremely low off-state current, the OS memory has excellent retention characteristics and thus can function as a nonvolatile memory.

<<NOSRAM>>

Figure 10:
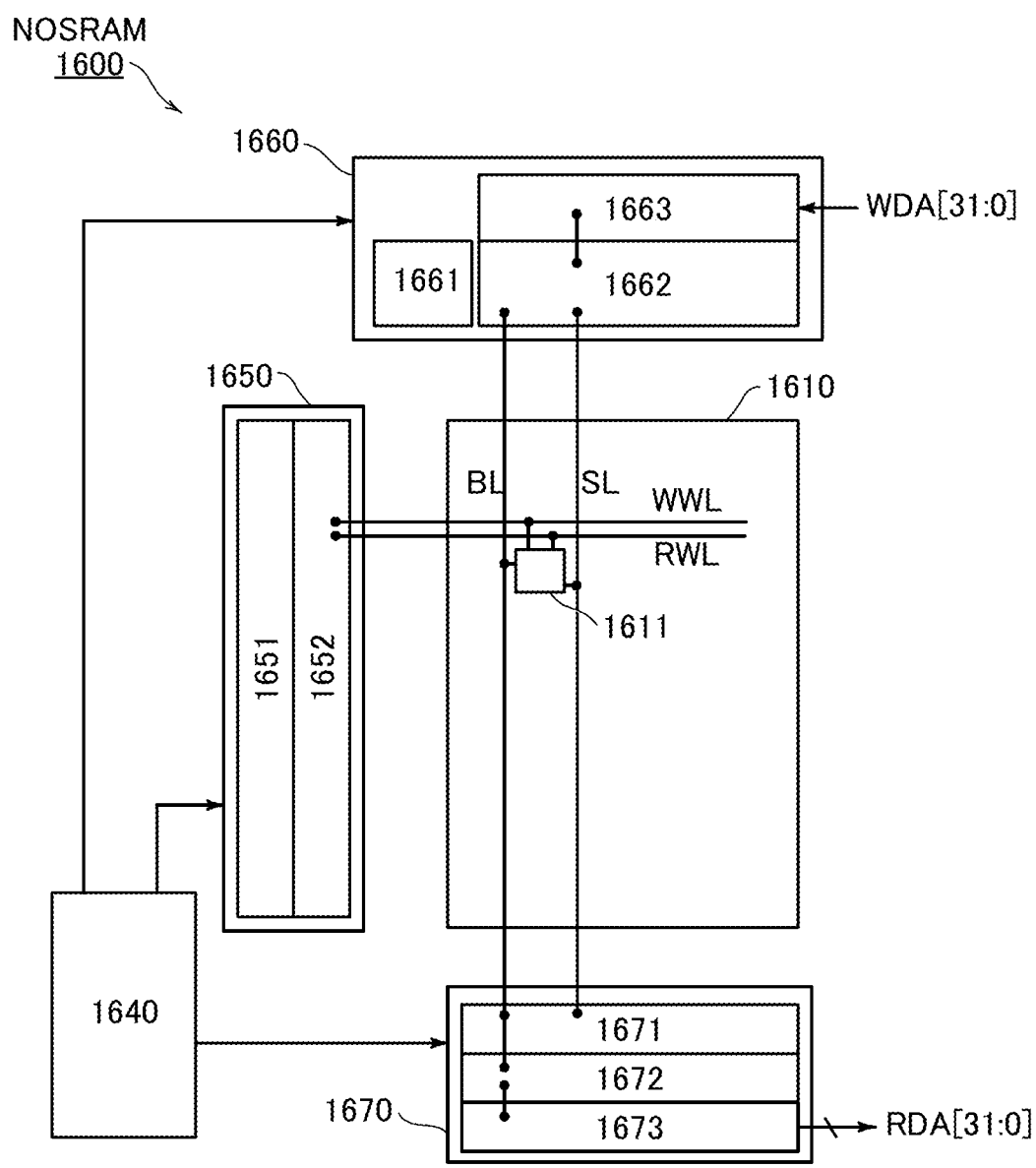
FIG. 10 A block diagram illustrating a configuration example of a memory device of one embodiment of the present invention.

FIG. 10 illustrates a configuration example of a NOSRAM. A NOSRAM 1600 illustrated in FIG. 10 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL and RWL, bit lines BL, and source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole, and writes data WDA[31:0] and reads out data RDA[31:0]. The controller 1640 processes command signals from the outside (for example, a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:0] into an analog voltage per 3 bits.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the voltage of the selected source line SL to the ADC 1672. The ADC 1672 has a function of converting an analog voltage into 3-bit digital data. The voltage of the source line SL is converted into 3-bit data in the ADC 1672, and the output buffer 1673 retains the data output from the ADC 1672.

Note that the configuration of the row driver 1650, the column driver 1660, and the output driver 1670 described in this embodiment is not limited to the above. The arrangement of the drivers and wirings connected to the drivers may be changed or the functions of the drivers and the wirings connected to the drivers may be changed or added, depending on the configuration, the driving method, or the like of the memory cell array 1610. For example, the bit lines BL may have part of a function of the source lines SL.

Note that although the amount of data retained in each of the memory cells 1611 is 3 bits in the above description, the structure of the memory device described in this embodiment is not limited thereto. The amount of data retained in each of the memory cells 1611 may be 2 bits or less or 4 bits or more. In the case where the amount of data retained in each of the memory cells 1611 is one bit, for example, a structure may be employed in which the DAC 1663 and the ADC 1672 are not provided.

<Memory Cell>

Figure 11A:
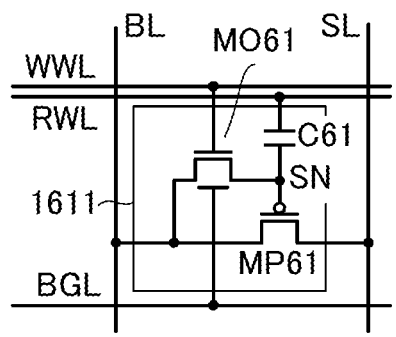
FIGS. 11A to 11E Circuit diagrams each illustrating a configuration example of a memory device of one embodiment of the present invention.

FIG. 11(A) is a circuit diagram showing a configuration example of the memory cell 1611. The memory cell 1611 is a 2T gain cell and the memory cell 1611 is electrically connected to the word lines WWL and RWL, the bit line BL, the source line SL, and a wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the voltage of the node SN. The node SN is a data storage node and corresponds to a gate of the transistor MP61 here.

The write transistor of the memory cell 1611 is formed using the OS transistor MO61; thus, the NOSRAM 1600 can retain data for a long time.

Figure 11B:
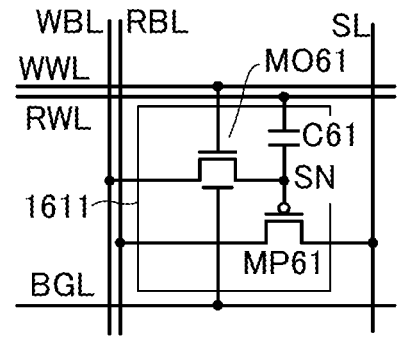

In the example of FIG. 11(A), write and read bit lines are a common bit line; however, as illustrated in FIG. 11(B), a bit line WBL functioning as a write bit line and a bit line RBL functioning as a read bit line may be provided.

Figure 11C:
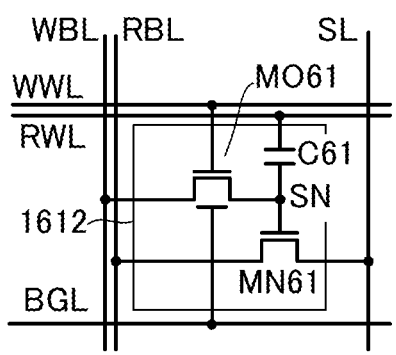
Figure 11D:
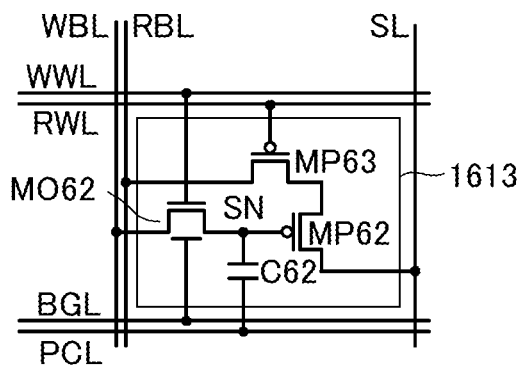
Figure 11E:
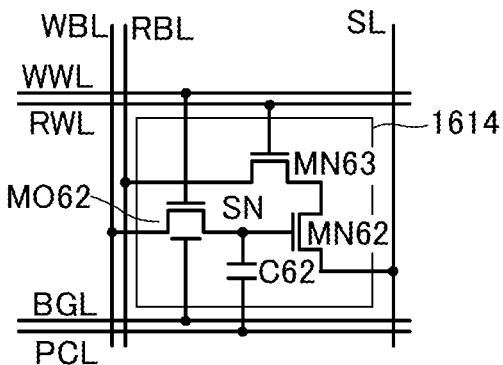

FIG. 11(C) to FIG. 11(E) show other configuration examples of the memory cell. FIG. 11(C) to FIG. 11(E) show examples where the write bit line WBL and the read bit line RBL are provided; however, as in FIG. 11(A), a bit line shared in writing and reading may be provided.

A memory cell 1612 illustrated in FIG. 11(C) is a modification example of the memory cell 1611 where the read transistor is changed into an n-channel transistor (MN61). The transistor MN61 may be an OS transistor or a Si transistor.

In the memory cells 1611 and 1612, the OS transistor MO61 may be an OS transistor with no back gate.

A memory cell 1613 illustrated in FIG. 11(D) is a 3T gain cell and is electrically connected to the word lines WWL and RWL, the bit lines WBL and RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 illustrated in FIG. 11(E) is a modification example of the memory cell 1613 where the read transistor and the selection transistor are changed into n-channel transistors (MN62 and MN63). The transistors MN62 and MN63 may be OS transistors or Si transistors.

The OS transistors provided in the memory cells 1611 to 1614 may each be a transistor with no back gate or a transistor with a back gate.

What is called a NOR memory device in which the memory cells 1611 or the like are connected in parallel is described above, but the memory device described in this embodiment is not limited thereto. For example, what is called a NAND memory device in which memory cells 1615 described below are connected in series may be provided.

Figure 12:
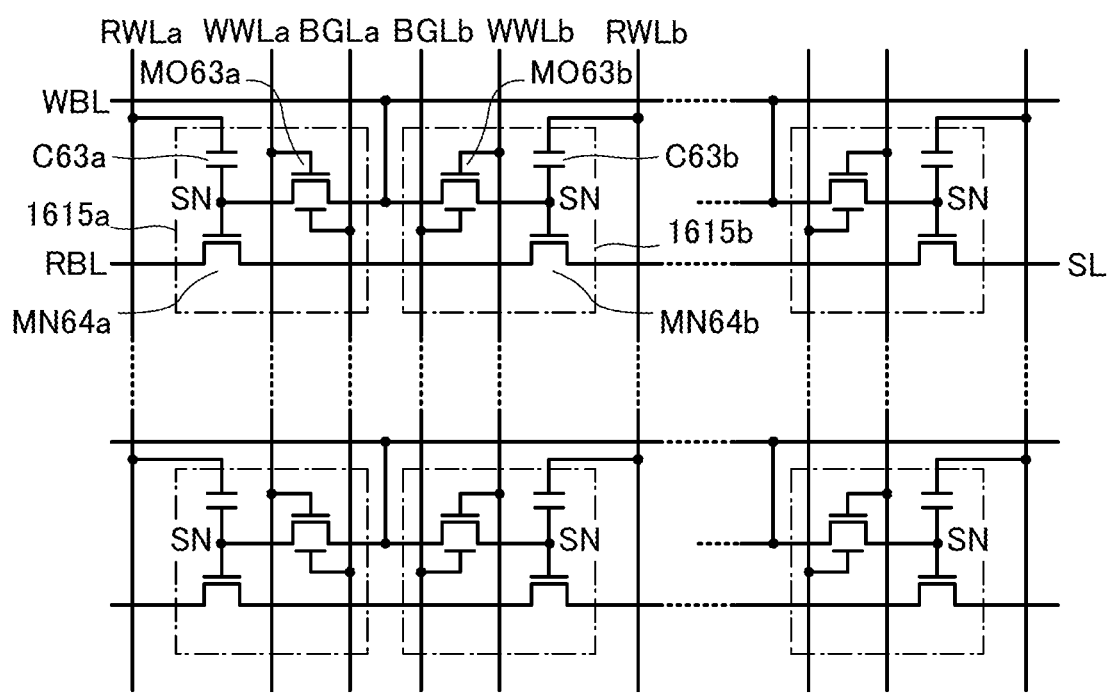
FIG. 12 A circuit diagram illustrating a configuration example of a memory device of one embodiment of the present invention.

FIG. 12 is a circuit diagram showing a configuration example of the NAND memory cell array 1610. The memory cell array 1610 illustrated in FIG. 12 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is composed of an n-channel Si transistor, for example. The transistor MN64 is not limited thereto and may be a p-channel Si transistor or an OS transistor.

A memory cell 1615a and a memory cell 1615b, which are illustrated in FIG. 12, will be described below as examples. Here, the character "a" or "b" is added to the reference numerals of the wirings and circuit elements connected to the memory cell 1615a or the memory cell 1615b.

In the memory cell 1615a, a gate of a transistor MN64a, one of a source and a drain of an OS transistor MO63a, and one electrode of a capacitor C63a are electrically connected to each other. The bit line WBL and the other of the source and the drain of the OS transistor MO63a are electrically connected to each other. A word line WWLa and a gate of the OS transistor MO63a are electrically connected to each other. A wiring BGLa and a back gate of the OS transistor MO63a are electrically connected to each other. A word line RWLa and the other electrode of the capacitor C63a are electrically connected to each other.

The memory cell 1615b can be provided to be symmetric to the memory cell 1615a with the use of a contact portion with the bit line WBL as a symmetry axis. Therefore, circuit elements included in the memory cell 1615b are connected to wirings as in the memory cell 1615a.

A source of the transistor MN64a included in the memory cell 1615a is electrically connected to a drain of a transistor MN64b of the memory cell 1615b. A drain of the transistor MN64a included in the memory cell 1615a is electrically connected to the bit line RBL. A source of the transistor MN64b included in the memory cell 1615b is electrically connected to the source line SL through the transistors MN64 included in the plurality of memory cells 1615. As described here, the plurality of transistors MN64 are connected in series between the bit line RBL and the source line SL in the NAND memory cell array 1610.

In a memory device including the memory cell array 1610 illustrated in FIG. 12, writing operation and reading operation are performed for a plurality of memory cells (hereinafter referred to as a memory cell column) connected to the same word line WWL (or word line RWL). For example, the writing operation can be performed as follows. A potential at which the OS transistor MO63 is brought into an on state is supplied to the word line WWL connected to a memory cell column on which writing is performed so that the OS transistors MO63 in the memory cell column on which writing is performed are brought into an on state. Accordingly, the potential of the bit line WBL is supplied to the gates of the transistors MN64 and ones of electrodes of the capacitors C63 in the specified memory cell column, whereby predetermined charge is supplied to the gates. After that, turning off the OS transistors MO63 in the memory cell column allows the predetermined charge to be retained in the gates. Thus, data can be written to the memory cells 1615 in the specified memory cell column.

For example, the reading operation can be performed as follows. First, a potential at which the transistor MN64 is brought into an on state is supplied to the word lines RWL not connected to a memory cell column on which reading is to be performed regardless of charge supplied to the gates of the transistors MN64, so that the transistors MN64 in memory cell columns other than the memory cell column on which reading is to be performed are brought into an on state. Then, a potential (reading potential) at which an on state or an off state of the transistor MN64 is selected is supplied to the word line RWL connected to the memory cell column on which reading is to be performed in accordance with charge of the gates of the transistors MN64. After that, a constant potential is supplied to the source line SL and a reading circuit connected to the bit line RBL is brought into an operation state. Here, the plurality of transistors MN64 between the source line SL and the bit line RBL are in an on state except for the transistor MN64 in the memory cell column on which reading is to be performed; therefore, the conductance between the source line SL and the bit line RBL depends on the state (an on state or an off state) of the transistor MN64 in the memory cell column on which reading is to be performed. Since the conductance of the transistor varies depending on the charge of the gate of the transistor MN64 in the memory cell column on which reading is to be performed, the potential of the bit line RBL varies accordingly. By reading the potential of the bit line RBL with the reading circuit, data can be read from the memory cell 1615 in the specified memory cell column.

There is no limitation on the number of times of rewriting of the NOSRAM 1600 in principle because data is rewritten by charging and discharging the capacitor C61, the capacitor C62, or the capacitor C63; and writing and reading of data can be performed with low energy. Furthermore, since data can be retained for a long time, the refresh rate can be reduced.

In the case where the semiconductor device described in the above embodiment is used for the memory cells 1611, 1612, 1613, 1614, and 1615, the transistor 400a and the like can be used as the OS transistors MO61, MO62, and MO63. Thus, the area occupied by one set consisting of a transistor and a capacitor in the top view can be reduced, so that the memory device of this embodiment can be further highly integrated. As a result, storage capacity per unit area of the memory device of this embodiment can be increased.

The structure described in this embodiment can be used in combination with the structures described in the other embodiments, as appropriate.

Embodiment 4

In this embodiment, a DOSRAM will be described as an example of the memory device of one embodiment of the present invention that uses an OS transistor and a capacitor, with reference to FIG. 13 and FIG. 14. A DOSRAM (registered trademark) is an abbreviation of "Dynamic Oxide Semiconductor RAM," which refers to a RAM including a 1T (transistor) 1C (capacitor) memory cell. As in the NOSRAM, an OS memory is used in the DOSRAM.

<<DOSRAM 1400>>

Figure 13:
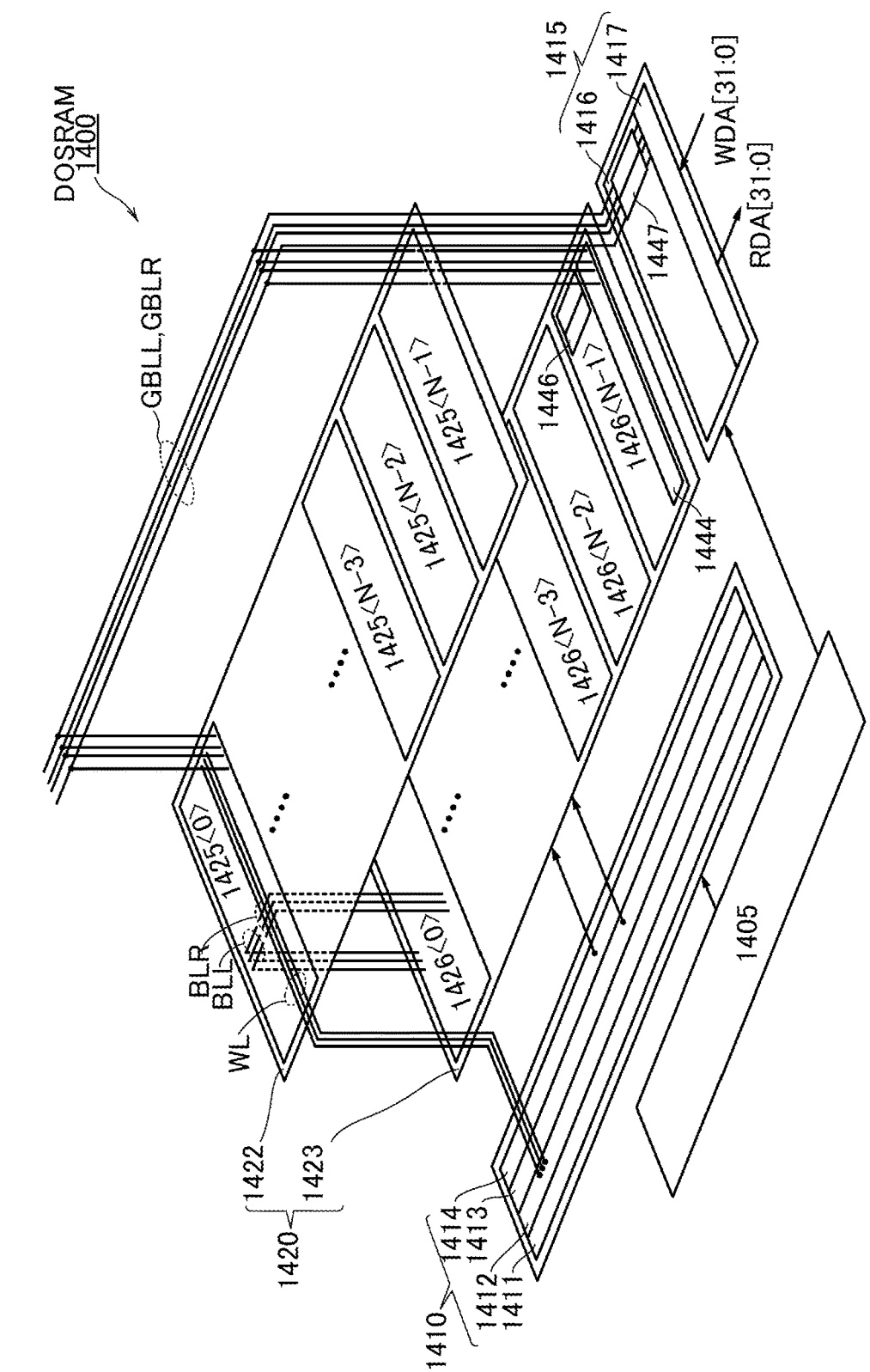
FIG. 13 A block diagram illustrating a configuration example of a memory device of one embodiment of the present invention.

FIG. 13 illustrates a configuration example of the DOSRAM. As illustrated in FIG. 13, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts, as the bit-line structure, a hierarchical bit line structure hierarchized with local bit lines and global bit lines.

Figure 14A:
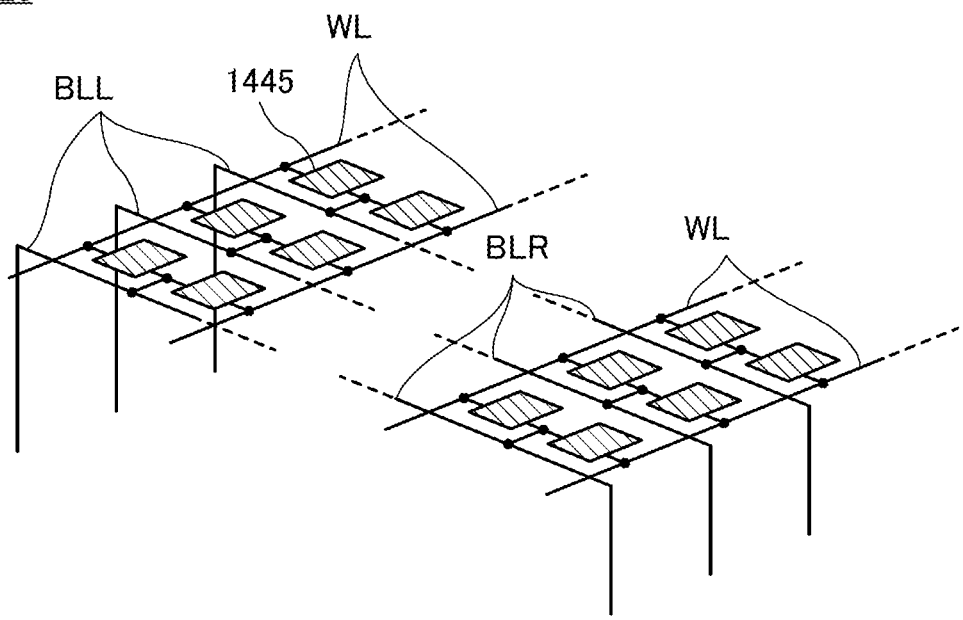
FIGS. 14A and 14B A block diagram and a circuit diagram illustrating a configuration example of a memory device of one embodiment of the present invention.

The memory cell array 1422 includes N local memory cell arrays 1425<0> to 1425<N−1> (N is an integer greater than or equal to 2). FIG. 14(A) illustrates a configuration example of the local memory cell array 1425. The local memory cell array 1425 includes a plurality of memory cells 1445, a plurality of word lines WL, and a plurality of bit lines BLL and BLR. In the example in FIG. 14(A), the local memory cell array 1425 has an open bit-line architecture but may have a folded bit-line architecture.

Figure 14B:
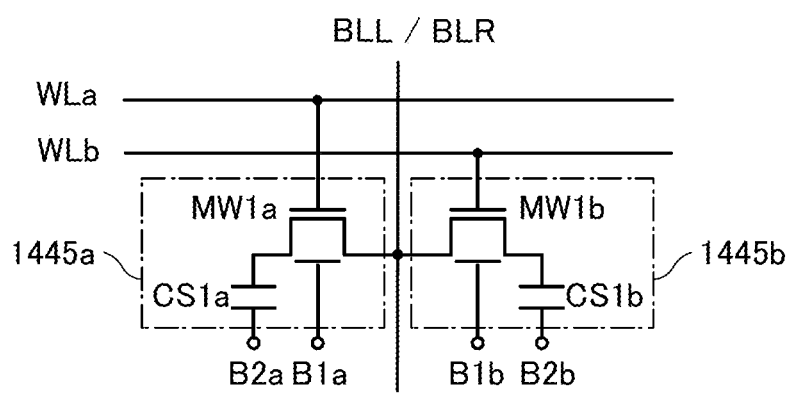

FIG. 14(B) illustrates a circuit configuration example of a pair of a memory cell 1445a and a memory cell 1445b connected to the same bit line BLL (BLR). The memory cell 1445a includes a transistor MW1a, a capacitor CS1a, and terminals B1a and B2a, and is connected to a word line WLa and the bit line BLL (BLR). The memory cell 1445b includes a transistor MW1b, a capacitor CS1b, and terminals Bib and B2b, and is connected to a word line WLb and the bit line BLL (BLR). Hereinafter, in the case where the description is not particularly limited to the memory cell 1445a or the memory cell 1445b, the memory cell 1445 and its components are described without using the letter "a" or "b", in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW1a is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS1b. In this way, the bit line BLL (BLR) is connected to both the first terminal of the transistor MW1a and the first terminal of the transistor MW1b The transistor MW1 has a function of controlling the charging and discharging of the capacitor CS1. A second terminal of the capacitor CS1 is electrically connected to a terminal B2. A constant voltage (e.g., low power supply voltage) is input to the terminal B2.

In the case where the semiconductor device described in the above embodiment is used for the memory cells 1445a and 1445b, the transistor 400a and the like can be used as the transistors MW1a and MW1b. In that case, the area occupied by one set consisting of a transistor and a capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with the voltage of the terminal B1. For example, the voltage of the terminal B1 may be a fixed voltage (e.g., a negative constant voltage); alternatively, the voltage of the terminal B1 may be changed in response to the operation of the DOSRAM 1400.

The back gate of the transistor MW1 may be electrically connected to the gate, the source, or the drain of the transistor MW1. Alternatively, the transistor MW1 is not necessarily provided with the back gate.

The sense amplifier array 1423 includes N local sense amplifier arrays 1426<0> to 1426<N−1>. The local sense amplifier array 1426 includes one switch array 1444 and a plurality of sense amplifiers 1446. The sense amplifier 1446 is electrically connected to a bit line pair. The sense amplifier 1446 has a function of precharging the bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are referred to as the bit line pair. Two global bit lines that are compared simultaneously by the global sense amplifier are referred to as the global bit line pair. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a target column. The local sense amplifier array 1426 amplifies the written data, and then retains the amplified data. In the specified local memory cell array 1425, the word line WL of the target row is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a target row is selected, and data of the memory cell 1445 is written to the bit line. The local sense amplifier array 1426 detects a voltage difference of the bit line pair of each column as data, and retains the data. The switch array 1444 writes the data of a column specified by the address signal from the data retained at the local sense amplifier array 1426 to the global bit line pair. The global sense amplifier array 1416 determines and retains the data of the global bit line pair. The data retained at the global sense amplifier array 1416 is output to the input/output circuit 1417. Thus, the read operation is completed.

The DOSRAM 1400 has no limitation on the number of times of rewriting in principle and data can be read and written with low energy, because data is rewritten by charging and discharging the capacitor CS1. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

The structure described in this embodiment can be used in combination with the structures described in the other embodiments, as appropriate.

Embodiment 5

In this embodiment, an FPGA (field-programmable gate array) will be described as an example of a semiconductor device of one embodiment of the present invention in which an OS transistor and a capacitor are used, with reference to FIG. 15 to FIG. 18. In the FPGA of this embodiment, an OS memory is used for a configuration memory and a register. Here, such an FPGA is referred to as an "OS-FPGA".

<<OS-FPGA>>

Figure 15A:
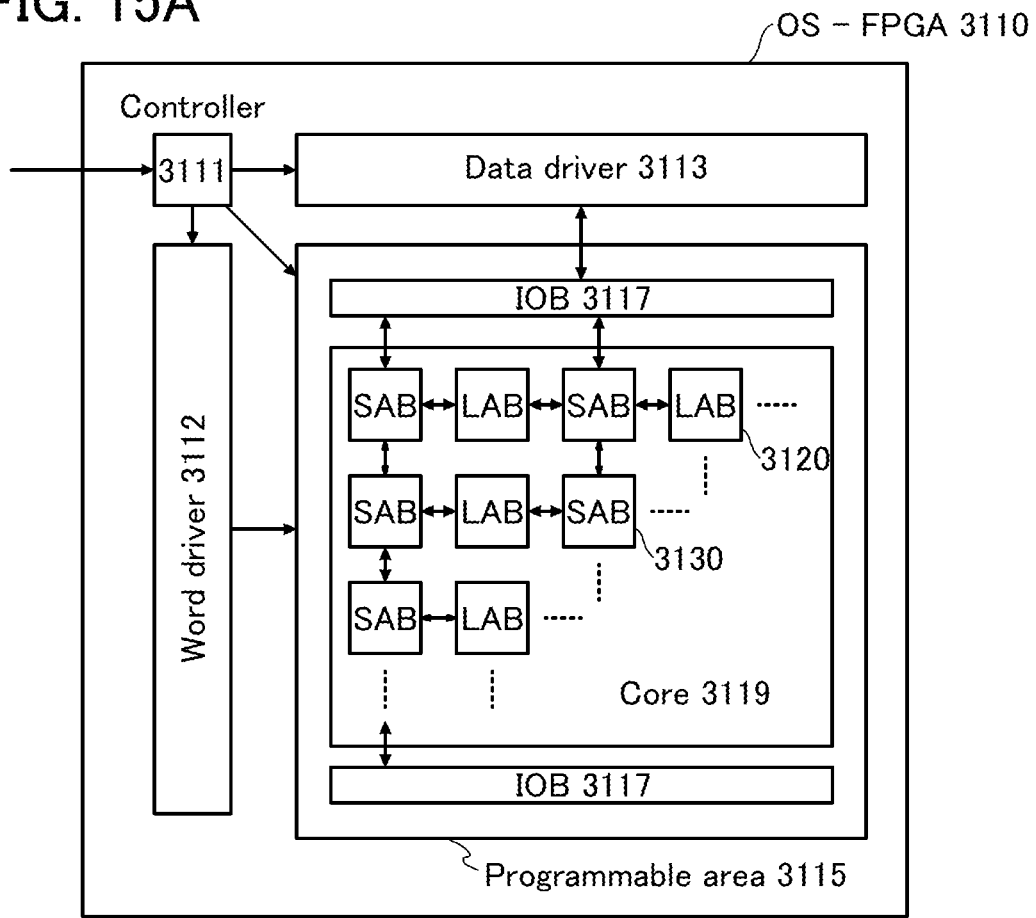
FIGS. 15A to 15C Block diagrams illustrating a configuration example of a semiconductor device of one embodiment of the present invention.

FIG. 15(A) illustrates a configuration example of an OS-FPGA. An OS-FPGA 3110 illustrated in FIG. 15(A) is capable of NOFF (normally-off) computing that executes context switching by a multi-context configuration and fine-grained power gating in each PLE. The OS-FPGA 3110 includes a controller 3111, a word driver 3112, a data driver 3113, and a programmable area 3115.

Figure 15B:
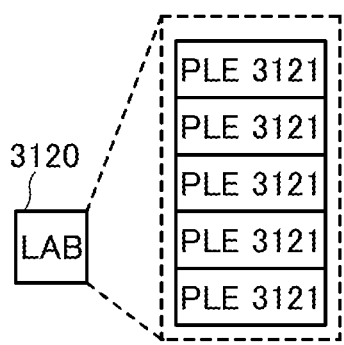
Figure 15C:
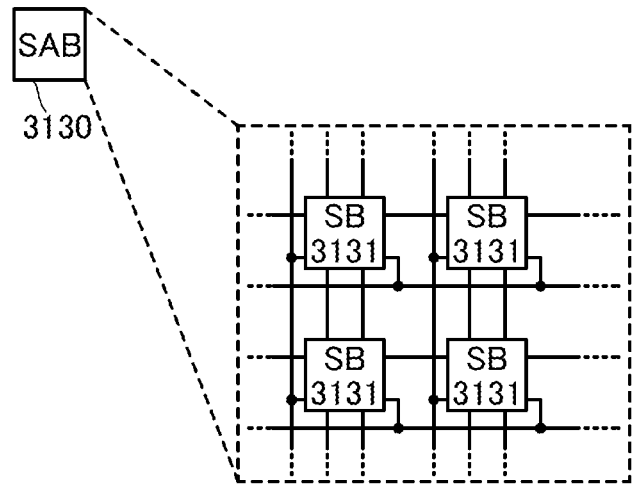

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 15(B) illustrates an example in which the LAB 3120 includes five PLEs 3121. As illustrated in FIG. 15(C), the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 16A:
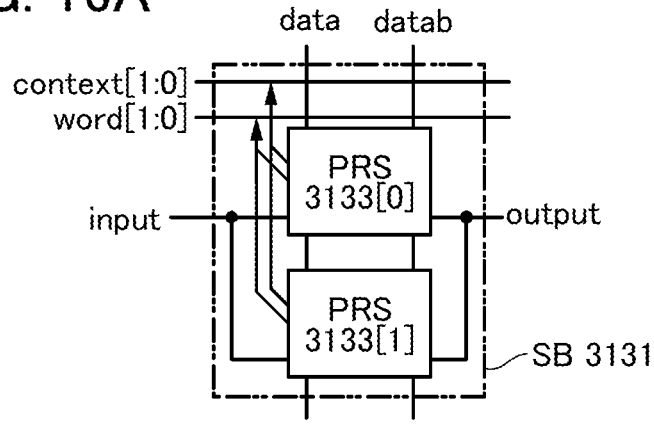
FIGS. 16A to 16C A block diagram and a circuit diagram illustrating a configuration example of a semiconductor device of one embodiment of the present invention and a timing chart showing an operation example of the semiconductor device.

The SB 3131 will be described with reference to FIG. 16(A) to FIG. 16(C). To the SB 3131 illustrated in FIG. 16(A), data, datab, and signals context[1:0] and word[1:0] are input. The data and the datab are configuration data, and the logics of the data and the datab have a complementary relationship. The number of contexts in the OS-FPGA 3110 is two, and the signals context[1:0] are context selection signals. The signals word[1:0] are word line selection signals, and wirings to which the signals word[1:0] are input are each a word line.

The SB 3131 includes PRSs (programmable routing switches) 3133[0] and 3133[1]. The PRSs 3133[0] and 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 16B:
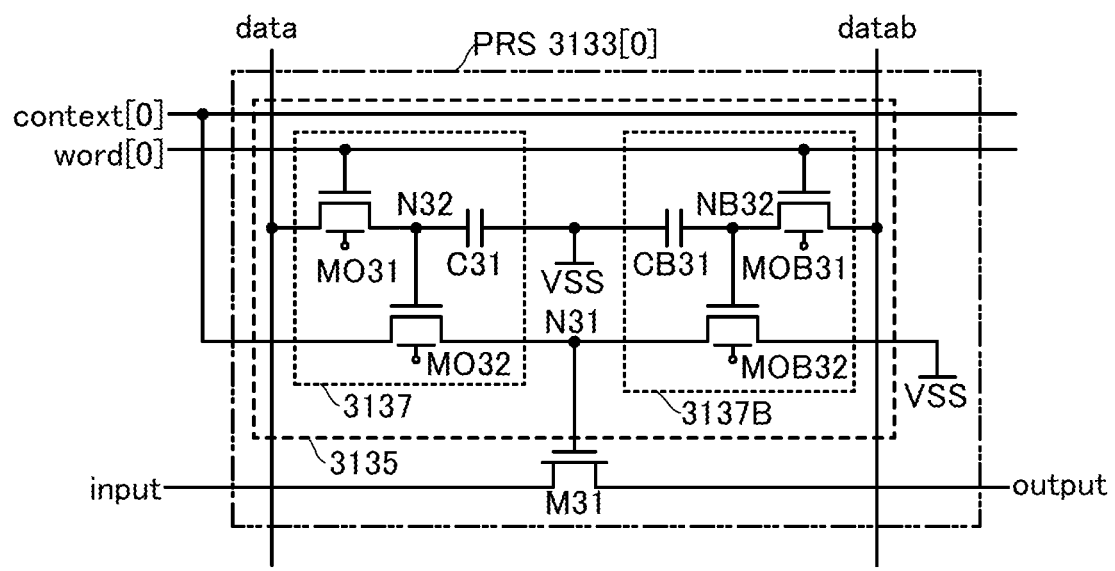
Figure 16C:
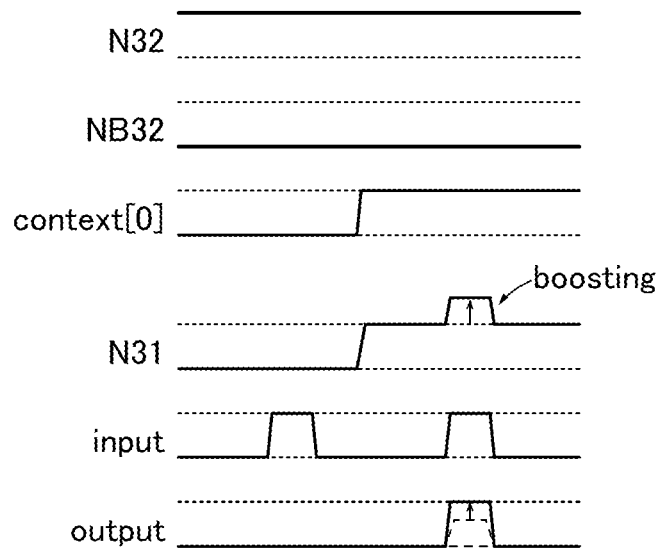

FIG. 16(B) illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal that are input. The signal context[0] and the signal word[0] are input to the PRS 3133[0], and the signals context[1] and word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes memory circuits 3137 and 3137B. The memory circuits 3137 and 3137B have the same circuit configuration. The memory circuit 3137 includes a capacitor C31 and OS transistors MO31 and MO32. The memory circuit 3137B includes a capacitor CB31 and OS transistors MOB31 and MOB32.

In the case where the semiconductor device described in the above embodiment is used in the SAB 3130, the transistor 400a and the like can be used as the OS transistors MO31 and MOB31. In this case, the area occupied by one set consisting of a transistor and a capacitor can be reduced when seen from above; accordingly, the semiconductor device of this embodiment can be highly integrated.

The OS transistors MO31, MO32, MOB31, and MOB32 include a back gate, and each of these back gates is electrically connected to a power supply line that supplies a fixed voltage.

A gate of the Si transistor M31 corresponds to a node N31, a gate of the OS transistor MO32 corresponds to a node N32, and a gate of the OS transistor MOB32 corresponds to a node NB32. The nodes N32 and NB32 are charge retention nodes of the CM 3135. The OS transistor MO32 controls electrical continuity between the node N31 and a signal line for the signal context[0]. The OS transistor MOB32 controls electrical continuity between the node N31 and a low-potential power supply line VSS.

The data retained at the memory circuits 3137 and 3137B have a complementary relationship. Thus, either the OS transistor MO32 or MOB32 is turned on.

The operation example of the PRS 3133[0] will be described with reference to FIG. 16(C). In the PRS 3133[0], to which configuration data has already been written, the node N32 is at "H" and the node NB32 is at "L".

The PRS 3133[0] is inactive while the signal context[0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

When the input terminal is transferred to "H" during the period when the PRS 3133[0] is active, the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 17:
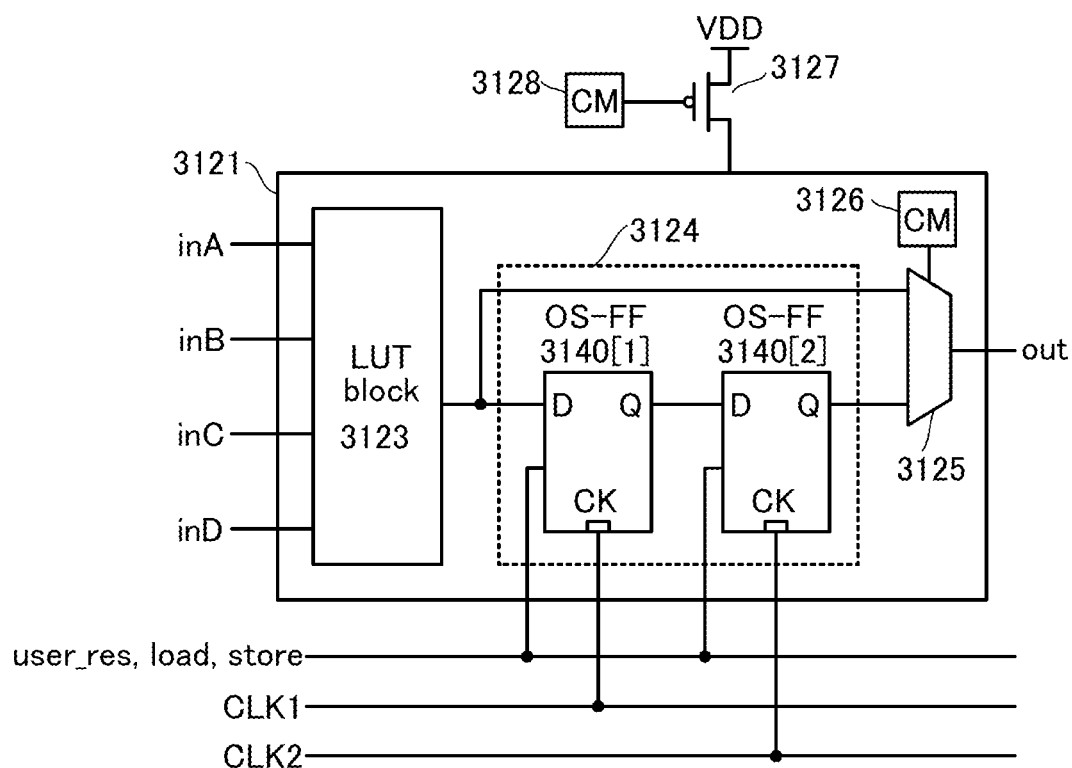
FIG. 17 A block diagram illustrating a configuration example of a semiconductor device of one embodiment of the present invention.

FIG. 17 illustrates a configuration example of the PLE 3121. The PLE 3121 includes an LUT (lookup table) block 3123, a register block 3124, a selector 3125, and a CM 3126. The LUT block 3123 is configured to select and output inside data in accordance with inputs in A to MD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with the configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed of nonvolatile registers to achieve NOFF computing. The nonvolatile registers in the PLE 3121 are flip-flops provided with an OS memory (hereinafter referred to as an [OS-FF]).

Figure 18A:
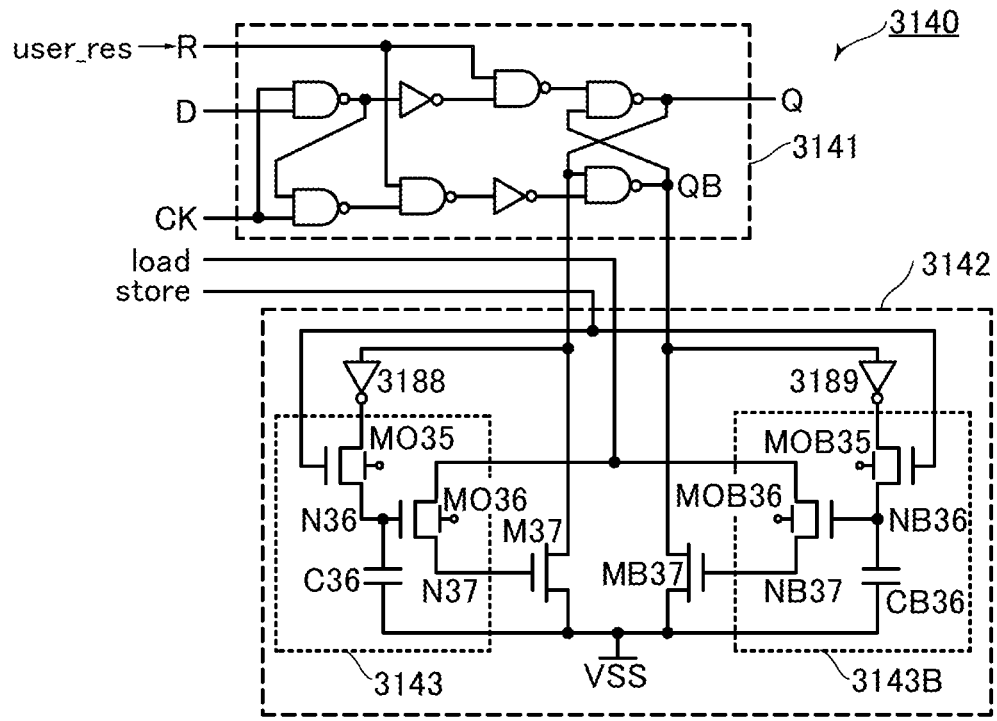
FIGS. 18A and 18B A circuit diagram illustrating a configuration example of a semiconductor device of one embodiment of the present invention and a timing chart showing an operation example of the semiconductor device.

The register block 3124 includes OS-FFs 3140[1] and 3140[2]. Signals user_res, load, and store are input to the OS-FFs 3140[1] and 3140[2]. A clock signal CLK1 is input to the OS-FF 3140[1] and a clock signal CLK2 is input to the OS-FF 3140[2]. FIG. 18(A) illustrates a configuration example of the OS-FF 3140.

The OS-FF 3140 includes an FF 3141 and a shadow register 3142. The FF 3141 includes nodes CK, R, D, Q, and QB. A clock signal is input to the node CK. The signal user_res is input to the node R. The signal user_res is a reset signal. The node D is a data input node, and the node Q is a data output node. The logics of the node Q and the node QB have a complementary relationship.

The shadow register 3142 functions as a backup circuit of the FF 3141. The shadow register 3142 backs up data of the nodes Q and QB in response to the signal store and writes back the backed up data to the nodes Q and QB in response to the signal load.

The shadow register 3142 includes inverter circuits 3188 and 3189, Si transistors M37 and MB37, and memory circuits 3143 and 3143B. The memory circuits 3143 and 3143B have the same circuit configuration as the memory circuit 3137 of the PRS 3133. The memory circuit 3143 includes a capacitor C36 and OS transistors MO35 and MO36. The memory circuit 3143B includes a capacitor CB36 and an OS transistor MOB35 and an OS transistor MOB36. Nodes N36 and NB36 correspond to a gate of the OS transistor MO36 and a gate of the OS transistor MOB36, respectively, and are each a charge retention node. Nodes N37 and NB37 correspond to a gate of the Si transistor M37 and a gate of the Si transistor MB37, respectively.

In the case where the semiconductor device described in the above embodiment is used in the LAB 3120, the transistor 400a and the like can be used as the OS transistors MO35 and MOB35. In this case, the area occupied by one set consisting of a transistor and a capacitor can be reduced when seen from above; accordingly, the semiconductor device of this embodiment can be highly integrated.

The OS transistors MO35, MO36, MOB35, and MOB36 include a back gate, and each of these back gates is electrically connected to a power supply line that supplies a fixed voltage.

Figure 18B:
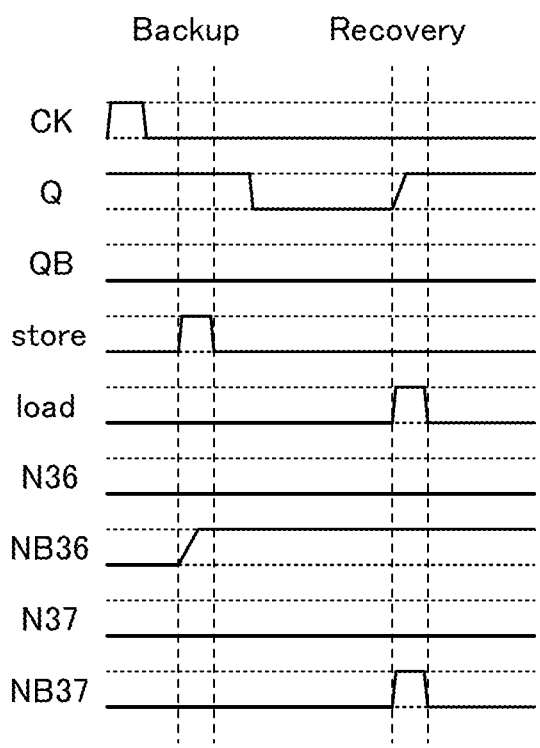

An example of an operation method of the OS-FF 3140 will be described with reference to FIG. 18(B).
(Backup)

When the signal store at "H" is input to the OS-FF 3140, the shadow register 3142 backs up the data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the nodes Q and QB of the FF 3141 are lost, the shadow register 3142 retains the backed up data even when power supply is stopped.
(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is recovered to a state at the backup operation.

A combination of the fine-grained power gating and backup/recovery operation of the OS-FF 3140 allows power consumption of the OS-FPGA 3110 to be effectively reduced.

As an error that might occur in a memory circuit, a soft error due to entry of radiation is given. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory using an OS transistor has a high soft-error tolerance. Therefore, the OS-FPGA 3110 with high reliability can be provided when an OS memory is included therein.

The structure described in this embodiment can be used in combination with the structures described in the other embodiments, as appropriate.

Embodiment 6

In this embodiment, an AI system in which the semiconductor device described in the above embodiments is used will be described with reference to FIG. 19.

Figure 19:
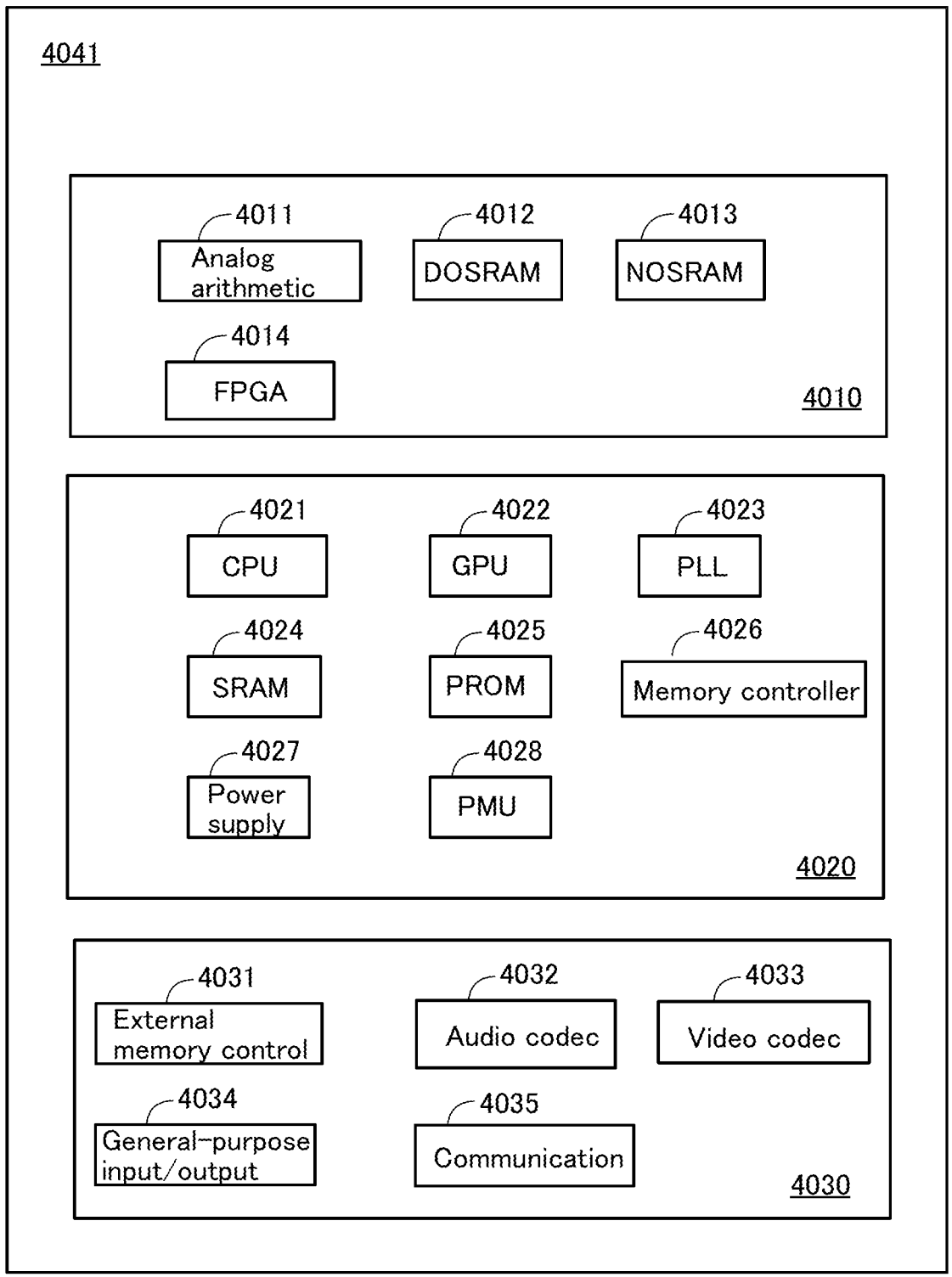
FIG. 19 A block diagram illustrating a configuration example of an AI system of one embodiment of the present invention.

FIG. 19 is a block diagram illustrating a configuration example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400, the NOSRAM 1600, and the OS-FPGA 3110 described in the above embodiments can be used as the DOSRAM 4012, the NOSRAM 4013, and the FPGA 4014, respectively.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for the learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike a flash memory and a ReRAM in which elements deteriorate because of data writing, the NOSRAM has no limitation on the number of times of data writing.

Furthermore, the NOSRAM 4013 can store multilevel data of two or more bits as well as one-bit binary data. The multilevel data storage in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with a hardware. Establishing the connection of the neural network with a hardware enables higher speed performance.

The FPGA 4014 is an FPGA including an OS transistor. An OS-FPGA can have a smaller memory area than an FPGA including an SRAM. Thus, addition of a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not necessarily include all of the following: the DOSRAM 4012, the NOSRAM 4013, and the FPGA 4014. One or more selected from the DOSRAM 4012, the NOSRAM 4013, and the FPGA 4014 are provided in accordance with a problem that is desired to be solved by the A system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among the product-sum operations used for learning and inference in the arithmetic portion 4010, and execute the other product-sum operations in the GPU 4022. In this manner, the learning and inference can be executed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation frequency is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external memory device (such as an HDD (Hard Disk Drive) or an SSD (Solid State Drive)) in many cases. Therefore, the AI system 4041 preferably includes the external memory control circuit 4031 functioning as an interface with the external memory device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the A system 4041 includes the general-purpose input/output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the A system 4041 preferably includes the communication module 4035.

The analog arithmetic circuit 4011 may use a multilevel flash memory as an analog memory. However, the flash memory has a limitation on the number of times of rewriting. In addition, it is extremely difficult to embed the multilevel flash memory (to form the arithmetic circuit and the memory on the same die).

The analog arithmetic circuit 4011 may use a ReRAM as an analog memory. However, a ReRAM has a limitation on the number of times of rewriting and also has a problem in storage accuracy. Moreover, a ReRAM is a two-terminal element, and thus has a complicated circuit design for separating data writing and data reading.

The analog arithmetic circuit 4011 may use an MRAM as an analog memory. However, an MRAM has a problem in storage accuracy because of its low magnetoresistive ratio.

In consideration of the above, the analog arithmetic circuit 4011 preferably uses an OS memory as an analog memory.

The structure described in this embodiment can be used in combination with the structures described in the other embodiments, as appropriate.

Embodiment 7

<Application Examples of AI System>

In this embodiment, application examples of the AI system described in the above embodiment will be described with reference to FIG. 20.

Figure 20A:
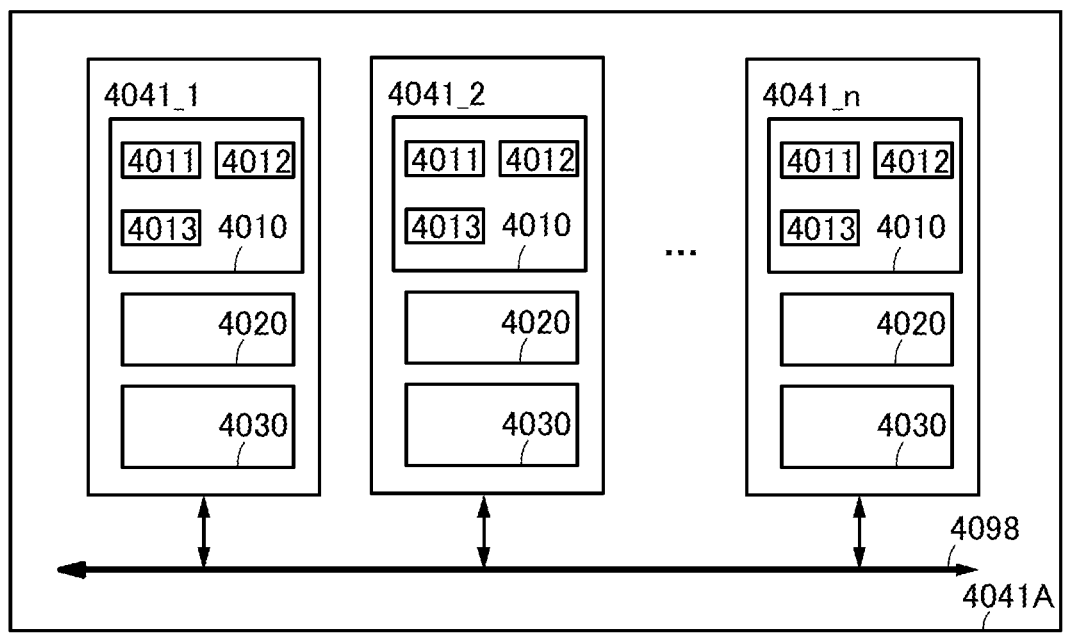
FIGS. 20A and 20B Block diagrams illustrating application examples of AI systems of embodiments of the present invention.

FIG. 20(A) shows an AI system 4041A in which the A systems 4041 described with FIG. 19 are arranged in parallel so that signals can be transmitted and received between the systems via a bus line.

The AI system 4041A illustrated in FIG. 20(A) includes a plurality of A systems 4041_1 to 4041_*n* (n is a natural number). The AI system 4041_1 to the AI system 4041_*n* are connected to each other via a bus line 4098.

Figure 20B:
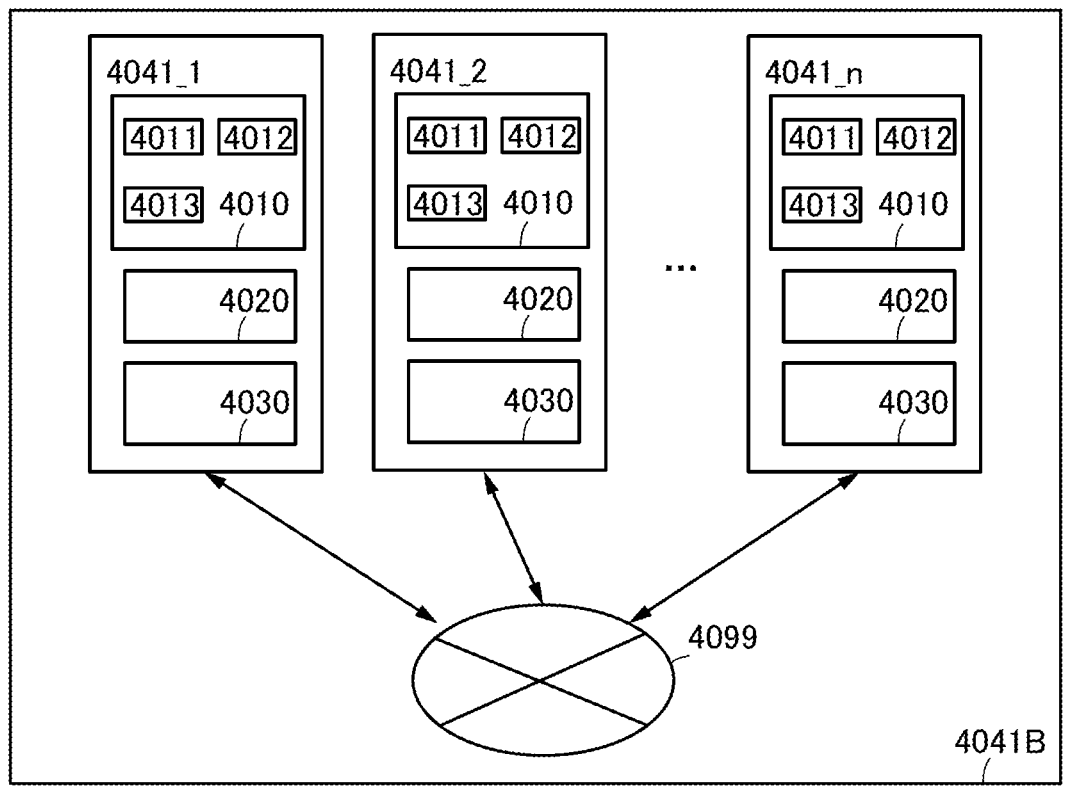

FIG. 20(B) shows an AI system 4041B in which the A systems 4041 described with FIG. 19 are arranged in parallel as in FIG. 20(A) so that signals can be transmitted and received between the systems via a network.

The AI system 4041B illustrated in FIG. 20(B) includes the plurality of AI systems 4041_1 to 4041_*n*. The AI system 4041_1 to the A system 4041_*n* are connected to each other via a network 4099.

The network 4099 has a structure in which wireless or wired communication is performed with a communication module provided in each of the AI system 4041_1 to the AI system 4041_*n*. The communication modules can perform communication via an antenna. For example, communication can be performed by connecting each of electronic devices to a computer network such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE, such as Wi-Fi (registered trademark), Bluetooth (registered trademark), or ZigBee (registered trademark). Furthermore, the third-generation mobile communications system (3G), the fourth-generation mobile communications system (4G), the fifth-generation mobile communications system (5G), or the like, defined by the international telecommunications union (ITU), can also be used.

With the structure in FIG. 20(A) or 20(B), analog signals obtained with external sensors or the like can be processed by different A systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When signal processing or learning is performed by different AI systems, the amount of information processed by each AI system can be reduced. Accordingly, signal processing or learning can be performed with a smaller amount of arithmetic processing. As a result, the recognition accuracy can be increased. The information obtained with each AI system is expected to enable instant and collective understanding of a complex change in biological information.

The structure described in this embodiment can be used in combination with the structures described in the other embodiments, as appropriate.

Embodiment 8

In this embodiment, an example of an IC into which the A system described in the above embodiment is incorporated will be described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 21:
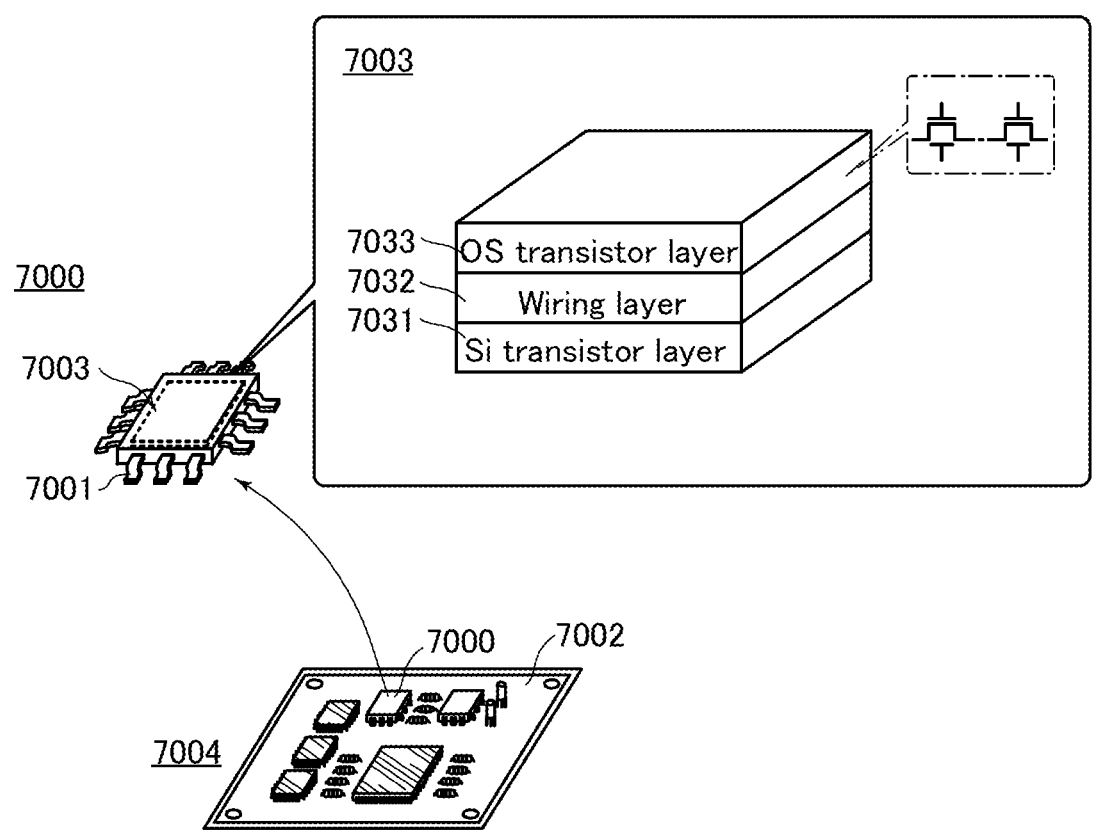
FIG. 21 A schematic perspective view illustrating a structure example of an IC equipped with an AI system of one embodiment of the present invention.

FIG. 21 illustrates the example of the IC into which the A system is incorporated. An AI system IC 7000 illustrated in FIG. 21 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. The circuit portion 7003 has a stacked-layer structure, and is broadly divided into a Si transistor layer 7031, a wiring layer 7032, and an OS transistor layer 7033. Since the OS transistor layer 7033 can be provided to be stacked over the Si transistor layer 7031, the size of the A system IC 7000 can be easily reduced.

Although a QFP (Quad Flat Package) is used as a package of the AI system IC 7000 in FIG. 21, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of constituent elements is increased, and accordingly the AI system can be incorporated into the IC at low cost.

The structure described in this embodiment can be used in combination with the structures described in the other embodiments, as appropriate.

Embodiment 9

<Electronic Devices>

A semiconductor device of one embodiment of the present invention can be used for a variety of electronic devices. FIG. 22 to FIG. 24 illustrate specific examples of electronic devices using the semiconductor device of one embodiment of the present invention.

Figure 22A:
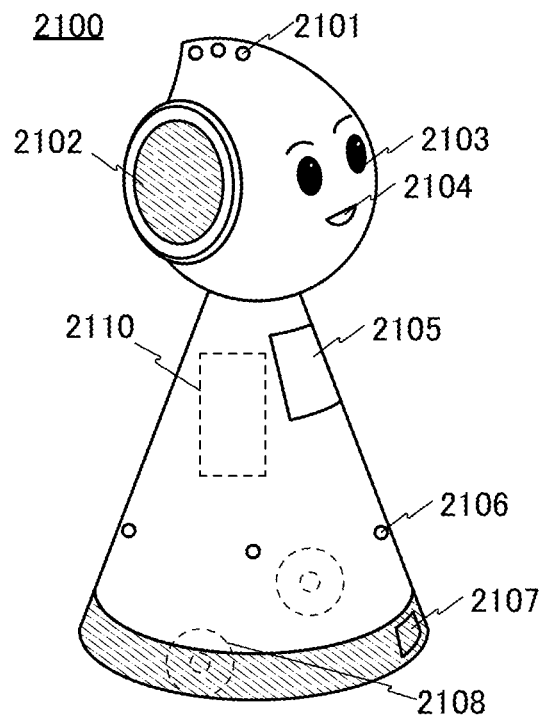
FIGS. 22A to 22D Diagrams illustrating electronic devices of embodiments of the present invention.

A robot 2100 illustrated in FIG. 22(A) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user by using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

Figure 22B:
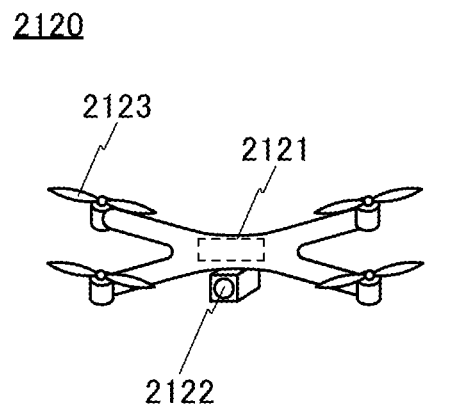

A flying object 2120 illustrated in FIG. 22(B) includes an arithmetic device 2121, a propeller 2123, and a camera 2122 and has a function of flying autonomously.

The above electronic component can be used in the arithmetic device 2121 and the camera 2122 of the flying object 2120.

Figure 22C:
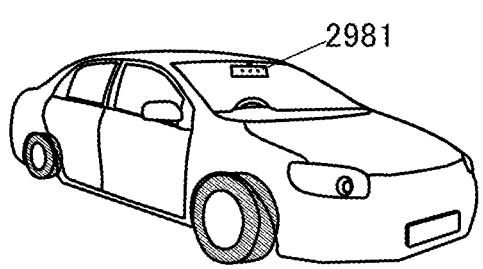

FIG. 22(C) is an external view illustrating an example of an automobile. An automobile 2980 includes a camera 2981 and the like. The automobile 2980 also includes various sensors such as an infrared radar, a millimeter wave radar, and a laser radar. The automobile 2980 can perform automatic driving by analyzing images shot by the camera 2981 and determining surrounding traffic information such as the presence of a pedestrian.

Figure 22D:
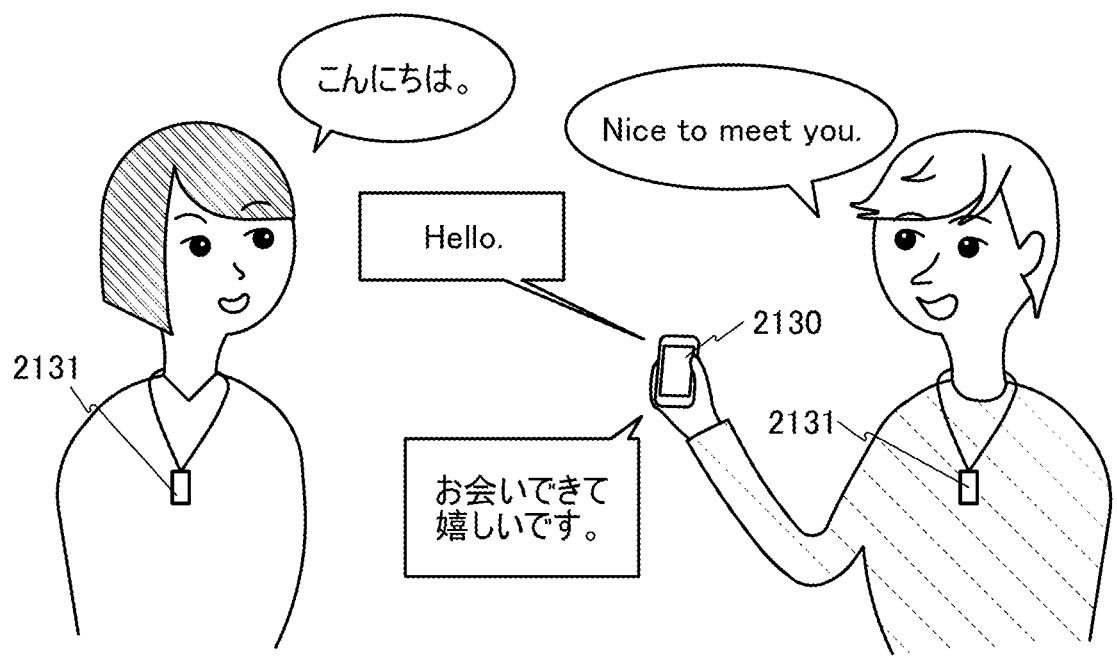

FIG. 22(D) illustrates a situation where a portable electronic device 2130 performs simultaneous interpretation in communication between people who speak different languages.

The portable electronic device 2130 includes a microphone, a speaker, and the like and has a function of recognizing a user's speaking voice and translating it into a language spoken by a conversational partner.

In FIG. 22(D), the user has a portable microphone 2131. The portable microphone 2131 has a radio communication function and a function of transmitting a detected sound to the portable electronic device 2130.

Figure 23A:
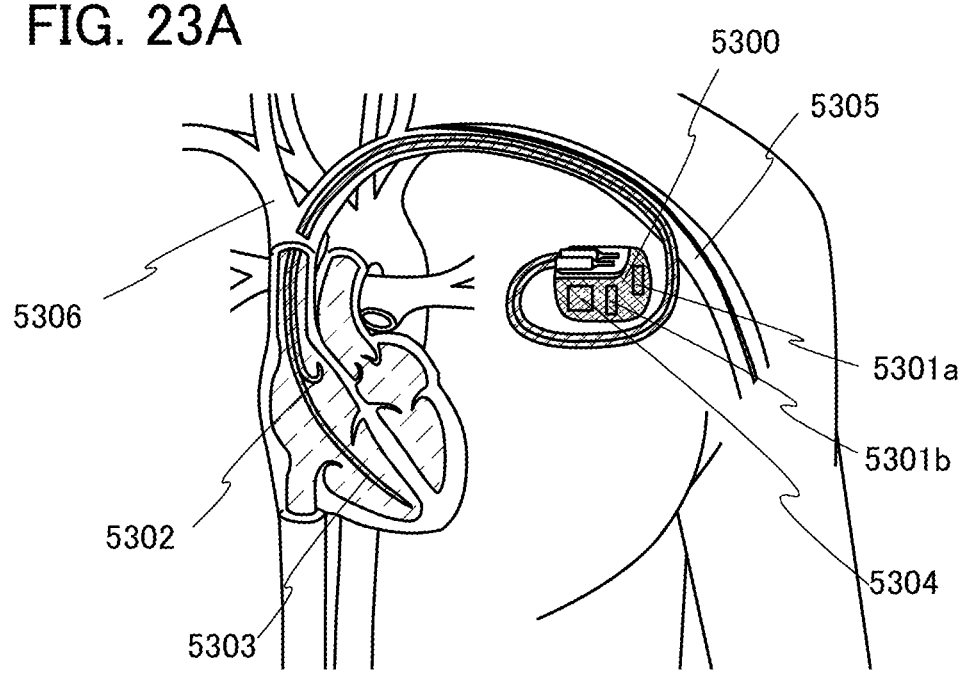
FIGS. 23A and 23B Diagrams illustrating electronic devices of embodiments of the present invention.
Figure 24:
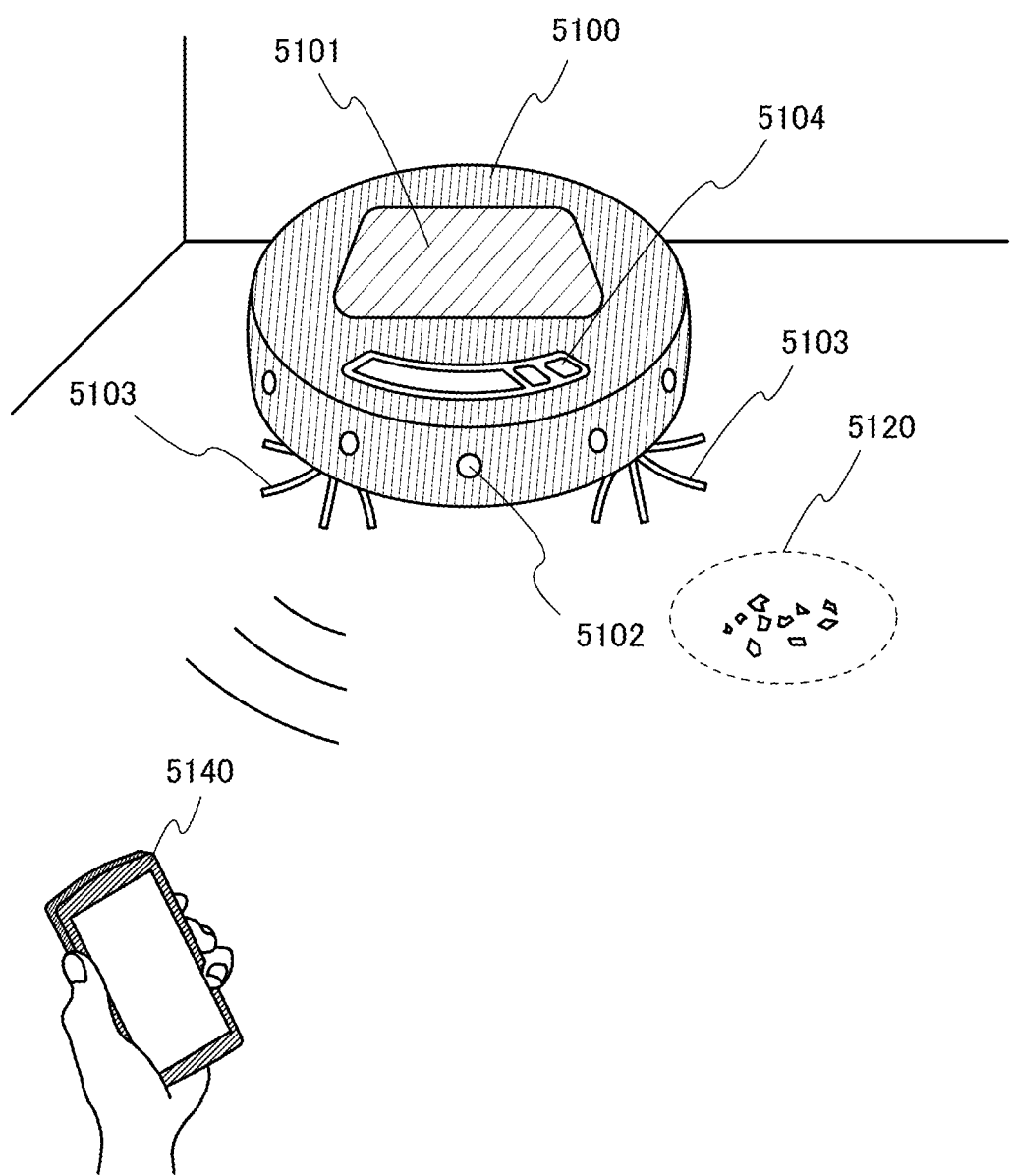
FIG. 24 Diagrams illustrating electronic devices of embodiments of the present invention.

FIG. 23(A) is a cross-sectional schematic view illustrating an example of a pacemaker.

A pacemaker body 5300 includes at least batteries 5301a and 5301b, a regulator, a control circuit, an antenna 5304, a wire 5302 reaching a right atrium, and a wire 5303 reaching a right ventricle.

The pacemaker body 5300 is implanted in the body by surgery, and the two wires pass through a subclavian vein 5305 and a superior vena cava 5306 of the human body, with the end of one of the wires placed in the right ventricle and the end of the other wire placed in the right atrium.

The antenna 5304 can receive electric power, and the plurality of batteries 5301a and 5301b are charged with the electric power, which can reduce the frequency of replacing the pacemaker. The pacemaker body 5300, which includes the plurality of batteries, provides a high level of safety, and the plurality of batteries also function as auxiliary power supplies because even when one of them fails, the other can function.

Other than the antenna 5304 capable of receiving electric power, an antenna that can transmit physiological signals may be included. For example, a system that monitors the cardiac activity so as to check physiological signals such as a pulse, a respiratory rate, a heart rate, and body temperature with an external monitoring device may be constructed.

Figure 23B:
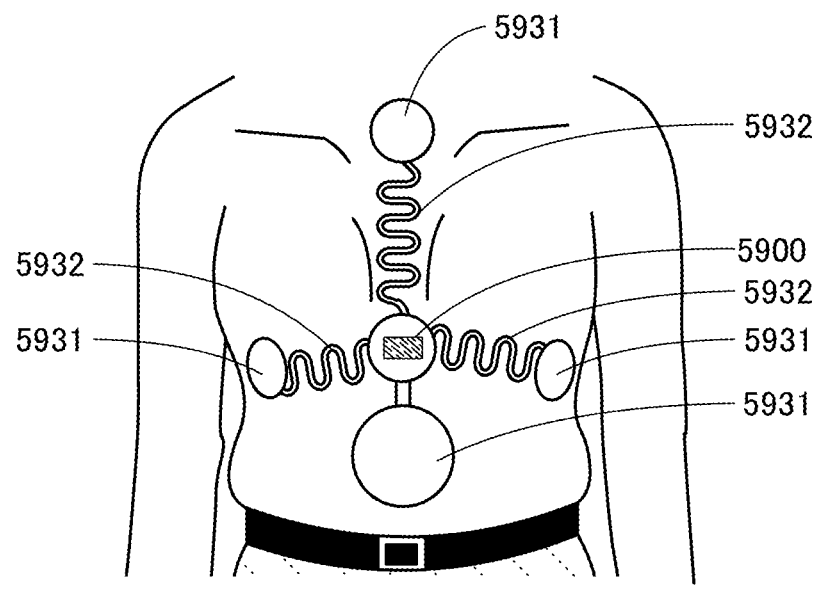

A sensor 5900 illustrated in FIG. 23(B) is attached to a human body with the use of a bond pad or the like. The sensor 5900 obtains biological information such as a heart rate or an electrocardiogram, for example, by supplying a signal through a wiring 5932 to an electrode 5931 or the like attached to the human body. The obtained data is transmitted as a wireless signal to a terminal such as a reading device.

FIG. 24 is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. In addition, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images shot by the cameras 5102. When an object that is likely to be caught in the brush 5103, such as a wire, is detected by image analysis, the rotation of the brush 5103 can be stopped.

The display 5101 can display the remaining capacity of a battery, the amount of collected dust, and the like. The display 5101 may display a path on which the cleaning robot 5100 has run. Moreover, a touch panel may be used as the display 5101, and the operation buttons 5104 may be provided on the display 5101.

The cleaning robot 5100 can communicate with a portable electronic device 5140 such as a smartphone. Images shot by the cameras 5102 can be displayed on the portable electronic device 5140. Accordingly, an owner of the cleaning robot 5100 can monitor his/her room even away from home. The owner can also check the display on the display 5101 with the portable electronic device 5140 such as a smartphone.

For example, a memory device using the semiconductor device of one embodiment of the present invention can retain control data, a control program, or the like of the above electronic device for a long time. With the use of the semiconductor device of one embodiment of the present invention, a highly reliable electronic device can be achieved.

An IC into which the above AI system is incorporated can be used for the arithmetic device or the like of the above electronic device, for example. Accordingly, the AI system enables the electronic device described in this embodiment to perform operations appropriate for situations with low power consumption.

This embodiment can be implemented in combination with the structures described in the other embodiments, the example, and the like, as appropriate.

Example

In this example, Sample A to Sample F were fabricated, and capacitance-voltage measurement (also referred to as C-V measurement in some cases) was performed.

Figure 25:
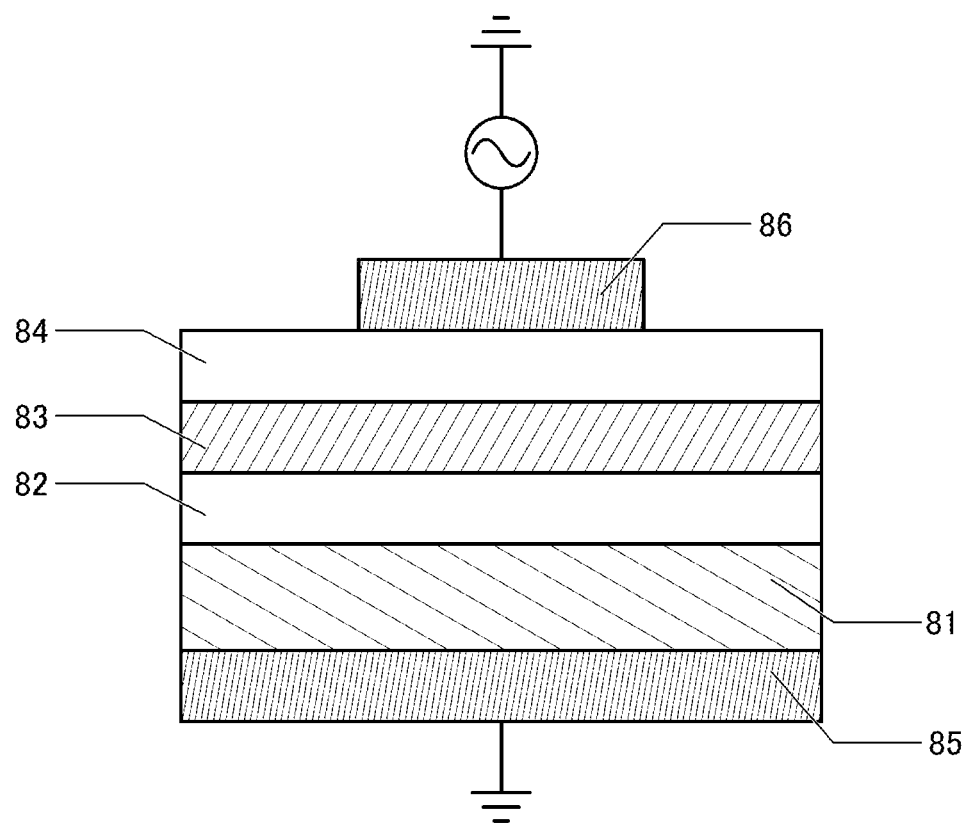
FIG. 25 A diagram illustrating a structure of samples of this example.

The structures of Sample A to Sample F will be described with reference to FIG. 25. In Sample A to Sample F, as illustrated in FIG. 25, an insulating film 82 is formed over a substrate 81, an oxide film 83 is formed over the insulating film 82, an insulating film 84 is formed over the oxide film 83, and a conductive film 86 is formed over the insulating film 84. A conductive film 85 is formed on the back surface of the substrate 81. Here, the insulating film 82, the oxide film 83, and the insulating film 84 correspond to the insulator 32, the oxide 33, and the insulator 34 illustrated in FIG. 1, respectively.

In Sample A to Sample F, an n-type silicon wafer was used as the substrate 81. As the insulating film 82, a 10-nm-thick silicon oxynitride film was used. As the conductive film 85, a 400-nm-thick aluminum film was used.

The structures of the oxide film 83, the insulating film 84, and the conductive film 86 differ depending on the samples. In Sample A, an In—Ga—Zn oxide film having a thickness of 80 nm and an atomic ratio of In:Ga:Zn=1:3:2 (hereinafter referred to as an IGZO (132) film in some cases) was used as the oxide film 83. As the insulating film 84, a 20-nm-thick silicon oxynitride film was used. As the conductive film 86, a stacked film of 30-nm-thick titanium nitride, 135-nm-thick tungsten, and 200-nm-thick aluminum was used.

Sample B has the same structure as Sample A except that the insulating film 84 has a thickness of 30 nm. The sample C has the same structure as Sample A except that as the conductive film 86, a stacked film of a 10-nm-thick In—Ga—Zn oxide film having an atomic ratio of In:Ga:Zn=4:2:3 (hereinafter referred to as an IGZO (423) film in some cases), 5-nm-thick titanium nitride, 135-nm-thick tungsten, and 200-nm-thick aluminum was used.

Sample D has the same structure as Sample A except that a 5-nm-thick gallium oxide film was used as the oxide film 83. Sample E has the same structure as Sample D except that the oxide film 83 has a thickness of 10 nm. Sample F has the same structure as Sample D except that the oxide film 83 has a thickness of 20 nm.

Fabrication methods for the samples will be described below. First, in Sample A to Sample F, an n-type silicon wafer was used as the substrate 81, and a 10-nm-thick silicon oxynitride film was formed thereover as the insulating film 82. The insulating film 82 was formed by a PECVD method, where a $SiH_4$ gas at 1 sccm and $N_2O$ gas at 800 sccm were used as the deposition gas, the deposition pressure was 40 Pa, the deposition power was 150 W (60 MHz), the substrate temperature was 400° C., and the distance between electrodes was 28 mm.

Next, the oxide film 83 was formed over the insulating film 82. In Samples A to C, a 80-nm-thick IGZO (132) film was formed as the oxide film 83 by a DC sputtering method. In the deposition of the IGZO (132) film, a target having an atomic ratio of In:Ga:Zn=1:3:2 was used, an oxygen gas at 45 sccm was used as the deposition gas, the deposition pressure was 0.7 Pa (measured by Miniature Gauge MG-2 manufactured by CANON ANELVA CORPORATION), the deposition power was 500 W, the substrate temperature was 200° C., and the target-substrate distance was 60 mm.

In Samples D to F, a gallium oxide film was formed as the oxide film 83 by an RF sputtering method. In the deposition of the gallium oxide film, a gallium oxide target was used, an oxygen gas at 30 sccm was used as the deposition gas, the deposition pressure was 0.4 Pa, the deposition power was 400 W, the substrate temperature was 130° C., and the target-substrate distance was 130 mm. The thickness of the oxide film 83 was 5 nm for Sample D, 10 nm for Sample E, and 20 nm for Sample F.

Next, a silicon oxynitride film was formed as the insulating film 84 over the oxide film 83. The insulating film 84 was formed by a PECVD method, where a $SiH_4$ gas at 1 sccm and an $N_2O$ gas at 800 sccm were used as the deposition gas, the deposition pressure was 200 Pa, the deposition power was 150 W (60 MHz), the substrate temperature was 350° C., and the distance between electrodes was 28 mm. The thickness of the insulating film 84 was 20 nm for Sample A and Samples C to F and 30 nm for Sample B.

Next, heat treatment was performed on Sample A to Sample F in a nitrogen atmosphere at 400° C. for one hour.

Next, in Sample A, Sample B, and Sample D to Sample F, as a part of the conductive film 86, a 30-nm-thick titanium nitride film and a 135-nm-thick tungsten film were successively formed by a DC sputtering method.

In Sample C, as a part of the conductive film 86, an IGZO (423) film with a thickness of 10 nm was also formed by a DC sputtering method. In the deposition of the IGZO (423) film, a target having an atomic ratio of In:Ga:Zn=4:2:4.1 was used, an oxygen gas at 45 sccm was used as the deposition gas, the deposition pressure was 0.7 Pa (measured by Miniature Gauge MG-2 manufactured by CANON ANELVA CORPORATION), the deposition power was 500 W, the substrate temperature was 200° C., and the target-substrate distance was 60 mm. Furthermore, as a part of the conductive film 86, a 5-nm-thick titanium nitride film and a 135-nm-thick tungsten film were successively formed by a DC sputtering method.

Next, heat treatment was performed on Sample A to Sample F in a nitrogen atmosphere at 400° C. for one hour. Then, a 200-nm-thick aluminum film was formed as a part of the conductive film 86 by a DC sputtering method. After that, a part of the conductive film 86 was removed to pattern the conductive film 86.

Then, as the conductive film 85, a 400-nm-thick aluminum film was formed on the back surface of the substrate 81 by a DC sputtering method.

Through the above steps, Sample A to Sample F of this example were fabricated.

C-V measurement was performed on Sample A to Sample F. Voltage to be applied to the conductive film 86 was set to −10 V to +10 V, and the measurement frequency was set to 10 kHz. For Sample A to Sample F, C-V measurement was performed on the center of the substrate, and for Sample D to Sample F, C-V measurement was also performed on a lower right part of the substrate and an upper right part of the substrate.

Figure 26:
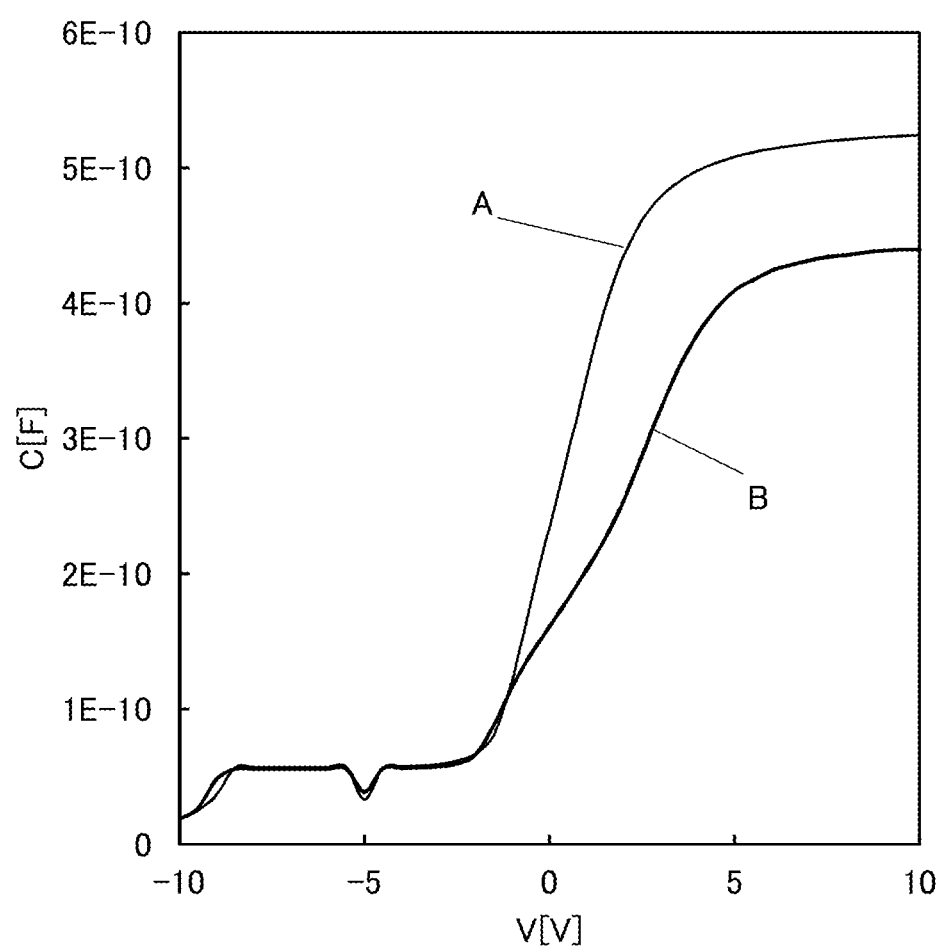
FIG. 26 A graph of C-V measurement of samples of this example.
Figure 27:
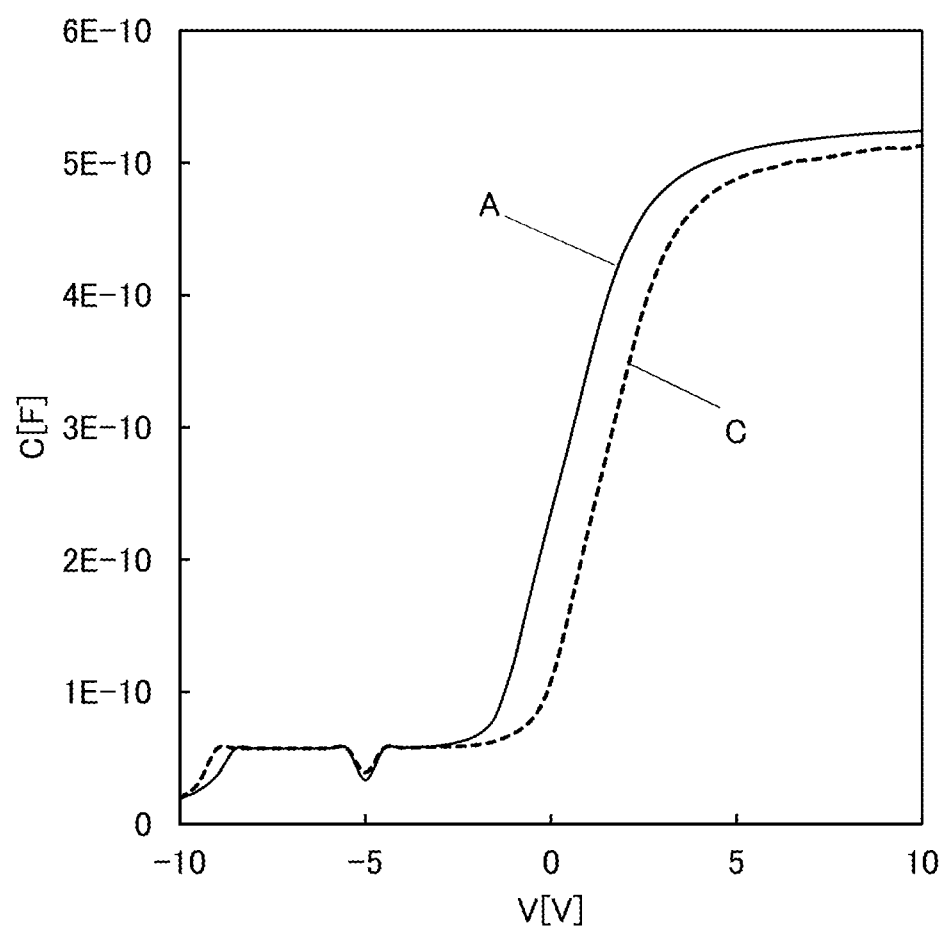
FIG. 27 A graph of C-V measurement of samples of this example.
Figure 28:
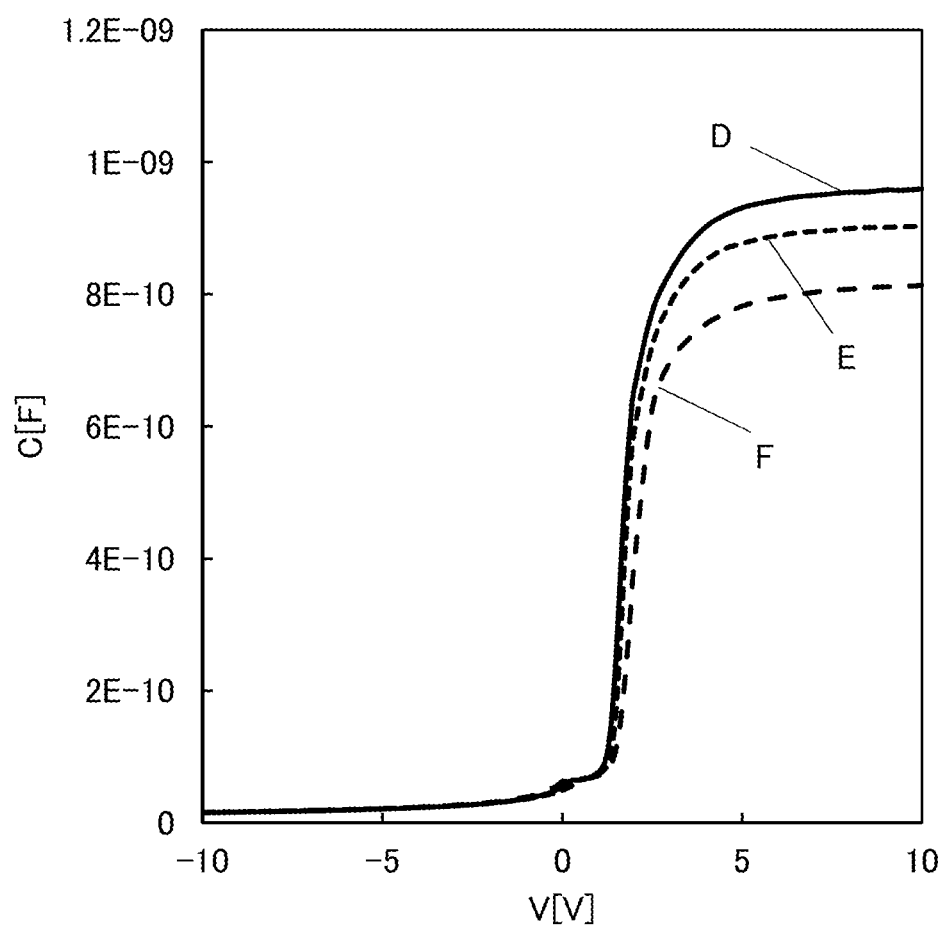
FIG. 28 A graph of C-V measurement of samples of this example.

FIG. 26 to FIG. 28 show the results of the C-V measurement performed on Sample A to Sample F. FIG. 26 shows a graph of the C-V characteristics of Sample A and Sample B, FIG. 27 shows a graph of the C-V characteristics of Sample A and Sample C, and FIG. 28 shows a graph of the C-V characteristics obtained by measuring the center of the substrate of each of Sample D to Sample F. In FIG. 26 to FIG. 28, the horizontal axis represents voltage V [V] applied to the conductive film 86, and the vertical axis represents capacitor C [F].

It is found from FIG. 26 that the flat band voltage of Sample B is shifted in the positive direction compared to the flat band voltage of Sample A. The flat band voltages of Sample A and Sample B are proportional to the amount of fixed negative charge contained in the insulating film 82 and the oxide film 83. Therefore, it is suggested that making the thickness of the insulating film 84 large, that is, increasing the amount of oxygen contained in the insulating film 84 can increase the amount of fixed negative charge contained in the insulating film 82 and the oxide film 83.

From FIG. 27, it is found that the flat band voltage of Sample C is shifted in the positive direction compared to the flat band voltage of Sample A. The flat band voltages of Sample A and Sample C are proportional to the amount of fixed negative charge contained in the insulating film 82 and the oxide film 83. Thus, it is suggested that the IGZO (423) film is formed in contact with the top surface of the insulating film 84 by sputtering deposition in an atmosphere containing oxygen to increase the amount of oxygen contained in the insulating film 84, whereby the amount of fixed negative charge contained in the insulating film 82 and the oxide film 83 can be increased.

Furthermore, FIG. 28 shows that the flat band voltages of Sample D, Sample E, and Sample F are high in this order. This has a correlation to the thickness of the oxide film 83 in Sample D, Sample E, and Sample F.

Here, a sample having the same structure as Sample D except that neither the insulating film 82 nor the oxide film 83 was provided and the thickness of the insulating film 84 was 30 nm was fabricated, and the flat band voltage of the sample was calculated. A difference between the flat band voltage of the sample and the flat band voltage of each of Sample D, Sample E, and Sample F is represented by ΔVfb.

Figure 29:
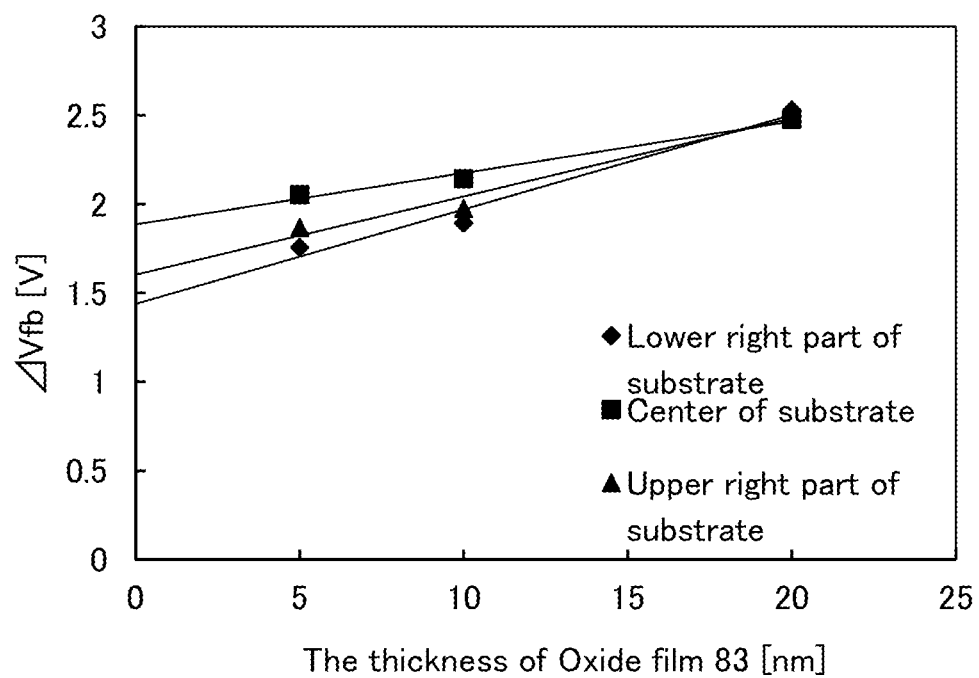
FIG. 29 A graph of ΔVfb of samples of this example.

FIG. 29 shows ΔVfb of the center of the substrate, the upper right part of the substrate, and the lower right part of the substrate of Sample D, Sample E, and Sample F. In FIG. 29, approximate lines of ΔVfb of the center of the substrate, the upper right part of the substrate, and the lower right part of the substrate are shown. In FIG. 29, the horizontal axis represents the thickness [nm] of the oxide film 83, and the vertical axis represents the ΔVfb [V].

As shown in FIG. 29, ΔVfb of the center of the substrate, the upper right part of the substrate, and the lower right part of the substrate are each approximated to a straight line well. The y-intercepts of these approximate lines have a finite value. This value does not depend on the horizontal axis, that is, the thickness of the oxide film 83, and the amount of fixed negative charge can be estimated. From the y-intercepts of these approximate lines, the amount of fixed charge contained in the insulating film 82 and the oxide film 83 of Sample D, Sample E, and Sample F can be estimated using an elementary charge e to be approximately $-2.0\times10^{12}$ e/cm$^2$.

The structures described in this example can be used in combination with the other embodiments, as appropriate.

REFERENCE NUMERALS

10: transistor, 10*a*: transistor, 10*b*: transistor, 30: insulator, 31: conductor, 32: insulator, 33: oxide, 34: insulator, 40: insulator, 41: insulator, 44: conductor, 46: oxide, 48*a*: conductor, 48*b*: conductor, 50: region, 52: mixed layer, 54: fixed charge, 56: oxygen vacancy, 58: oxygen

The invention claimed is:

1. A semiconductor device comprising:

a first conductor over a substrate;

a first insulator over the first conductor;

a first oxide in contact with a top surface of the first insulator;

a second insulator in contact with a top surface of the first oxide;

a second oxide over the second insulator;

a third insulator over the second oxide; and a second conductor over the third insulator, wherein a mixed layer is formed between the first insulator and the first oxide, wherein the mixed layer contains at least one of atoms contained in the first insulator and at least one of atoms contained in the first oxide, wherein the mixed layer has fixed negative charge, wherein the first oxide contains gallium, wherein the atomic ratio of gallium in metal elements contained in the first oxide is higher than the atomic ratio of gallium in metal elements contained in the second oxide, wherein the first oxide further contains indium and zinc, and wherein the atomic ratio of indium in the metal elements contained in the first oxide is lower than the atomic ratio of indium in the metal elements contained in the second oxide.

2. The semiconductor device according to claim 1, wherein the mixed layer has fixed charge at $-2.0\times10^{12}$ e/cm$^2$ or less.

3. The semiconductor device according to claim 1, wherein the second insulator is silicon oxide or silicon oxynitride.

4. The semiconductor device according to claim 1, wherein in the second insulator, the amount of released oxygen converted into oxygen atoms per unit thickness is greater than or equal to $1.0\times10^{18}$ atoms/cm$^3$ in thermal desorption spectroscopy at a film surface temperature of the second insulator of higher than or equal to 100° C. and lower than or equal to 700° C.

5. A semiconductor device comprising:

a first insulator;

a first oxide over the first insulator;

a second insulator over the first oxide; and a channel formation region over the second insulator;

wherein a mixed layer is formed between the first insulator and the first oxide, wherein the mixed layer contains at least one of atoms contained in the first insulator and at least one of atoms contained in the first oxide, wherein the mixed layer has fixed negative charge, wherein the first oxide contains indium, gallium and zinc, and wherein a thickness of the second insulator is more than 30 nm.

* * * * *